(12) United States Patent
Maruyama et al.

(10) Patent No.: US 9,620,864 B2
(45) Date of Patent: Apr. 11, 2017

(54) REFLECTARRAY AND DESIGN METHOD

(71) Applicant: NTT DOCOMO, INC., Chiyoda-ku (JP)

(72) Inventors: Tamami Maruyama, Chiyoda-ku (JP); Yasuhiro Oda, Chiyoda-ku (JP); Hidetoshi Kayama, Chiyoda-ku (JP); Ngoc Hao Tran, Chiyoda-ku (JP); Jiyun Shen, Chiyoda-ku (JP)

(73) Assignee: NTT DOCOMO, INC., Chiyoda-ku (JP)

(*) Notice: Subject to any disclaimer, the term of this patent is extended or adjusted under 35 U.S.C. 154(b) by 174 days.

(21) Appl. No.: 14/379,614

(22) PCT Filed: Dec. 3, 2012

(86) PCT No.: PCT/JP2012/081294
§ 371 (c)(1),
(2) Date: Aug. 19, 2014

(87) PCT Pub. No.: WO2013/128745
PCT Pub. Date: Sep. 6, 2013

(65) Prior Publication Data
US 2015/0022414 A1    Jan. 22, 2015

(30) Foreign Application Priority Data
Feb. 29, 2012   (JP) ................... 2012-044864

(51) Int. Cl.
*H01Q 1/24*   (2006.01)
*H01Q 19/185*   (2006.01)
(Continued)

(52) U.S. Cl.
CPC ....... *H01Q 19/185* (2013.01); *G06F 17/5072* (2013.01); *H01Q 3/46* (2013.01);
(Continued)

(58) Field of Classification Search
CPC .. H01Q 15/0086; H01Q 15/14; H01Q 19/185; H01Q 15/008; H01Q 15/148; H01Q 3/46
(Continued)

(56) References Cited

U.S. PATENT DOCUMENTS

| 4,684,952 A * | 8/1987 | Munson | ............... H01Q 21/065 342/368 |
| 5,293,171 A * | 3/1994 | Cherrette | ............... H01Q 1/002 343/700 MS |

(Continued)

FOREIGN PATENT DOCUMENTS

| EP | 2 362 486 A1 | 8/2011 |
| JP | 2004-514364 | 5/2004 |

(Continued)

OTHER PUBLICATIONS

Extended European Search Report issued Sep. 23, 2015 in Patent Application No. 12869953.5.

(Continued)

*Primary Examiner* — Tho G Phan
(74) *Attorney, Agent, or Firm* — Oblon, McClelland, Maier & Neustadt, L.L.P.

(57) ABSTRACT

A method of designing a reflectarray including a substrate having a surface perpendicular to a predetermined axis, wherein elements are disposed on the substrate. The method obtains a reflection phase of the elements as a function of a design parameter such as element spacing, when a radio wave enters the arranged elements, and stores a relationship between the reflection phase and the design parameter in a memory. Here, the design parameter is equally set for the elements. The method repeatedly determines, for each of the elements, the design parameter of a specific element in accordance with the relationship. The function of the design parameter has a range of almost 360 degrees with respect to a range of the design parameter. The reflection phase is the (Continued)

continuous function of the element spacing such that two resonant points occur at which the reflection phase becomes zero.

4 Claims, 61 Drawing Sheets

(51) Int. Cl.
   *H01Q 15/00* (2006.01)
   *G06F 17/50* (2006.01)
   *H01Q 15/14* (2006.01)
   *H01Q 3/46* (2006.01)

(52) U.S. Cl.
   CPC ....... *H01Q 15/008* (2013.01); *H01Q 15/0086* (2013.01); *H01Q 15/14* (2013.01); *H01Q 15/148* (2013.01)

(58) Field of Classification Search
   USPC ......... 343/700 MS, 754, 757, 836, 846, 853, 343/912
   See application file for complete search history.

(56) References Cited

U.S. PATENT DOCUMENTS

| | | | |
|---|---|---|---|
| 6,020,853 A * | 2/2000 | Richards | H01Q 1/38 343/700 MS |
| 6,195,047 B1 * | 2/2001 | Richards | H01P 1/127 343/700 MS |
| 6,384,797 B1 | 5/2002 | Schaffner | |
| 6,417,807 B1 | 7/2002 | Hsu | |
| 6,483,481 B1 | 11/2002 | Sievenpiper et al. | |
| 6,642,889 B1 * | 11/2003 | McGrath | H01Q 1/38 343/700 MS |
| 7,098,854 B2 * | 8/2006 | Herrick | H01Q 9/0457 343/700 MS |
| 7,471,247 B2 * | 12/2008 | Saily | H01Q 1/523 343/700 MS |
| 7,623,088 B2 | 11/2009 | Brown | |
| 8,217,847 B2 | 7/2012 | Sotelo | |
| 8,957,831 B1 | 2/2015 | Gregoire | |
| 2011/0210904 A1 | 9/2011 | Maruyama et al. | |
| 2011/0210906 A1 | 9/2011 | Maruyama et al. | |
| 2012/0105305 A1 | 5/2012 | Maruyama et al. | |

FOREIGN PATENT DOCUMENTS

| | | |
|---|---|---|
| JP | 2005-191982 | 7/2005 |
| JP | 2007-96868 | 4/2007 |
| JP | 2008-147763 | 6/2008 |
| JP | 2008-160589 | 7/2008 |
| JP | 2009-515397 | 4/2009 |
| JP | 2009-207078 | 9/2009 |
| JP | 2011-19021 | 1/2011 |
| JP | 2011-109414 | 6/2011 |
| WO | 02/41447 A1 | 5/2002 |
| WO | 2007/052112 A1 | 5/2007 |
| WO | WO 2010/137713 A1 | 12/2010 |

OTHER PUBLICATIONS

Extended European Search Report issued Sep. 9, 2015 in Patent Application No. 12870051.5.
Office Action mailed Jun. 22, 2016 in U.S. Appl. No. 14/379,591.
International Search Report issued Feb. 26, 2013, in PCT/JP2012/081294, filed Dec. 3, 2012.
Office Action issued Jul. 2, 2013, in Japanese Patent Application No. 2012-044862 (with English-language translation).
Office Action issued Jul. 2, 2013, in Japanese Patent Application No. 2012-044863 (with English-language translation).
Office Action issued Jul. 2, 2013, in Japanese Patent Application No. 2012-044864 (with English-language translation).
Olli Luukkonen, et al., "Effects of Spatial Dispersion on Reflection From Mushroom-Type Artificial Impedance Surfaces", IEEE Transactions on Microwave Theory and Techniques, vol. 57, No. 11, Nov. 2009, pp. 2692-2699.
Tamami Maruyama, et al., "Capacitance Value Control for Metamaterial Reflectarray using Multi-layer Mushroom Structure with Parasitic Patches", ACES Journal, vol. 27, No. 1, Jan. 2012, pp. 28-41.
P. A. Belov, et al., Strong Spatial Dispersion in Wire Media in the Very Large Wavelength Limit, URSI EMTS, 2004, pp. 621-623.
Olli Luukkonen, et al., "Simple and Accurate Analytical Model of Planar Grids and High-Impedance Surfaces Comprising Metal Strips or Patches", IEEE Transactions on Antennas and Propagation, vol. 56, No. 6, Jun. 2008, pp. 1624-1632.

* cited by examiner

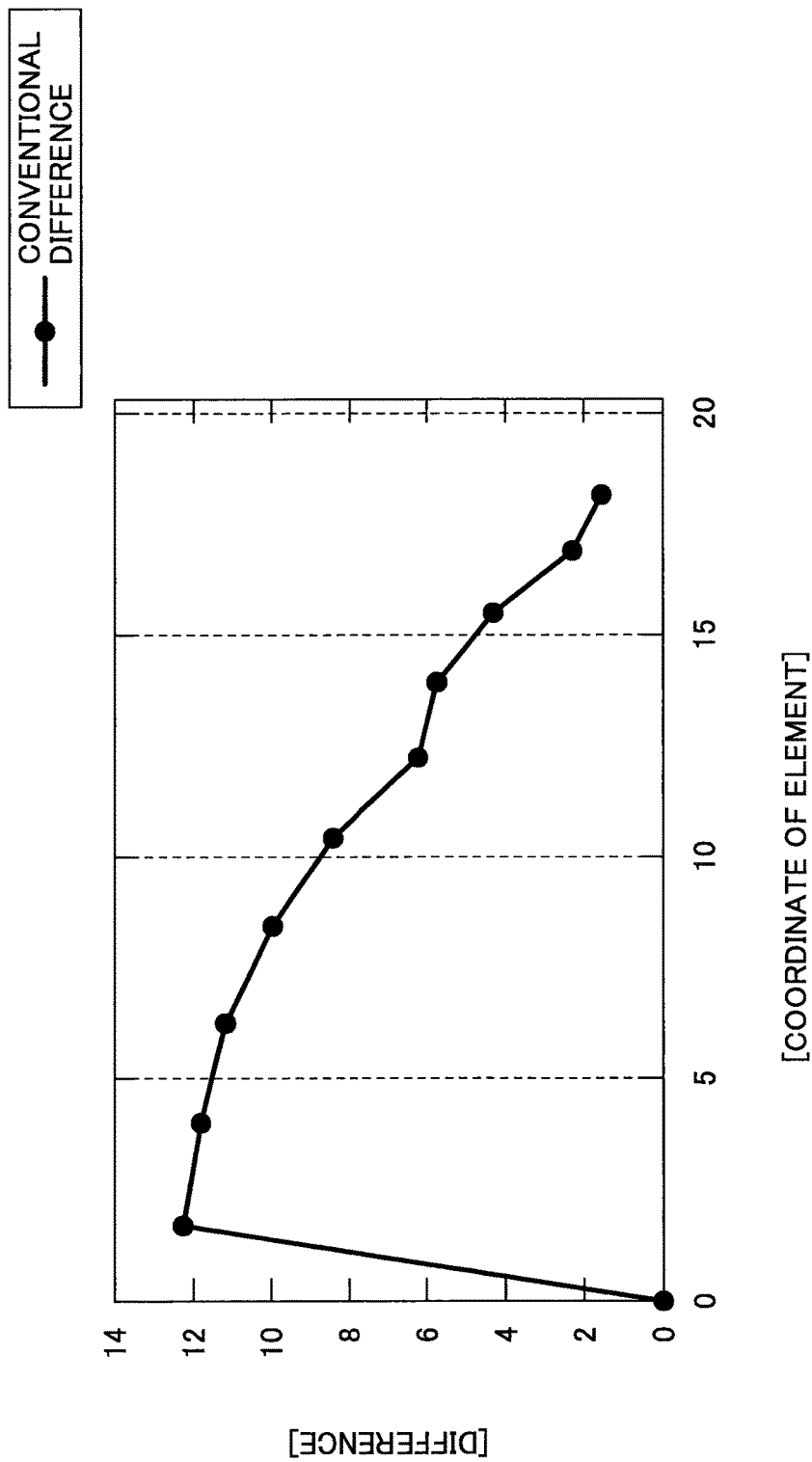

FIG.9F

| ELEMENT NUMBER | SELECTED ELEMENT SPACING $dv_i$ | PHASE THAT CORRESPONDS TO THE SELECTED ELEMENT SPACING $dv_i$ |
|---|---|---|
| 1 | 1.04 | 55.1 |
| 2 | 2.31 | 87.3 |
| 3 | 2.27 | 128.4 |
| 4 | 2.20 | 174.2 |
| 5 | 2.09 | −146.2 |
| 6 | 1.93 | −108.2 |
| 7 | 2.58 | −69.0 |
| 8 | 1.61 | −40.4 |
| 9 | 1.45 | 1.4 |
| 10 | 1.20 | 29.5 |

FIG.9G

| ELEMENT NUMBER | ELEMENT SPACING CORRESPONDING TO DESIRED PHASE WHICH IS DETERMINED ONLY BY $dv_i$ |
|---|---|
| 1 | 1.04 |
| 2 | 2.33 |
| 3 | 2.28 |
| 4 | 2.22 |
| 5 | 2.09 |
| 6 | 1.93 |
| 7 | 1.7 |
| 8 | 1.65 |
| 9 | 1.5 |
| 10 | 1.28 |
| 11 | 0.86 |

FIG.12F

| ELEMENT NUMBER | DESIRED PHASE | X-COORDINATE OF VIA | ELEMENT SPACING |
|---|---|---|---|
| #1 | −27 | 1.419774927 | |
| #2 | −57 | 2.997302624 | 1.5775 |
| #3 | −89.5 | 4.706290963 | 1.7090 |
| #4 | −125 | 6.573032071 | 1.8667 |
| #5 | −163.25 | 8.584379885 | 2.0113 |
| #6 | 155.75 | 10.74033344 | 2.1560 |
| #7 | 113.25 | 12.97516531 | 2.2348 |
| #8 | 69.75 | 15.26258047 | 2.2874 |
| #9 | 25.75 | 17.57628776 | 2.3137 |
| #10 | 0 | 18.93033236 | 1.3540 |

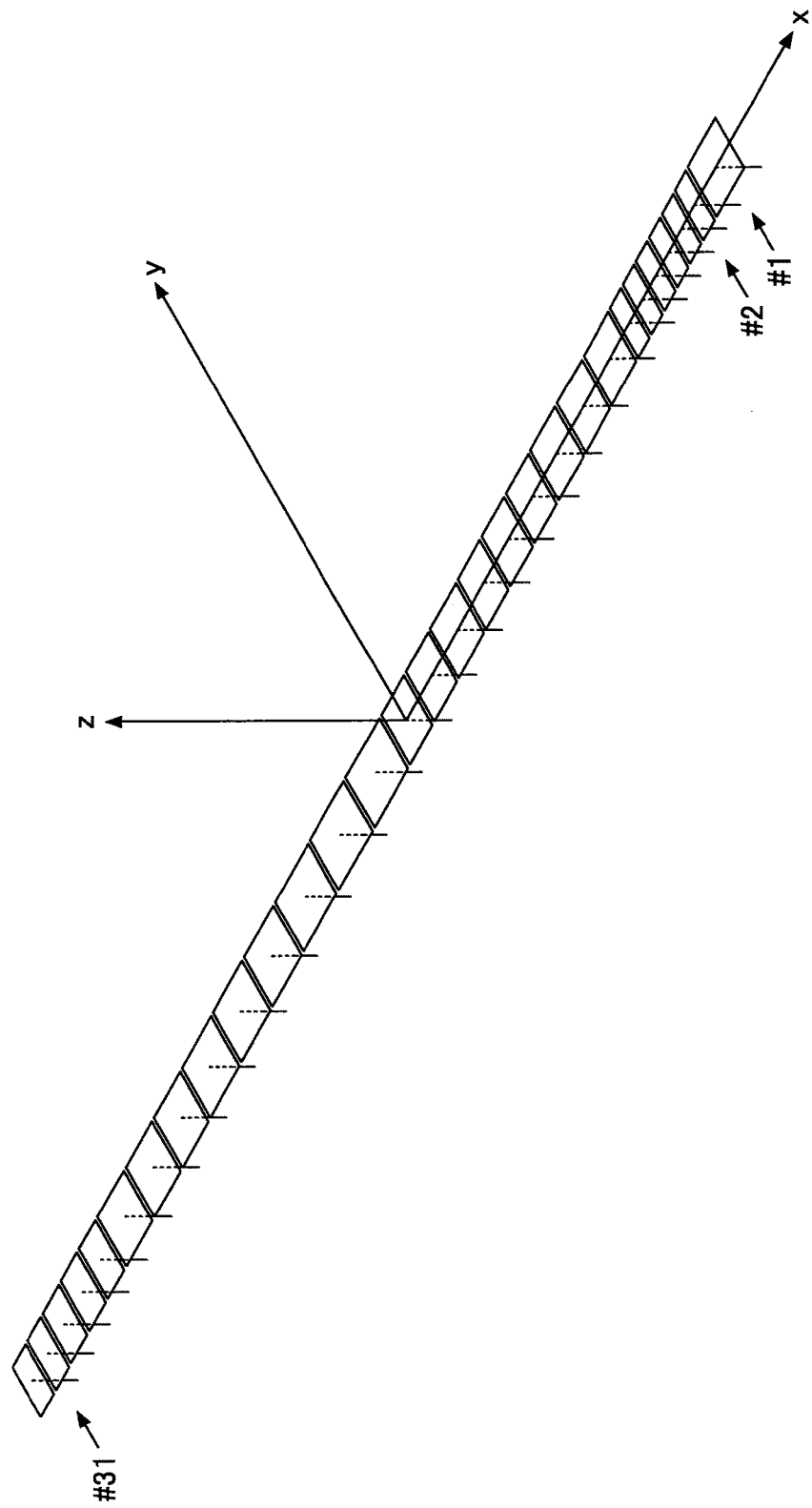

FIG.13B

MODEL A ($\theta_i$ = 70 DEGREES, $\theta_r$ = 30 DEGREES)

| ELEMENT NUMBER | REFLECTION PHASE | ELEMENT SPACING [mm] |
|---|---|---|
| #1,#2,#3 | −8 | 1.377 |
| #4,#5,#6 | −32.75 | 1.507 |
| #7,#8,#9 | −64.75 | 2.497 |
| #10,#11,#12 | −109.25 | 2.669 |
| #13,#14,#15 | −158.5 | 3.142 |
| #16,#17,#18 | 152.25 | 2.195 |
| #19,#20,#21 | 113.75 | 2.238 |
| #221,#23,#24 | 74.25 | 2.324 |
| #25,#26,#27 | 40.75 | 1.119 |
| #28,#29,#30 | 20.75 | 1.205 |
| #31 | −60 | 2.540 |

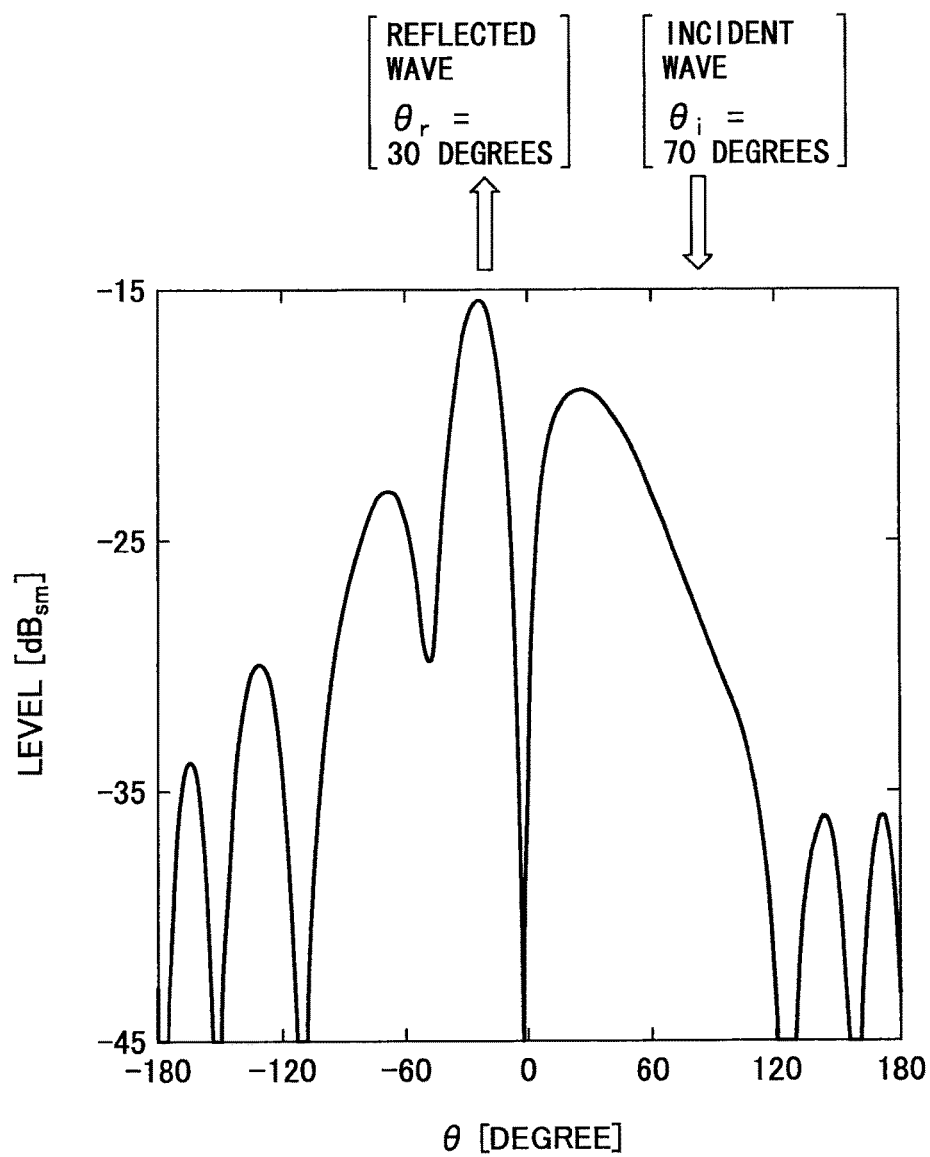

FIG.14B

MODEL B ($\theta_i$ = 70 DEGREES, $\theta_r$ = −30 DEGREES)

| ELEMENT NUMBER | REFLECTION PHASE | ELEMENT SPACING [mm] |
|---|---|---|
| #1,#2,#3 | −46 | 2.419 |
| #4,#5,#6 | −179 | 2.156 |
| #7,#8,#9 | 55.5 | 2.287 |
| #10,#11,#12 | −78.5 | 2.471 |
| #13,#14,#15 | 148 | 2.077 |
| #16,#17,#18 | 49 | 1.052 |
| #19 | −34 | 2.261 |

FIG.15

| RELATIVE DIELECTRIC CONSTANT | 10.2 |
|---|---|
| tan δ | 0.0023 |
| THICKNESS OF SUBSTRATE | 1mm |
| DIAMETER OF VIA | 0.1mm |
| GAP IN X-DIRECTION | 0.10mm |

FIG.16C

| ELEMENT NUMBER | SIZE OF PATCH [mm] | ELEMENT SPACING [mm] |
|---|---|---|
| #1 | 1.64494428635262 | 2.418875802 |
| #2 | 2.31887580215933 | 2.418875802 |
| #3 | 2.31887580215933 | 2.418875802 |
| #4 | 2.18741516073763 | 2.155954519 |
| #5 | 2.05595451931592 | 2.155954519 |
| #6 | 2.05595451931592 | 2.155954519 |
| #7 | 2.12168484002678 | 2.287415161 |
| #8 | 2.18741516073763 | 2.287415161 |
| #9 | 2.18741516073763 | 2.287415161 |
| #10 | 2.27943760973282 | 2.471460059 |
| #11 | 2.37146005872801 | 2.471460059 |
| #12 | 2.37146005872801 | 2.471460059 |
| #13 | 2.24348166186233 | 2.215503265 |
| #14 | 2.11550326499666 | 2.215503265 |
| #15 | 2.11550326499666 | 2.215503265 |
| #16 | 1.54325801777129 | 1.071012771 |
| #17 | 0.97101277054591 | 1.071012771 |
| #18 | 0.97101277054591 | 1.071012771 |

FIG.17C

| ELEMENT NUMBER | SIZE OF PATCH [mm] | ELEMENT SPACING [mm] |
|---|---|---|
| #1 | 2.31887580215933 | 2.418875802 |
| #2 | 2.31887580215933 | 2.418875802 |
| #3 | 2.31887580215933 | 2.418875802 |
| #4 | 2.05595451931592 | 2.155954519 |
| #5 | 2.05595451931592 | 2.155954519 |
| #6 | 2.05595451931592 | 2.155954519 |
| #7 | 2.18741516073763 | 2.287415161 |
| #8 | 2.18741516073763 | 2.287415161 |
| #9 | 2.18741516073763 | 2.287415161 |
| #10 | 2.37146005872801 | 2.471460059 |
| #11 | 2.37146005872801 | 2.471460059 |
| #12 | 2.37146005872801 | 2.471460059 |
| #13 | 2.11550326499666 | 2.215503265 |
| #14 | 2.11550326499666 | 2.215503265 |
| #15 | 2.11550326499666 | 2.215503265 |
| #16 | 0.97101277054591 | 1.071012771 |
| #17 | 0.97101277054591 | 1.071012771 |
| #18 | 0.97101277054591 | 1.071012771 |

FIG.18D

| ELEMENT NUMBER | SIZE OF PATCH [mm] | SPACING NUMBER | ELEMENT SPACING [mm] |
|---|---:|---|---:|
| #1 | 2.21325 | No.1 | 1 |
| #2 | 0.975 | No.2 | 1.15 |
| #3 | 1.105 | No.3 | 1.26 |
| #4 | 1.205 | No.4 | 1.35 |
| #5 | 1.29 | No.5 | 1.43 |
| #6 | 1.36 | No.6 | 1.49 |
| #7 | 1.42125 | No.7 | 1.5525 |
| #8 | 1.48125 | No.8 | 1.61 |
| #9 | 1.535 | No.9 | 1.66 |
| #10 | 1.585 | No.10 | 1.71 |
| #11 | 1.63 | No.11 | 1.75 |
| #12 | 1.675 | No.12 | 1.8 |
| #13 | 1.7 | No.13 | 1.8 |
| #14 | 1.75 | No.14 | 1.9 |
| #15 | 1.83 | No.15 | 1.96 |
| #16 | 1.895 | No.16 | 2.03 |
| #17 | 1.975 | No.17 | 2.12 |
| #18 | 2.08 | No.18 | 2.24 |
| #19 | 2.25 | No.19 | 2.46 |
| #20 | 2.605 | No.20 | 2.95 |
| #21 | 3.15 | No.21 | 3.55 |
| #22 | 3.48825 | No.22 | 3.6265 |

| SPACING NUMBER | ELEMENT SPACING [mm] |
|---|---|
| No.1 | 1 |
| No.2 | 1.15 |
| No.3 | 1.26 |
| No.4 | 1.35 |
| No.5 | 1.43 |
| No.6 | 1.49 |
| No.7 | 1.5525 |
| No.8 | 1.61 |
| No.9 | 1.66 |
| No.10 | 1.71 |
| No.11 | 1.75 |
| No.12 | 1.8 |
| No.13 | 1.8 |
| No.14 | 1.9 |
| No.15 | 1.96 |
| No.16 | 2.03 |
| No.17 | 2.12 |
| No.18 | 2.24 |
| No.19 | 2.46 |
| No.20 | 2.95 |
| No.21 | 3.55 |
| No.22 | 3.6265 |

REFLECTARRAY AND DESIGN METHOD

TECHNICAL FIELD

The present invention relates to a reflectarray, a design method, and the like.

BACKGROUND ART

As a reflector or a reflection plate that receives a radio wave, a reflectarray is known such that multiple elements, which are small comparable to a wavelength, are arranged in a planar fashion. Such a reflect array is also referred to as a "metamaterial." Each of the elements is formed by a structure that reflects the radio wave. For example, the elements may be formed in mushroom-like structures. The mushroom-like structure may include at least a ground plate and a patch that is disposed on the ground plate through an insulator. The patch and the ground plate may be connected by a via.

FIG. 1 shows a state where the multiple elements which are included in the reflectarray are arranged in an x-axis direction. Though it is not shown, the elements are similarly arranged in a y-axis direction. The elements are formed in the mushroom-like structures. In the depicted example, the radio wave is reflected in a direction such that an angle of reflection is $\theta_r$. For simplicity, an incident wave is not depicted. In order to suitable reflect radio waves in a direction of a desired reflection angle $\theta_r$, each of the radio waves that is reflected by the corresponding element is required to have a suitable reflection phase. In the depicted example, the four elements reflect radio waves having corresponding phases. Here, the phases are different by 90 degrees one another. In general, N elements are designed so that the neighboring elements reflect radio waves such that the reflection phases of the radio waves are different by $\Delta\phi$. In this case, $\Delta\phi=(2\pi/\lambda)\cdot\Delta x\cdot\sin(\theta_r)$ holds. Here, $\lambda$ is a wavelength of the radio wave, and $\Delta x$ is element spacing. For achieving such a reflectarray, in an example of a conventional technique, data of a relationship that holds between the reflection phase and a size of the patch is obtained in advance, and the size of the patch of each of the elements is determined in accordance with the relationship. FIG. 2 schematically shows the relationship between the reflection phase and the size of the patch. The size of the patch of the element is defined in accordance with the "size of the patch" which corresponds to the "desired phase."

For the reflectarray to reflect the radio waves in the desired direction, it is preferable that a total of the reflection phases (which is $N\times\Delta\phi$) of the corresponding elements among a predetermined number of elements (N elements in FIG. 1) is 360 degrees. However, as shown in FIG. 2, unachievable reflection phases exist in the vicinity of plus and minus 180 degrees. Thus, elements may not be produced which require corresponding reflection phases which are close to plus or minus 180 degrees, and it is possible that a characteristic of a reflected wave by the reflectarray is lower than the desired characteristic. From a perspective of reducing the unachievable reflection phases, it is considered to combine multiple element structures such that the height of the patch, the length of the via, or the thickness of the substrate of one of element structures is different from that of another one of the element structures, and to use the combined element structures (in this regard, refer to Patent Document 1). In this case, it may be required that electrically conducting layers are layered on the substrate. Here, the number of the electrically conducting layers corresponds to the types of the element structures to be combined. Thus, the manufacturing process is complicated, and it is possible that higher cost, in addition to effort, is required for manufacturing.

Further, when the size of the patch of the element is adjusted by using the relationship such as shown in FIG. 2, space (a gap) between large patches becomes very narrow, and such elements may not be achieved due to processing accuracy of processing the patches. In that case, it is possible that the characteristic of the reflected wave by the reflectarray is lower than the desired characteristic.

As described above, in the conventional reflectarray which utilizes the mushroom-like structure, values of the reflection phases are varied by changing a value of capacitance which is determined by the gap between the elements of the mushroom-like structures and a value of inductance which is determined by the length of the via.

RELATED ART DOCUMENT

Patent Document

Patent Document 1: US Patent Publication Number US2011/0210906 A1

Non-Patent Document

Non-Patent Document 1: IEEE TRANSACTIONS ON MICROWAVE THEORY AND TECHNIQUES, VOL. 57, NO. 11, Nov. 2009 "Effects of Spatial Dispersion on Reflection From Mushroom-Type Artificial Impedance Surfaces" Olli Luukkonen, Mario G. Silveirinha, Alexander B. Yakovlev, Senior, Constantin R. Simovski, Igor S. Nefedov, and Sergei A. Tretyakov

SUMMARY OF THE INVENTION

Problem to be Solved by the Invention

An object of the present invention is to provide a reflectarray and a design method that can simply and effectively improve a reflection characteristic of a reflectarray.

Means for Solving the Problem

A design method according to one embodiment of the present invention is a design method of designing a reflectarray, the reflectarray being such that a plurality of elements are disposed on a substrate having a surface which is perpendicular to a predetermined axis, wherein the reflectarray reflects an incident wave in a desired direction, the design method including a step of obtaining a reflection phase of the elements as a function of a design parameter, when a radio wave enters the elements which are arranged, and a storing a relationship between the reflection phase and the design parameter in a memory, wherein any of the design parameter among a size of element spacing, a size of a patch of the element, and a size of a gap between the patches of the neighboring elements is equally set for the elements; and a step of repeatedly determining, for each of the elements, the design parameter of a specific element in accordance with the relationship, so that the specific element among the elements reflects the incident wave with a specific reflection phase among a plurality of reflection phases, wherein the function of the design parameter has a range which is substantially equal to 360 degrees with respect to a predetermined numerical range of the design parameter, wherein the reflection phase is the continuously varying function with respect to the element spacing, and wherein the function of the design parameter is the continuous function (which indicates a two resonance characteristic) such that two resonant points (the element spacing which causes resonance) occur at which the reflection phase becomes zero.

Effect of the Present Invention

According to one embodiment of the present invention, the reflection characteristic of the reflectarray can be simply and effectively improved.

BRIEF DESCRIPTION OF THE DRAWINGS

FIG. 9B is a diagram showing a shift between a desired reflection phase and an achieved reflection phase;

FIG. 9F is a diagram showing a design example of the element spacing and the reflection phase (an improved example);

FIG. 9G is a diagram showing a design example of the element spacing and the reflection phase (a conventional example);

FIG. 12F is a diagram showing the relationship between the coordinate of the element and the reflection phase;

FIG. 13A is a diagram showing one sequence of the element array, which is used for another simulation;

FIG. 13B is a diagram showing reflection phases of corresponding elements and element spacing;

FIG. 13C is a diagram showing a scattering cross section of the radio wave relative to an xz-surface;

FIG. 14B is a diagram showing reflection phases of corresponding elements and element spacing;

FIG. 15 is a diagram showing values of parameters, which are commonly used;

FIG. 16C is a diagram showing specific sizes of patches of the corresponding elements and element spacing;

FIG. 17C is a diagram showing specific sizes of the patches of the corresponding elements and the element spacing;

FIG. 18D is a diagram showing specific sizes of the patches of the corresponding elements and specific sizes of the distances of the elements;

EMBODIMENTS FOR CARRYING OUT THE INVENTION

Figure 1:
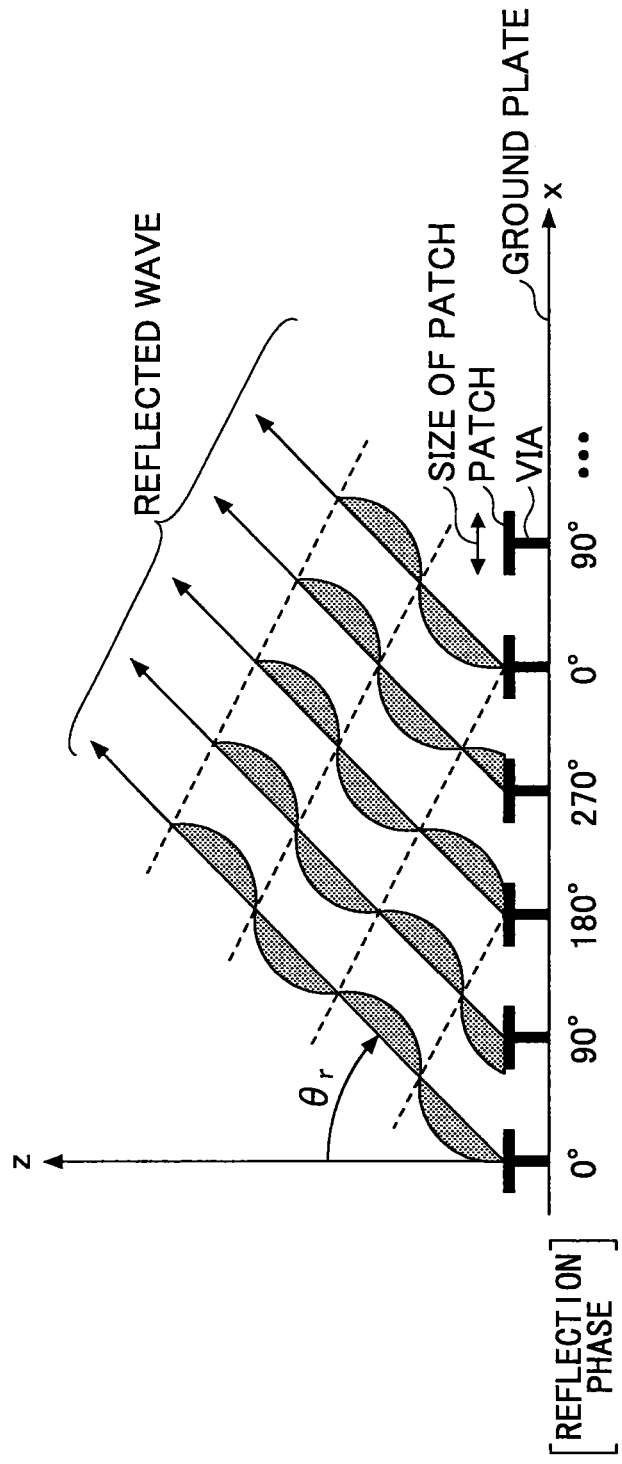
FIG. 1 is a diagram showing a state in which a plurality of elements included in a reflectarray is arranged in an x-axis direction.

As described above, a generic objective of the present invention is to provide a reflectarray and a design method which can easily and effectively improve a reflection characteristic of a reflectarray.

A first specific object of the present invention is to achieve a wide range of a reflection phase (which can substantially cover a range of 360 degrees) with a configuration in which a wire layer of a patch is a single layer (which is not a multi-layer structure).

A second specific object of the present invention is to make it possible to change capacitance of all elements included in the reflectarray in the same way.

A third specific object of the present invention is to make it possible to change inductance of all the elements included in the reflect array in the same way.

A fourth specific object of the present invention is to change a characteristic of the reflectarray by changing the capacitance or the inductance of the reflectarray in the same way.

According to the present invention, in the design of the reflectarray in which mushroom-like structures are utilized, it is possible to achieve the reflectarray in which phases are different on an element-by-element basis, while leaving values of the capacitance which occurs between vias of the mushrooms to be the same for all the elements.

Further, according to the present invention, in the design of the reflectarray in which the mushroom-like structures are utilized, by changing the height of the mushroom, it is possible to change only the value of the inductance L, while leaving a distance between the mushroom elements, which defines the value of the capacitance, to be constant.

According to one embodiment of the present invention, the capacitance C and the inductance L of all mushroom reflectarrays, which are formed of mushroom-like elements, have the same values, and a value of the reflection phase is mainly determined by the element spacing. For the case of this embodiment, since the value of the reflection phase is changed by changing the value of the element spacing, a complicated multi-layered structure, which is like a conventional one, is not required. Further, since the vias having the same height are used for all the elements, the values of the inductance can be simultaneously changed by simultaneously changing the length of the vias. Further, since the gaps having the same sizes are utilized for all the elements, by simultaneously changing the length of the patches, the values of the capacitance can be simultaneously changed.

Hereinafter, the embodiment of the present invention is explained from the following perspectives, while referring to the accompanying drawings.

1. A preferred embodiment
   1.1 Oblique incidence and a two resonance characteristic
   1.2 Element group
   1.3 A design procedure
   1.4 A simulation result
2. A modified example
   2.1 A modified example which utilizes the oblique incidence
   2.2 A modified example which utilizes the two resonance characteristic
   2.3 A modified example in which the element spacing is adjusted
   2.4 A further modified example
   2.5 A further modified example
   2.6 A further modified example
   2.7 A further modified example

1. A Preferred Embodiment

In a conventional mushroom reflectarray, a value of the capacitance C which is determined by the size of the gap between the patches of the neighboring elements and a value of the inductance L which is determined by the length of the via are varied for each element. By varying a frequency at which the LC resonance occurs for each element in this manner, the reflection phases of the corresponding mushroom-like elements are varied. Thus, in order to ensure a sufficient range in which the capacitance and the inductance vary, the multi-layer structure is required. Further, it is necessary that the values of the capacitance and the inductance are varied on an element-by-element basis. Accordingly, it is difficult to change the capacitance and the inductance of all the elements simultaneously, so as to vary the characteristic of the reflectarray. In contrast, in the present invention, since the value of the reflection phase is determined by the element spacing, it is easier to produce a reflectarray having a structure such that the electrically conducting layer is a single layer. Further, since the size of the gap is the same for all the elements, by varying the value of the gap, the capacitance of all the elements can be simultaneously changed. Further, by varying the length of the via, the value of the inductance L can be simultaneously changed, while leaving the values of the capacitance of all the elements to be constant. Therefore, a reflectarray can be achieved such that it can be controlled by varying the values of L and C.

Figure 3:
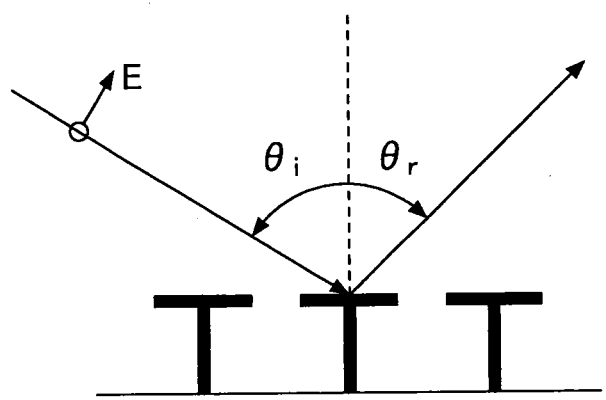
FIG. 3 is a diagram showing a state in which a radio wave enters with an incident angle $\theta_i$, and the radio wave is reflected with a reflection angle $\theta_r$.
Figure 4:
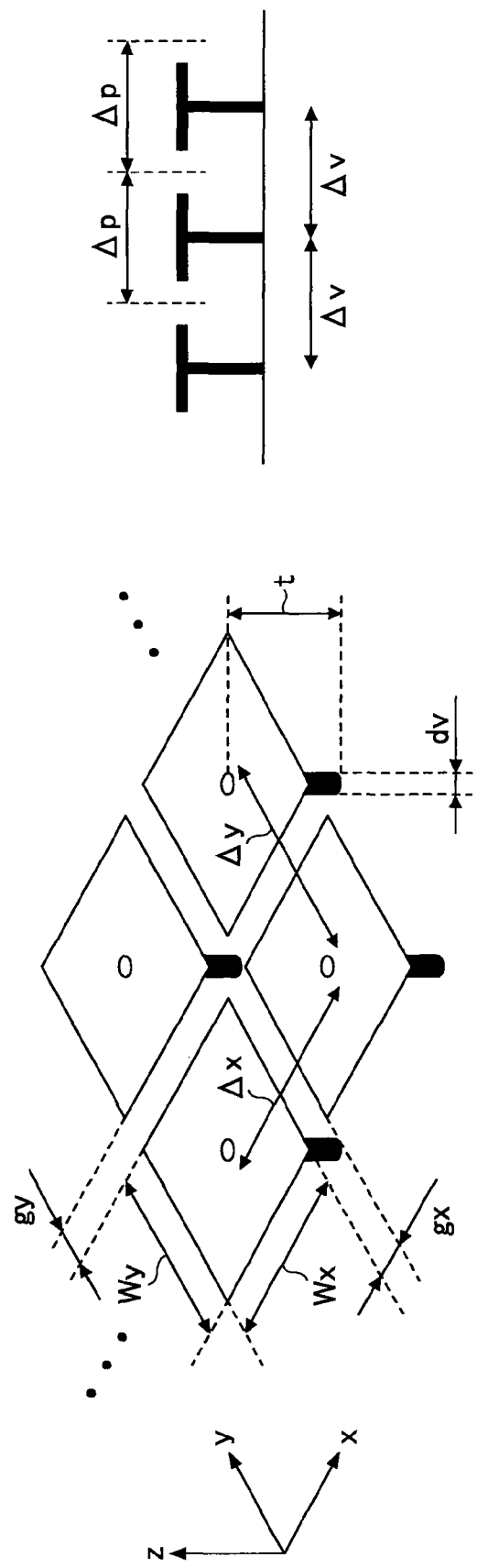
FIG. 4 is a diagram showing a portion of the reflectarray.

Hereinafter, the reflectarray is explained which is formed in accordance with a preferred embodiment. It is assumed that a radio wave that is received and reflected by the reflectarray is a TM wave such that an amplitude direction of an electric field is along a reflection surface. Here, the reflection surface is a plane which includes the incident wave and the reflected wave. The reflectarray includes a plurality of elements. Each of the elements is formed in the mushroom-like structure. As shown in FIG. 3, the radio wave enters the reflect array in a direction of an incident angle $\theta_i$, and the radio wave is reflected in a direction of a reflection angle $\theta_r$. The reflectarray has a structure in which many elements are disposed on a substrate. Each of the elements is formed in the mushroom-like structure which includes a bottom board, a patch, and a dielectric substrate disposed between them. The bottom board and the patch are connected through a via. The bottom board is also referred to as a "ground plate" or a "ground plane." FIG. 4 shows a portion of the reflectarray. In the figure, only four elements are shown. Actually, there are many more elements. For convenience of the explanation, in the present application, the direction that is perpendicular to the ground plate of the elements included in the reflectarray is defined to be a z-axis. However, the manner of defining the coordinate axes is arbitrary.

<<1.1 Oblique Incidence and a Two Resonance Characteristic>>

When the TM wave enters the reflectarray, which has the structure such as shown in FIG. 4, with an incident angle $\theta_i$ with respect to the z-axis, the reflection phase $\Gamma$ of the reflected wave can be expressed as follows.

[Expression 1]

$$\Gamma = \frac{\frac{\varepsilon_{zz}^{TM}}{\gamma_{TM}} \coth(\gamma_{TM} t) + \frac{\varepsilon_{zz}^{TM} - \varepsilon_h}{k} \cot(kt) + \frac{\eta_0}{jk_0} Z_g^{-1} - \frac{1}{jk_z}}{\frac{\varepsilon_{zz}^{TM}}{\gamma_{TM}} \coth(\gamma_{TM} t) + \frac{\varepsilon_{zz}^{TM} - \varepsilon_h}{k} \cot(kt) + \frac{\eta_0}{jk_0} Z_g^{-1} + \frac{1}{jk_z}} \quad \text{(Formula 1)}$$

$$\gamma_{TM} = \sqrt{k_p^2 + k_t^2 - k^2} \quad \text{(Formula 2)}$$

Here, it is assumed that the resonant frequency $r_f$ is expressed as follows:

$$r_f = f_p/\sqrt{\varepsilon_r} \quad \text{(Formula 3)}$$

Here, $f_p$ is a plasma frequency, and $\varepsilon_r$ is a relative dielectric constant of the dielectric substrate which is disposed between the patch and the ground plate. The plasma frequency $f_p$ and a plasma wave number $k_p$ satisfy the following relation.

$$f_p = k_p c/(2\pi) \quad \text{(Formula 4)}$$

Here, c is speed of light. The plasma wave number $k_p$ and the element spacing $\Delta x$ satisfy the following relationship.

[Expression 2]

$$(k_p \Delta x)^2 = \frac{2\pi}{\ln\left(\frac{\Delta x}{2\pi(dv/2)}\right) + 0.5275} \quad \text{(Formula 5)}$$

Here, dv is a diameter of the via. In Expression 1, $\varepsilon_{zz}$ is an effective dielectric constant of a metal medium along the via, and it can be expressed by the Supplemental Formula 1 below (in this regard, refer to Non-Patent Document 1). Here, $\varepsilon_h$ is a relative dielectric constant of the substrate included in the mushroom, and $\eta_0$ is the free space impedance. $k_0$ is the free-space wave number, and k is the wave number of the mushroom medium. They are expressed by the supplemental formula 2 below. $k_z$ is the z component of the wave number vector (wave vector), and it is expressed by the Supplemental Formula 3 below.

[Expression 3]

$$\varepsilon_{zz} = \varepsilon_h \left(1 - \frac{k_p^2}{k^2 - q_z^2}\right) \quad \text{(Supplemental Formula 1)}$$

$$k = k_0 \sqrt{\varepsilon_h} \quad \text{(Supplemental Formula 2)}$$

$$k_z = \sqrt{k_0^2 - k_t^2} \quad \text{(Supplemental Formula 3)}$$

Here, $Z_g$ in Expression 1 is the surface impedance, and it satisfies the following expression.

[Expression 4]

$$Z_g = -j\frac{\eta_{eff}}{2\alpha} \quad \text{(Formula 6)}$$

Here, $\eta_{eff}$ is the effective impedance which is expressed by the Supplemental Formula 4 below, and $\alpha$ is a grid parameter which is expressed by the Supplemental Formula 5 below.

[Expression 5]

$$\eta_{eff} = \sqrt{\mu_0/\varepsilon_0 \varepsilon_{eff}} \quad \text{(Supplemental Formula 4)}$$

$$\alpha = \frac{k_{eff} \Delta_v}{\pi} \ln\left(\sin^{-1}\left(\frac{\pi g}{2\Delta_v}\right)\right) \quad \text{(Supplemental Formula 5)}$$

First, a frequency characteristic of the reflection phases of the elements included in the reflectarray such as shown in FIG. 4 is considered. Specifically, when a designed frequency=11 GHz (wavelength=27.3 mm), thickness of the substrate t=1 mm, the relative dielectric constant of the dielectric material $\varepsilon_r$=10.2, and the element spacing $\Delta x = \Delta y$=2.25 mm, the resonant frequency $r_f$ is 10.5 GHz. At this time, the frequency at which the reflection phase becomes zero is observed twice, namely, at a frequency which is lower than the spurious resonance and a frequency which is higher than the spurious resonance, and the phases are the same. Thus, between the two frequencies at which the reflection phase becomes zero, the phase makes one 360 degree rotation. These examples of the numerical values are for exemplifying purpose only, and any suitable numerical values may be used. Here, in FIG. 4 and the following explanation, the element spacing may be defined to be the distance between the vias of the neighboring elements $\Delta v$ ($\Delta x$ or $\Delta y$), or another definition may be used. For example, the element spacing may be defined to be a distance between a center of the gap between the neighboring patches and a center of the next gap $\Delta_p$.

Figure 5:
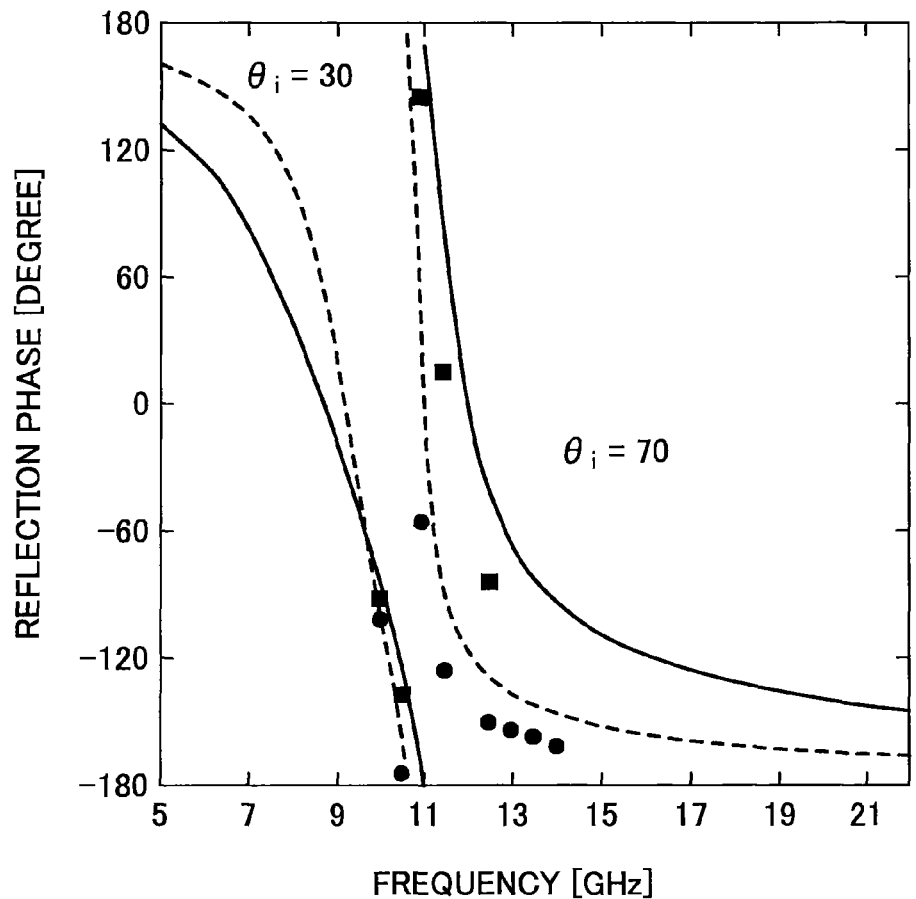
FIG. 5 is a diagram showing frequency characteristics of the reflection phase for a case in which the incident angle $\theta_i$ is 70 degrees and for a case in which the incident angle $\theta_i$ is 30 degrees.

FIG. 5 shows a frequency characteristic of the reflection phase for a case in which the incident angle $\theta_i$ is 70 degrees, and for a case in which the incident angle $\theta_i$ is 30 degrees.

Figure 6:
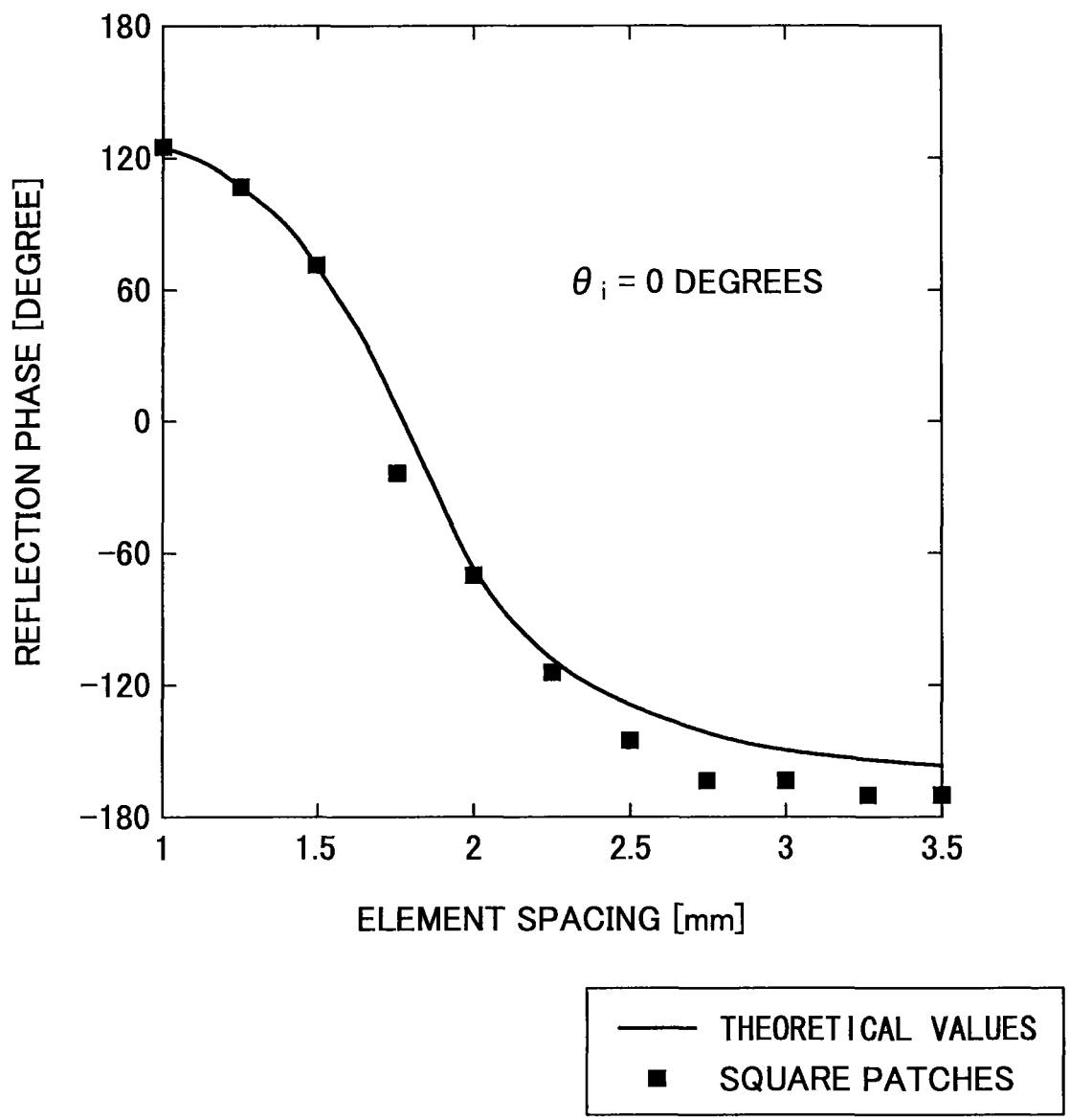
FIG. 6 is a diagram showing a relationship between the reflection phase and a distance between elements for a case in which the incident angle $\theta_i$ is 0 degrees.
Figure 7:
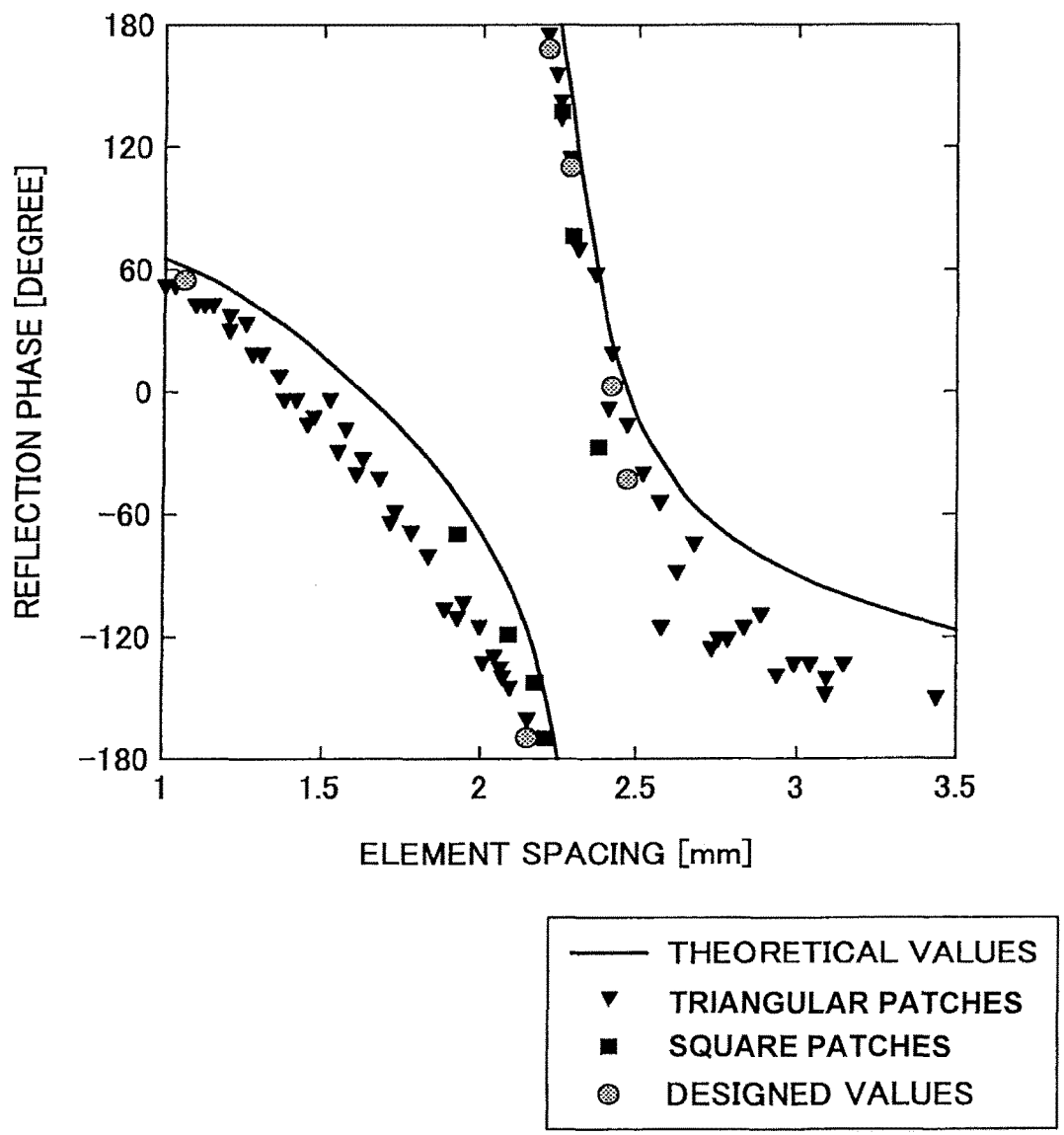
FIG. 7 is a diagram showing a relationship between the reflection phase and the element spacing for a case in which the incident angle $\theta_i$ is 70 degrees.

The dashed line indicates theoretical values for the case in which the incident angle $\theta_i$ is 30 degrees. The "theoretical values" in the explanations of FIGS. 5-7 are the values which are calculated by using [Expression 1]. The theoretical value of the reflection phase $\phi$ can be obtained as an argument or a phase angle ($\phi$=arg ($\Gamma$)) of the reflection coefficient T in [Expression 1]. The circles indicate simulated values of the reflection phase which are obtained by an electromagnetic field analysis tool (HFSS) for the case in which the incident angle $\theta_i$ is 30 degrees. The solid line indicates theoretical values of the reflection phase for a case in which the incident angle $\theta_i$ is 70 degrees. The squares indicate simulated values of the reflection phase which are obtained by the electromagnetic field analysis tool (HFSS) for the case in which the incident angle $\theta_i$ is 70 degrees. The resonance occurs in the vicinity of 11 GHz in all the cases. It can be found that the frequency characteristics of the reflection phase are different depending on the incident angle.

Next, it is considered to cause an 11 GHz TM wave to be reflected in a suitable direction. As referred to in the background art, in order for the reflectarray to reflect a radio wave in a suitable direction, it is preferable that the reflection phases of the corresponding predetermined number of elements be suitably set within the range from 0 degrees to 360 degrees. A starting point and an end point of the range of the reflection phase are arbitrary. The range may be from 0 degrees to 360 degrees as described above, or the range may be from minus 180 degrees to plus 180 degrees.

In general, in a reflectarray having a two-dimensional arrangement of elements, a reflection phase $\phi_m$ of an element which belongs to an m-th element group can be expressed as follows (m=1, . . . , M).

[Expression 6]

$$\phi_m = \frac{2\pi}{\lambda}(r_m \cdot U_i - r_m \cdot U_r) \quad \text{(Formula 7)}$$

$$\phi_m = \frac{r_m 2\pi}{\lambda}(\sin(\theta_i) - \sin(\theta_r)) \quad \text{(Formula 8)}$$

In this case, an element group includes a plurality of elements which achieves the same reflection phase. This point is explained later. The vector $r_m$ is a position vector of the m-th element group. The amplitude of the vector is $r_m$. $\lambda$ is the wavelength of the radio wave. The vector $U_i$ is a unit vector along a traveling direction of the incident wave. The vector $U_r$ is a unit vector along a traveling direction of the reflected wave. For a case in which the elements which belong to an element group are arranged in a single line, the position vector $r_m$ may point the position of the via of the top element, or it may point the position of the via of the center element among the plurality of elements. For example, when five elements which belong to the same element group are arranged in line, the position vector may point the position of the via of the first element, or it may point the position of the via of the third element which is at the center.

Figure 2:
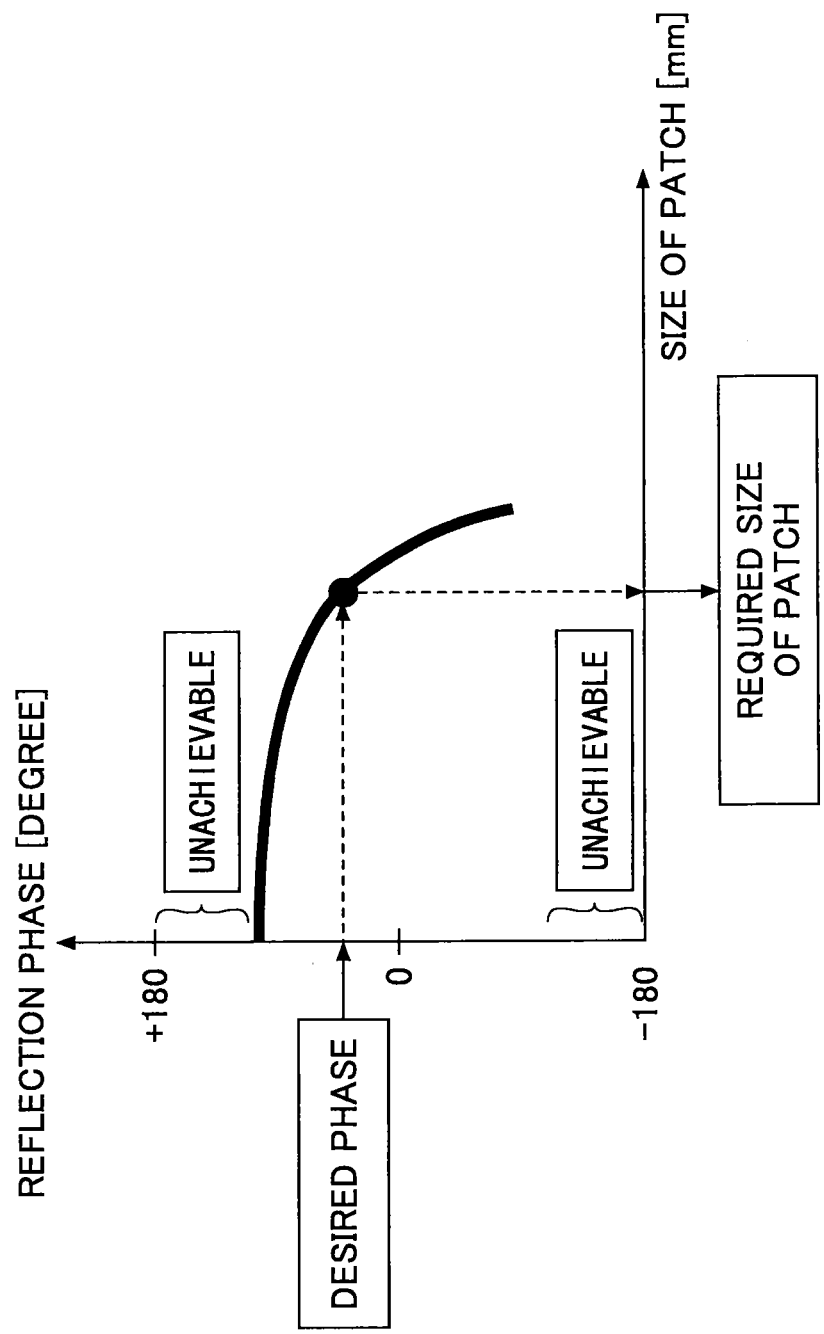
FIG. 2 is a diagram schematically showing a relationship between a reflection phase and a size of a patch.

FIG. 6 shows a relationship between the reflection phase and the element spacing for the case in which the incident angle $\theta_i$ is 0 degrees. Namely, FIG. 6 represents the reflection phase as a function of the element spacing for the case in which the incident angle $\theta_i$ is 0 degrees. The solid line indicates the theoretical values. The squares indicate simulated values for a case where rectangular patches are utilized. For the graph which is shown in FIG. 6, it is noted that the horizontal axis is the element spacing. In this regard, it is different from a conventional technique in which the relationship of the reflection phase and the size of the patches are utilized (e.g., FIG. 2), while maintaining the element spacing to be constant. Further, in the embodiment, the space (gap) between the patches of the neighboring elements is set to be common across arbitrary elements included in the reflectarray. In this regard, it is different from a conventional technique in which the gaps are different depending on the positions. Namely, in the embodiment, it is not true that the sizes of the patches are set to be variable (the gaps are set to be the corresponding values) while setting the element spacing to be constant. Instead, the gaps are fixed while setting the element spacing to be variable (the sizes of the patches are set to be the corresponding values). With such an arrangement, a conventional problem can be effectively avoided such that excessively narrow gaps are required to be formed. Further, taking [Expression 2] into consideration, it is found that [Expression 1], which is the theoretical formula of the reflection coefficient T, explicitly includes the element spacing $\Delta x$. In contrast, the sizes of the patch Wx and/or Wy are not directly included in [Expression 1]. Thus, by adjusting the element spacing, the reflection coefficient, namely, the reflection phase is accurately controlled compared to adjusting the sizes of the patches.

However, even for the case in which the element spacing is controlled, it is difficult to achieve the reflection angle in the vicinity of plus 180 degrees and the reflection angle in the vicinity of minus 180 degrees, as shown in FIG. 6. In order to solve this problem, in the embodiment, the incident angle $\theta_i$ is set to form an angle which is greater than 0 degrees. Namely, the incident wave is caused to obliquely enter with respect to the z-axis. As described above, since the relationship which holds between the reflection phase and the distance of the elements differs depending on the incident angle $\theta_i$, when the incident angle $\theta_i$ is not zero degrees, the relationship which holds between the reflection phase and the element spacing is not that of FIG. 6.

FIG. 7 shows a relationship between the reflection phase and the element spacing for a case in which the incident angle $\theta_i$ is 70 degrees. Namely, FIG. 7 expresses the reflection phase for the case in which the incident angle $\theta_i$ is 70 degrees as a function of the element spacing. The theoretical vales are values which are calculated by using [Expression 1]. The triangles indicate simulated values for a case in which rectangular patches are utilized. The rectangular patch is a patch for a case in which, for example, one of Wx and Wy in FIG. 4 is fixed to be 2.25 mm, and the other one is set to be variable. The squares indicate simulated values for a case in which square patches are utilized. The circles indicate combinations of the reflection phase and the element spacing which are used for the simulation. The simulation is described later. Here, [Expression 1], which is used for the calculation of the theoretical values, assumes that square patches are utilized.

As shown in FIG. 7, as the element spacing increases from 1 mm to 2.25 mm, the reflection angle gradually decreases from approximately 60 degrees to minus 180 degrees. Further, when the element spacing increases from 2.25 mm to 2.5 mm, the reflection phase rapidly decreases from plus 180 degrees to approximately minus 60 degrees. When the element spacing increases from 2.5 mm to 3.5 mm, the reflection phase gradually decreases from approximately minus 60 degrees to approximately minus 120 degrees. In this manner, since any value of the reflection phase in the range from minus 180 degrees to plus 180 degrees corresponds to a value of the element spacing, all the reflection phases can be achieved, at least in theory. However, the reflection phase varies from minus 180 degrees to plus 180 degrees when the element spacing is 2.25 mm. In FIG. 7, there are two points of the element spacing at which the phase is zero. Between these points, the phase continuously changes 360 degrees. Namely, the phase changes from 0 degrees to minus 180 degrees, and from plus 180 degrees to 0 degrees. The characteristic in such a shape is referred to as the "two resonance characteristic." Thus, in the embodiment, for any desired reflection phase within 360 degrees, a corresponding element spacing can be selected.

In the embodiment, the various parameters which are included in [Expression 1] are selected, so that the relationship between the reflection phase and the element spacing demonstrates the two resonance characteristic. By utilizing the relationship between the reflection phase and the element spacing which indicates the two resonance characteristic, an arbitrary value of the reflection phase can be caused by some element, thereby improving the reflection characteristic of the reflectarray. In this case, since the gap between the patches can be maintained to be constant, it is not necessary to form an excessively narrow gap. The specific design procedure of the elements is described later.

When the two resonance characteristic is utilized, not only the graph in which the reflection phase is represented by the function of the element spacing, but also a graph in which the reflection phase is represented by a function of another parameter may be used. Specific examples of such a parameter include, for example, the size of the patch if each of the elements, and the size of the space (gap) between the patches of the neighboring elements.

Figure 21:
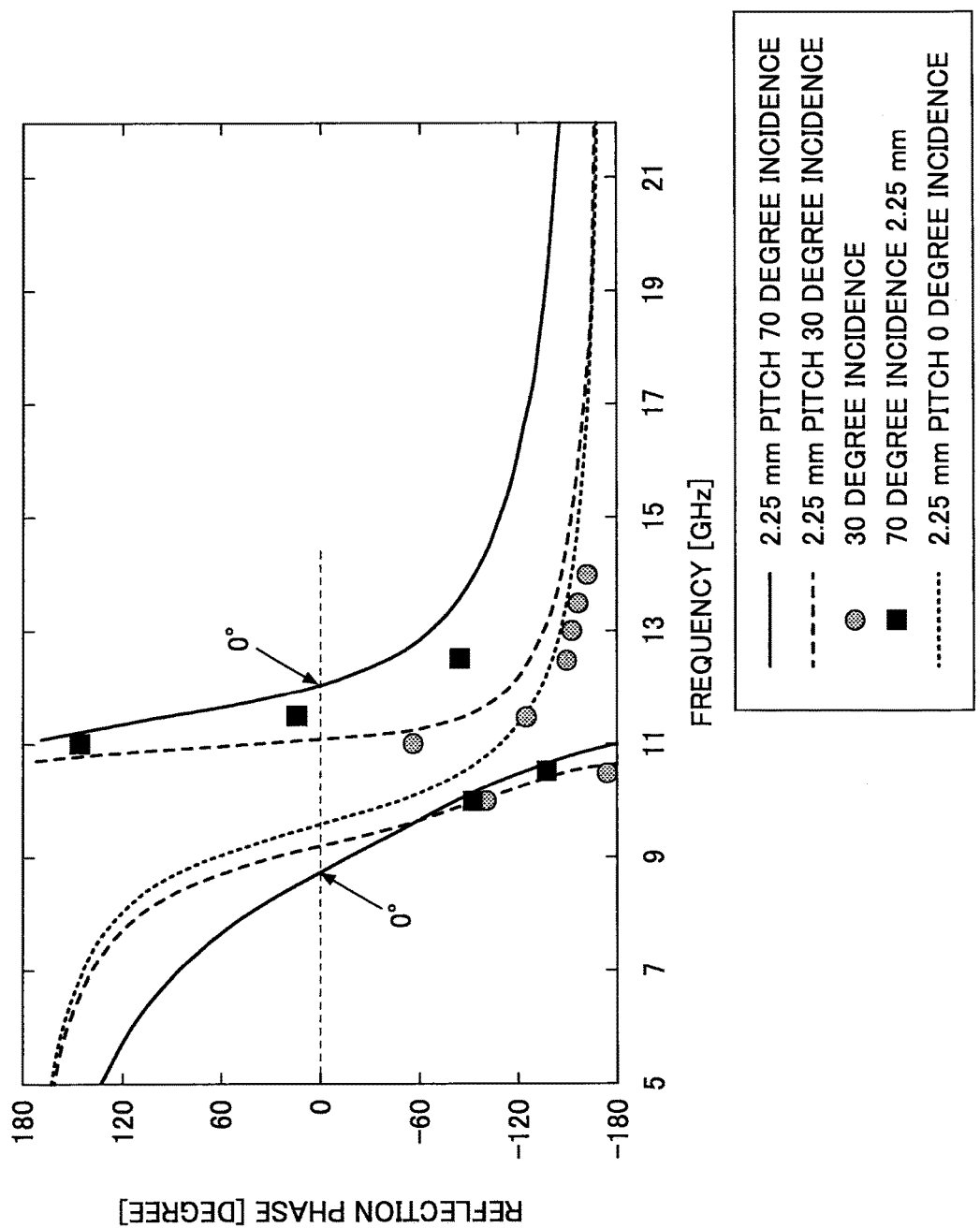
FIG. 21 is a diagram showing a frequency characteristic of the reflection phase.

Further, the "two resonance" is explained by using FIG. 21. As described above, when the TM wave (which is a wave in parallel with the via, and the electric field is in parallel with a plane of incidence) obliquely enters the mushroom-like structure, the resonant frequency $r_f$ is 10.5 GHz, and the reflection phase (continuously) varies from minus 180 degrees to plus 180 degrees. In this case, as shown in FIG. 21, there are two points of the frequency, which are approximately 8.75 GHz and 12.05 GHz, at which the reflection phase becomes zero (the frequencies at which positive and negative of the reflection phase is reversed). Namely, when the frequency varies from 8.75 GHz to 12.05 GHz, the phase varies 360 degrees. The frequencies at which the reflection phase becomes 0 are referred to as the "resonant frequencies" of the mushroom-like structure, besides the above-described $r_f$. For the front incidence, the resonance occurs at one point, which is approximately 9.5 GHz. For the oblique TM incidence, the resonance occurs at two points. Thus, it is referred to as the "two resonance."

<<1.2 Element Group>>

When an incident wave obliquely enters with respect to the z-axis, it is necessary that, in addition to the reflection by the patch, the reflection by the ground plate is considered.

Figure 8:
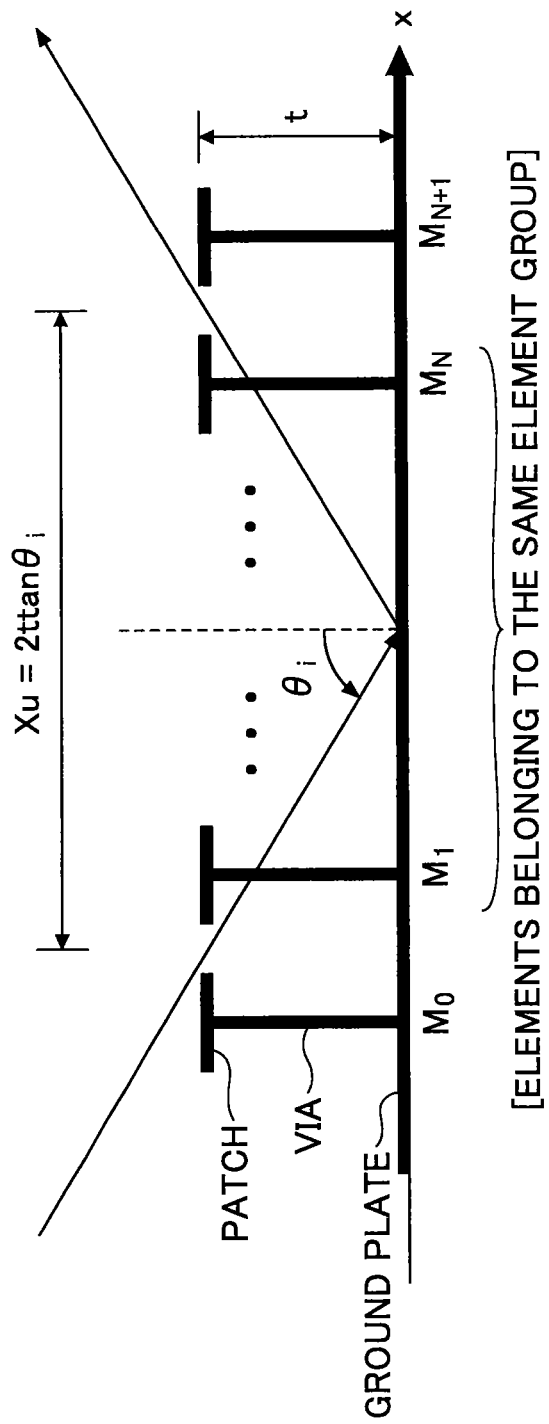
FIG. 8 is a diagram showing a state in which the radio wave which obliquely enters is reflected by a ground plate.

FIG. 8 shows a state in which the radio wave, which obliquely enters with the incident angle $\theta_i$, is reflected by the ground plate. For convenience, labels $M_0, M_1, \ldots, M_N$, and $M_{N+1}$ are attached to the elements which are arranged in line in the x-axis direction. It is assumed that the height of the patch with respect to the ground plate (i.e., the length of the via) is t. When mirror reflection is caused by the ground plate, the reflected wave travels in the direction of the reflection angle $\theta_i$. In this case, on the reflectarray, the distance Xu between the point at which the incident wave enters and the point from which the reflected wave is emitted is Xu=2×t×tan $\theta_i$. It is preferable that the elements $M_1, \ldots, M_N$, which are disposed within the range of the distance Xu, be designed so that they achieve the same reflection phase. In other words, for designing the elements which are included in the reflectarray, for each element group that includes a plurality of elements, the design parameters are determined so that the elements within the range of Xu=2×t×tan $\theta_i$ have the same size and the same shape (the same design parameters). For the example which is depicted in the figure, the number N of the elements which are included in the element group having the length of Xu is the maximum integer which does not exceed (Xu/Δx). However, it is not required that N elements are included within the range of Xu. The number of the elements which are included within the range of Xu may be less than N. That is because it suffices if the elements included in one element group are designed with the parameters having the same values.

For convenience of the explanation, FIG. 8 only shows the x-axis direction. Actually, the same explanation can be applied for the y-axis direction. Thus, in general, each of the element groups has a size which is extended in a direction of at least one axis which is perpendicular to the z-axis, and the size is the length which is greater than or equal to twice as much as the product of the thickness of the substrate and a trigonometric ratio of the incident angle of the radio wave. In such a reflectarray, a plurality of element groups is disposed in the x-axis direction and in the y-axis direction. Here, each of the element groups includes a plurality of elements. Each of the element groups achieves, at least, a reflection phase which is different from that of the neighboring element group.

<<1.4 A Design Procedure>>

Figure 9A:
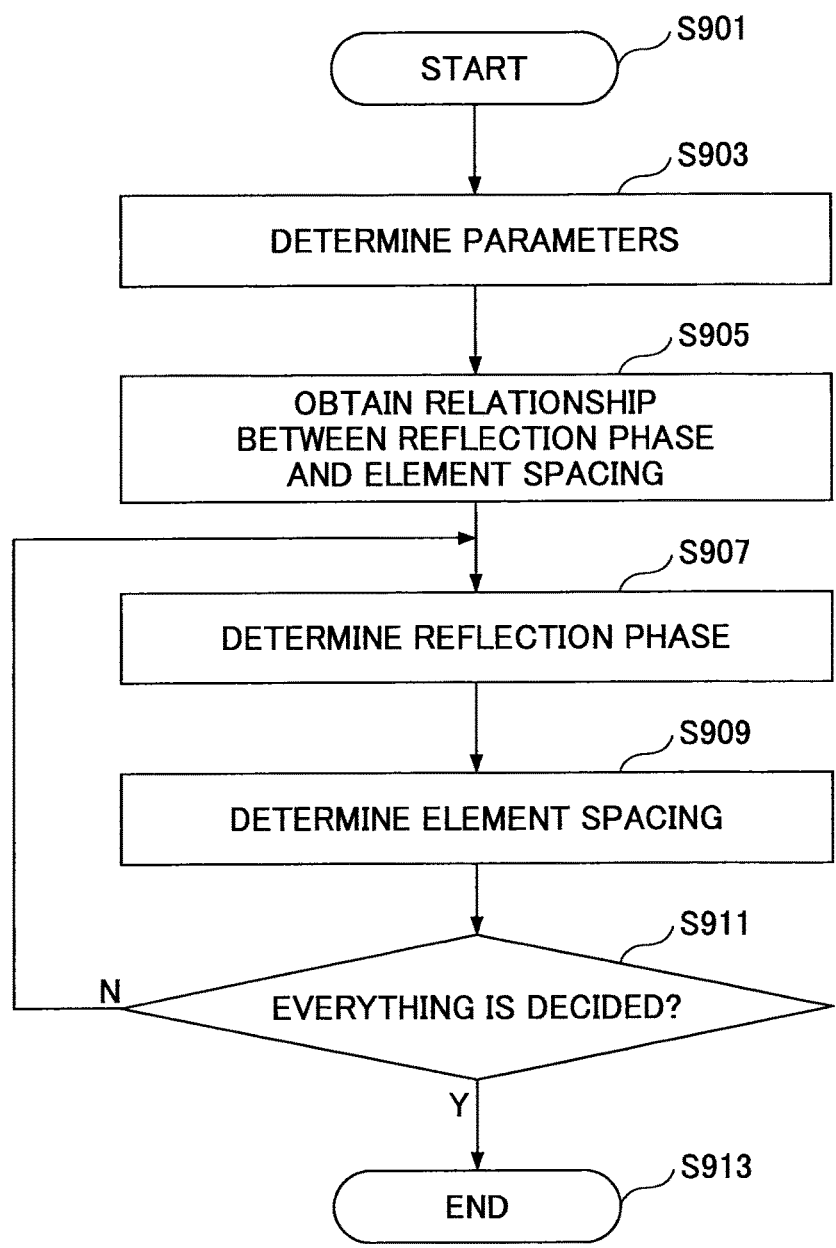
FIG. 9A is a flowchart showing an example of a design procedure for determining the element spacing.

There is explained a design procedure for determining the element spacing included in the reflectarray, while referring to FIG. 9A. FIG. 9A shows a flowchart. The flowchart shows an example of the design procedure. The flow starts at step S901, and the flow proceeds to step S903.

At step S903, values of parameters are determined, which are required to be determined in advance and which can be determined in advance. For example, the values of the parameters, such as the design frequency, the thickness of the dielectric substrate, the relative dielectric constant of the dielectric substrate, the incident angle of the radio wave, and the reflection angle of the radio wave, are determined in advance. In accordance with these parameters, the relationship is determined which holds between the reflection phase and the element spacing. For convenience of the explanation, the values of the various types of parameters are determined so that the relationship which holds between the reflection phase and the element spacing demonstrates the two resonance characteristic. However, it is not required to determine these parameters so that the two resonance characteristic is demonstrated. As to whether the two resonance characteristic is obtained by the combination of some parameters can be determined, for example, by investigating how the reflection phase arg (Γ) which is calculated from [Expression 1] is varied with respect to the element spacing Δx.

At step S905, data is obtained which represents the relationship which holds between the reflection phase and the element spacing for a case in which the radio wave enters with a predetermined incident angle, and the radio wave is reflected. A specific example of such data is the data representing the relationship between the reflection phase and the element spacing such as shown in FIGS. 6 and 7. As an example, the data of such a relationship may be theoretically obtained by using [Expression 1]. However, it is noted that, in this case, square patches are assumed. Alternatively, the data of the relationship may be obtained by a simulation or an experiment. In either case, the reflection phase is calculated or obtained for a case in which the radio wave enters a model structure, in which many elements (theoretically, an infinite number of elements) are arranged in line while the elements are spaced apart by the distance Δx, with the incident angle $θ_i$, and it is reflected. By obtaining the reflection phases for various types of element spacing, the data of the relationship such as shown in FIGS. 6 and 7 can be obtained. Regardless of whether the theoretical formula, the simulation, or the experimental method is utilized, at step S905, the reflection phase is obtained as a function of the element spacing, and the data representing the function is stored in the memory. Here, it is not mandatory for the present invention that the reflection phase is the function of the element spacing. The data of the relationship, in which the reflection phase is represented by a function of another parameter, may be stored in the memory. A specific example of the other parameter is the size of the patch of each of the elements, the size of the space (gap) between the patches of the neighboring elements, or the like.

At step S907, a reflection phase which is to be achieved by a specific element is determined. When the incident angle $θ_i$ is 0 degrees, the specific element may be one element. However, when the incident angle $θ_i$ is an angle other than 0 degrees, a reflection phase which is common among the elements included in a specific element group is determined. As described above, one element group includes less than $2×t×\tan θ_i$ elements.

At step S909, the element spacing that corresponds to the reflection phase that is to be achieved by the specific element is determined in accordance with the data of the relationship which is stored in the memory. When the gaps are constant, the sizes of the patches are determined by the element spacing and the gaps.

At step S911, a determination is made as to whether the element spacing is determined for all the elements. When the element spacing is not determined for all the elements, the flow returns to step S907, and the reflection phases and the element spacing are determined for the remaining elements. When a determination is made at step S911 that the element spacing is determined for all the elements, the flow proceeds to step S913, and it is terminated.

Figure 10:
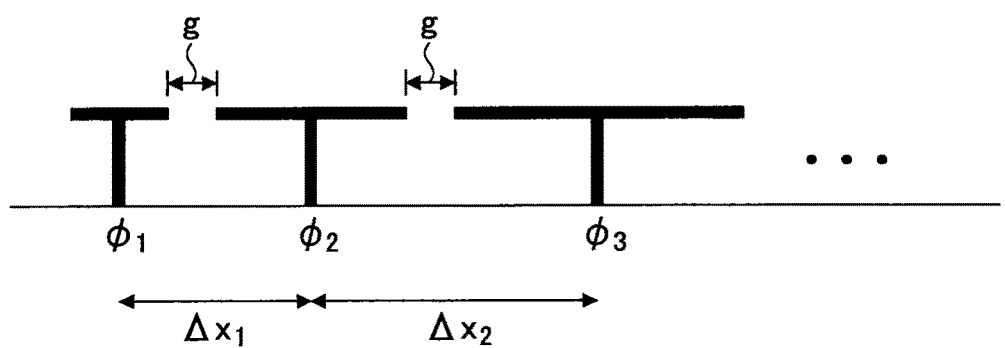
FIG. 10 is a diagram showing a portion of the reflectarray, for which the element spacing is determined so that a specific element achieves a specific reflection phase.
Figure 11:
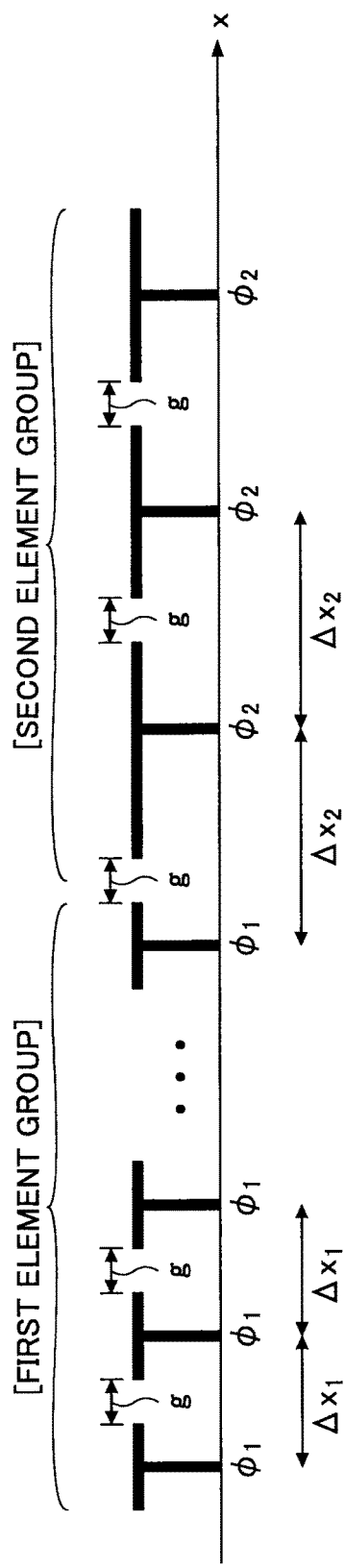
FIG. 11 is a diagram showing a portion of the reflectarray, for which distances of elements are determined so that a specific element group achieves a specific reflection phase.

In this manner, the procedure for determining the element spacing based on the predetermined relationship is repeated for the plurality of the elements, so that specific elements achieve the specific reflection phases. Namely, by repeating the procedure for determining the reflection phase, the position of the element (the position vector), and the element spacing, specific design parameters for the corresponding elements are determined. As a result, the element spacing and the sizes of the patches are determined as shown in FIG. 10. Alternatively, the procedure of determining the element spacing which is common for the elements belonging to a specific element group in accordance with the predetermined relationship is repeated for each of the element groups, so that the incident wave is reflected with specific reflection phases, which are different on an element group by element group basis. In this manner, the element spacing is determined for the elements included in the reflectarray. As a consequence, the element spacing and the sizes of the patches are determined as shown in FIG. 11, for example.

As described above, by sequentially determining a desired reflection phase and corresponding element spacing based on the predetermined relationship between the element spacing and the reflection phase (e.g., FIGS. 6 and 7), it is possible to produce an element array such that the reflection phase gradually varies over the range of 360 degrees. By arranging a plurality of such element arrays, it is possible to achieve a reflectarray having a desired reflection characteristic. For example, when such an element array is formed by using eleven elements which are arranged in line, a difference between the reflection phases of the neighboring two elements is approximately 32.72 degrees. However, when the element spacing is sequentially determined for all the elements by repeatedly determining one reflection element and the corresponding element spacing, it is possible that a value of the reflection phase which is actually achieved by the element array according to that design is not the desired value. That is because the reflection phase is not determined by the boundary of the element spacing, but the reflection phase is determined by the center of the space (gap) between the patches of the neighboring elements. FIG. 9B shows differences (degree) between the reflection phases which are achieved by the corresponding elements and the desired reflection phases, when an element array is produced by sequentially determining the element spacing for all the eleven elements while repeatedly determining one reflection phase and the element spacing corresponding to the reflection phase. For a case in which the element achieves the desired reflection phase, the difference is 0. Ideally, for all the eleven positions or coordinates (mm), the differences are 0. However, as shown in the figure, the reflection phases which are achieved by the corresponding elements are shifted from the ideal values. An improved example, which is explained below, shows a method of suitably determining the element spacing by considering that the reflection phase is determined by the center of the gap between the patches.

Figure 9C:
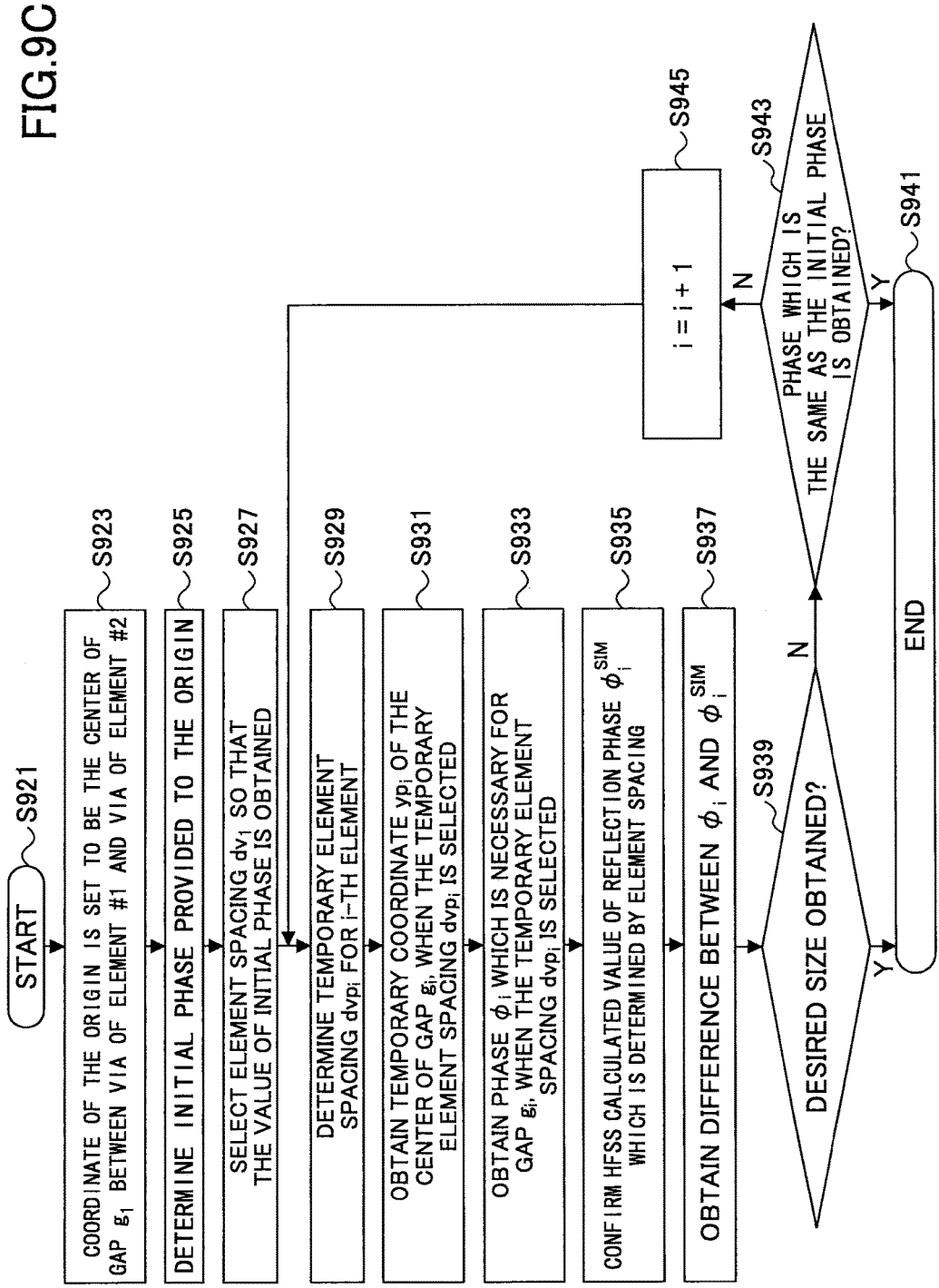
FIG. 9C is a flowchart showing a procedure which can be used in the design procedure for determining the element spacing.

FIG. 9C shows a flowchart according to the improved example, which can be used for design procedure for determining the element spacing. The depicted procedure can be used for repeating steps S907, S909, and S911 in the design procedure shown in FIG. 9A. The flow starts at step S921, and the flow proceeds to step S923.

Figure 9D:
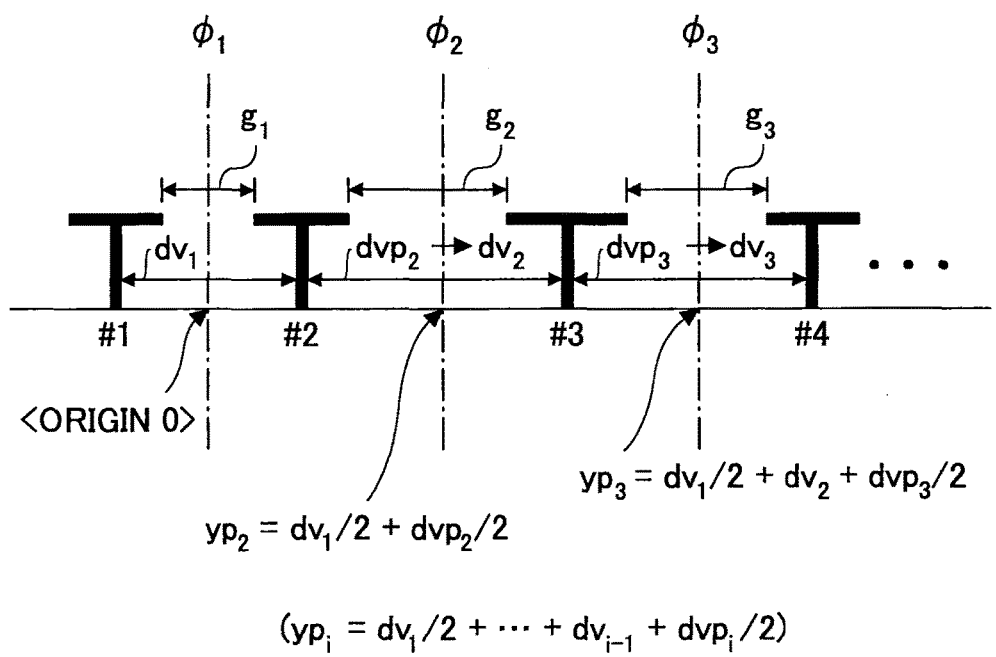
FIG. 9D is a diagram showing a mutual relationship between the element spacing and a gap.

At step S923, the origin 0 of the coordinate is determined. As shown in FIG. 9D, the origin 0 is set by being aligned with the center of the gap (space) $g_1$ between the patch of the first element #1 and the patch of the second element #2. As shown in FIG. 9D, for a value of i which is greater than or equal to 2, the element spacing between the i-th element #i and the i+1-th element #i+1 is $dv_i$, and the gap between the patches is $g_i$. Here, $dv_i$ corresponds to Δx and Δy in FIG. 4, and g corresponds gx and gy in FIG. 4.

At step S925, an initial phase $\phi_1$ with respect to the origin 0 is determined. The initial phase may be 0 degrees or 180 degrees. However, the initial phase is not limited to these values, and the initial phase may be determined to any phase depending on an implementation.

At step S927, the element spacing $dv_1$ is determined, so that the initial phase $\phi_1$ which is determined at step S925 is achieved. The relationship between the reflection phase and the element spacing such as shown in FIGS. 6 and 7 is stored in the memory in advance (step S905 of FIG. 9A). By referring to the relationship, the element spacing $dv_1$ which is required for achieving the initial phase $θ_1$ can be determined. As described above, such relationship between the reflection phase and the element spacing may be obtained, for example, by the simulation using an electromagnetic field analysis tool (High Frequency Structure Simulator: HFSS), or by the experiment.

At step S929, temporary element spacing $dvp_i$ for i-th element is selected within a predetermined numerical range. For example, the numerical range is within a range which is greater than or equal to 1 mm and less than or equal to 6.1 mm. However, the embodiment is not limited to this, and any suitable numerical range may be set. The initial value of i is 2. Thus, subsequent to determining the initial phase $\theta_1$ and the first element spacing $dv_1$, the second temporary element spacing $dvp_2$ is determined within the range which is greater than or equal to 1 mm and less than or equal to 6.1 mm.

At step S931, the coordinate $yp_i$ of the center position of the gap $g_i$ is determined for the case in which the temporary element spacing $dvp_i$ is utilized. In general, the coordinate $yp_i$ of the center position of the gap $g_i$ is expressed by the following formula.

$$yp_i = dv_1/2 + \ldots + dv_{i-1} + dvp_i/2 \tag{Y}$$

Here, i is an integer which is greater than or equal to 2. For example, if i=2, $yp_2 = dv_1/2 + dvp_2/2$. If i=3, $yp_3 = dv_1/2 + dv_2 + dvp_3/2$.

At step S933, the ideal reflection phase $\phi_i$ is calculated by the following formula. The ideal reflection phase $\phi_i$ is to be achieved at the center position of the gap $g_i$, for a case in which the temporary element spacing $dvp_i$ is utilized.

$$\phi_i = (yp_i \times 2\pi/\lambda)(\sin(\theta_i) - \sin(\theta_r)) \tag{P}$$

The formula (P) corresponds to the Formula (8), and the $\phi_i$ is the phase difference with respect to the origin 0. Here, $\theta_i$ represents an argument which is formed by the incident wave with respect to the z-axis, and $\theta_r$ represents an argument which is formed by the reflected wave with respect to the z-axis. $\lambda$ represents the wavelength of the radio wave (for example, when the frequency is 11 GHz, the wavelength is 27.3 mm).

At step S935, a reflection phase $\phi_i^{SIM}$ which corresponds to the temporary element spacing $dpv_i$ is obtained by referring the relationship between the reflection phase and the element spacing such as shown in FIGS. 6 and 7.

At step S937, a difference is calculated between the ideal reflection phase $\phi_i$ which is obtained by the formula (P) and the actually achieved reflection phase $\phi_i^{SIM}$ which is obtained by the relationship between the reflection phase and the element spacing. Then, the temporary element spacing $dvp_i$ is determined which minimizes the difference. Thus, the processes at steps S929-S937 are executed for the value of the temporary element spacing $dvp_i$ which is within the predetermined numerical range, and the value of the temporary spacing $dvp_i$ which minimize "$\phi_i - \phi_i^{SIM}$" is optimized as the actual element spacing $dv_i$ and the reflection phase $\phi_i$.

At step S939, a determination is made as to whether the size which is calculated by the formula (P) reaches a desired size of the reflectarray, which is the target of the design. When the size reaches the desired size, the flow proceeds to step S941, and the flow is terminated. When the size does not reach the desired size, the flow proceeds to step S943.

At step S943, a determination is made as to whether the reflection phase $\phi_i$ which is just determined is equal to the initial phase $\phi_1$. When they are equal, since the total of the reflection phases by $\phi_1$, $\phi_2$, . . . , and $\phi_i$ is 360 degrees, the flow proceeds to step S941, and it is terminated. When the reflection phase $\phi_i$ which is just determined is not equal to the initial phase $\phi_1$, the flow proceeds to step S945.

At step S945, the value of i is incremented, and the flow returns to step S929. Subsequently, the already explained processes are repeated.

In the flowchart according to the improved example, among types of the temporary element spacing which are included in the constant numerical range (e.g., 1 mm≤d-$vp_i$≤6.1 mm), the value of the temporary element spacing $dvp_i$ which minimizes "$\phi_i - \phi_i^{SIM}$" is set to be the actual element spacing, and the reflection phase $\phi_i$ corresponding to that element spacing is realized. In this manner, by considering that the reflection phase is achieved by the center of the gap of the neighboring elements, the element spacing is determined while optimizing the element spacing of the corresponding element ($dvp_i \rightarrow dv_i$). Thus, the design method according to the improved example can achieve a reflectarray which is superior in the reflection characteristic compared to the reflectarray according to the conventional example. The simulation result regarding the improved example is described later while referring to FIGS. 9E through 9H.

<<1.4 Simulation Result>>

Hereinafter, a simulation result of the reflectarray is explained, for which the element spacing is determined in accordance with the design procedure.

Figure 12A:
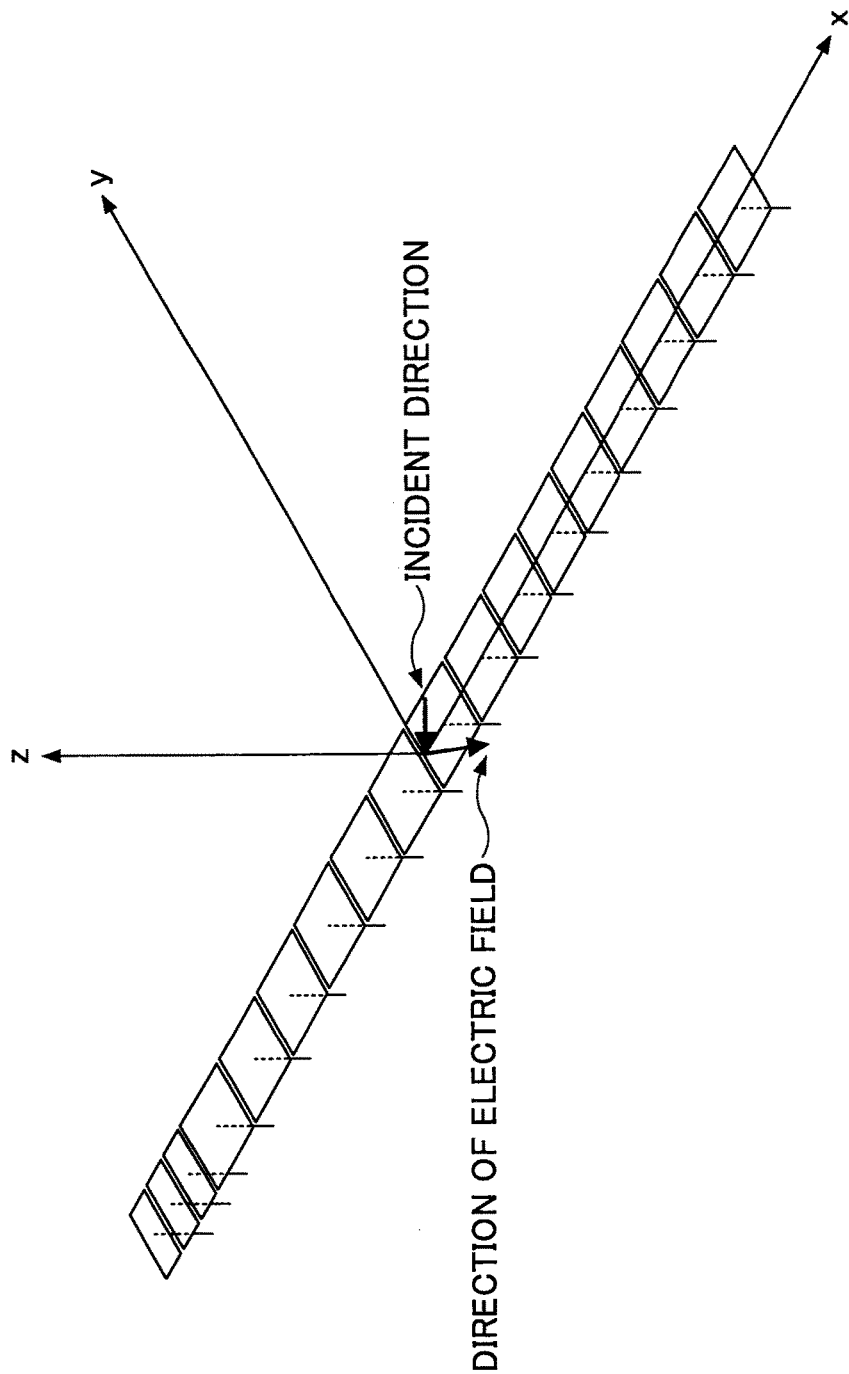
FIG. 12A is a diagram showing one sequence of an element array which is used for a simulation.
Figure 12B:
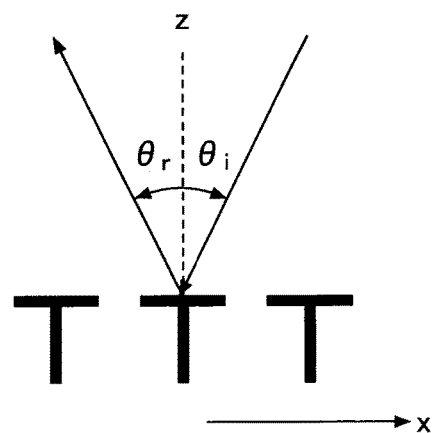
FIG. 12B is a diagram showing an incident angle and a reflection angle.

(1) FIG. 12A shows one sequence of an element array which is used in the simulation. Such element arrays are also arranged in the y-axis direction, and it is assumed that a reflectarray having an approximate size of 40 mm×40 mm is formed. It is assumed that the incident wave and the reflected wave are on the zx-plane, and that the radio wave is a TM wave. Namely, the amplitude direction of the electric field is in the zx-plane. Specifically, the element spacing of a plurality of elements and the like are determined, so that the radio wave enters with an incident angle $\theta_i = 70$ degrees with respect to the z-axis, and the radio wave is reflected with a reflection angle $\theta_r = -30$ degrees. The elements have the mushroom-like structure. Here, as shown in FIG. 12B, the incident angle and the reflection angle indicate angles relative to the z-axis, respectively. However, it is noted that the directions of the plus and minus of the corresponding angles are reversed.

As explained in "1.2 Element group," the reflection phase and the element spacing are determined for each element group, which includes the plurality of elements. One element group is formed by three elements. The element array which is shown in FIG. 12A includes six element groups. As shown in FIG. 12E, a design is made so that three neighboring elements achieve the same reflection phase (three elements form one set).

Figure 12C:
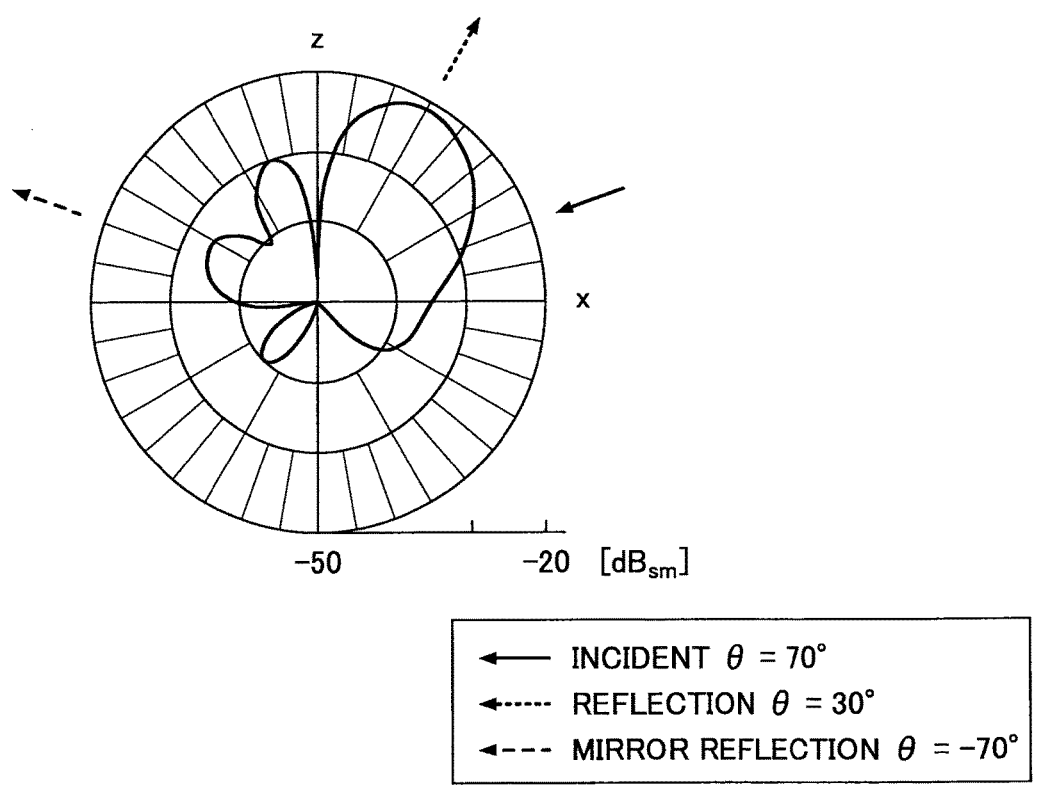
FIG. 12C is a diagram showing a scattering cross section of the radio wave.

FIG. 12C shows the scattering cross section of the radio wave. The directions of the incident wave, the reflected wave, and the mirror reflected wave are indicated for reference. As depicted, it can be found that a strong reflected wave is formed in the desired direction of the reflection angle $\theta_r = -30$ degrees, while the radio wave in an undesired direction such as the mirror reflection direction is suppressed. Since the plus direction of the reflection angle $\theta_r$ is opposite to the plus direction of the incident angle $\theta_i$, the direction of the reflection angle $\theta_r$ of $-30$ degrees is the same as the direction of the incident angle $\theta_i$ of $+30$ degrees.

Figure 12D:
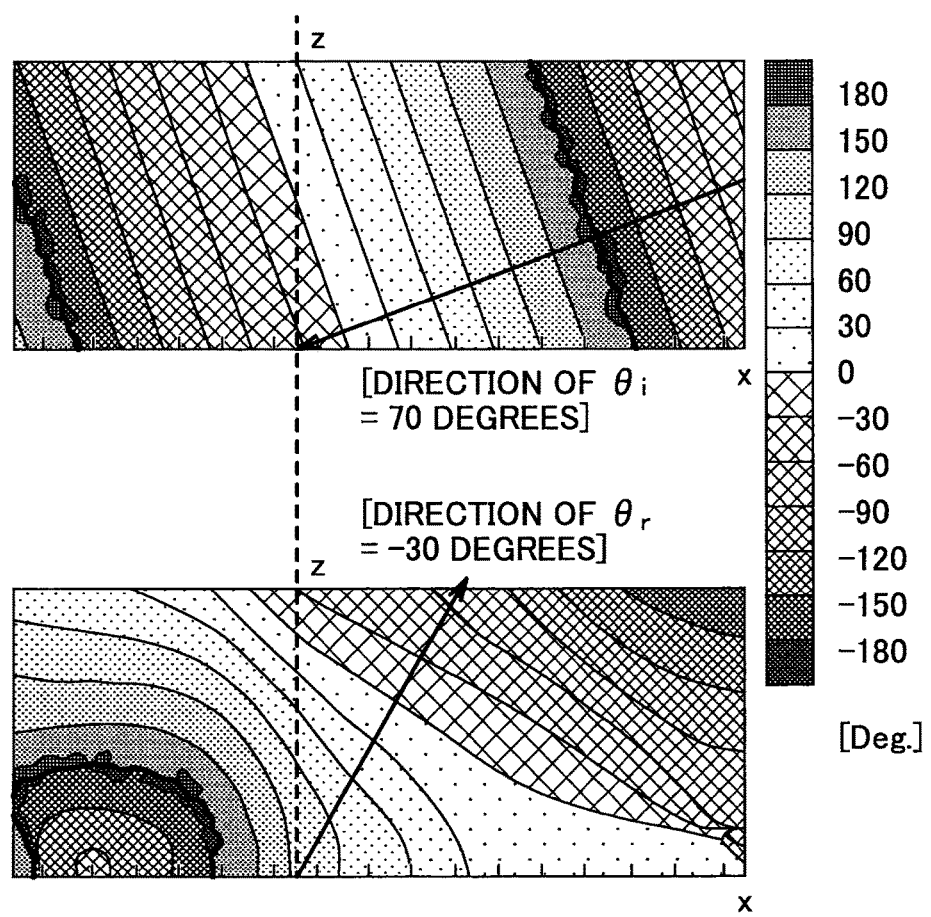
FIG. 12D is a diagram showing a contour of phases of an incident wave, and a contour of phases of a reflected wave.
Figure 12E:
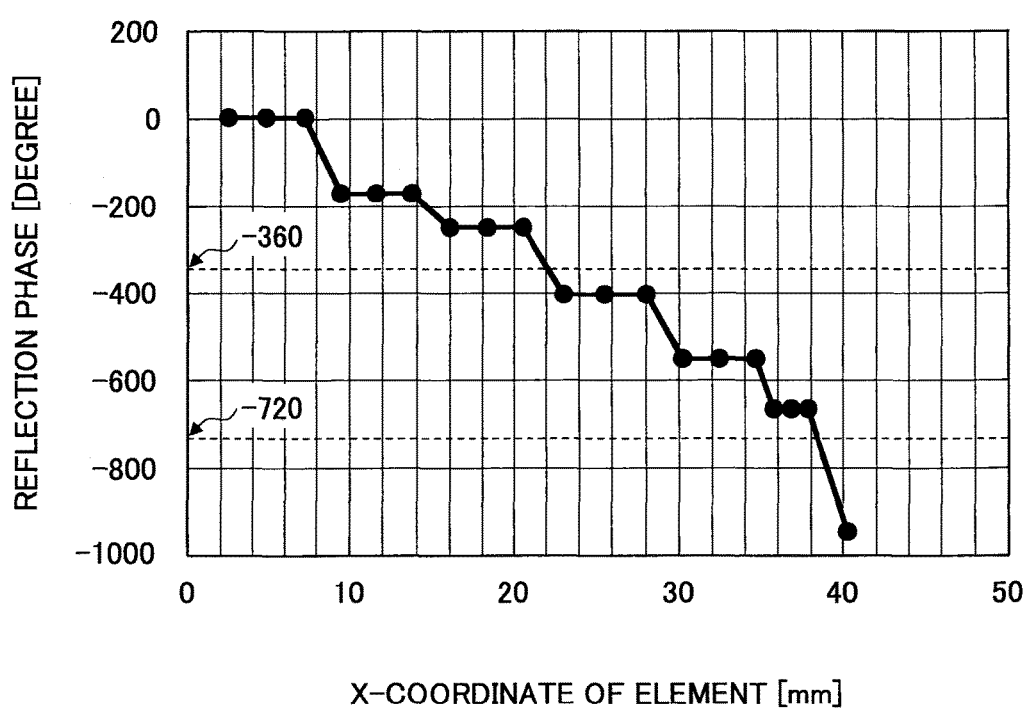
FIG. 12E is a diagram showing a relationship between a coordinate of the element and the reflection phase.

FIG. 12D shows contours of the phases in the incident wave and the reflected wave. In general, the radio wave travels in the direction of the arrow, which is perpendicular to the contours. As depicted, the radio wave enters with the incident angle of $\theta_i = 70$ degrees, and it is reflected with the reflection angle of $\theta_r = -30$ degrees.

Figure 12G:
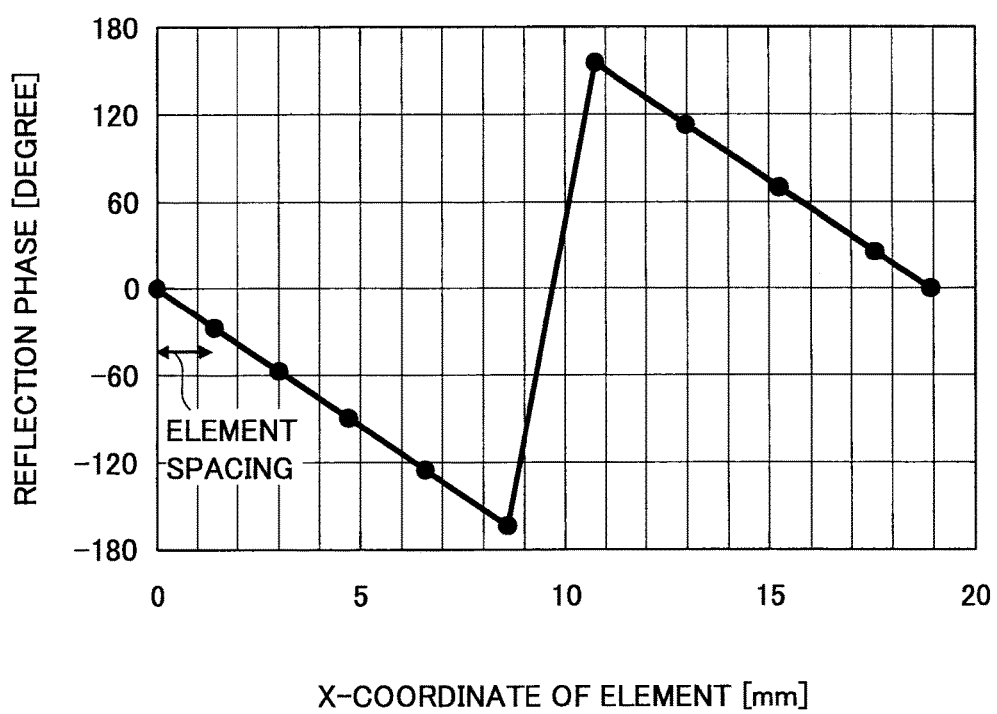
FIG. 12G is a diagram showing the relationship between the coordinate of the element and the reflection phase.
Figure 12H:
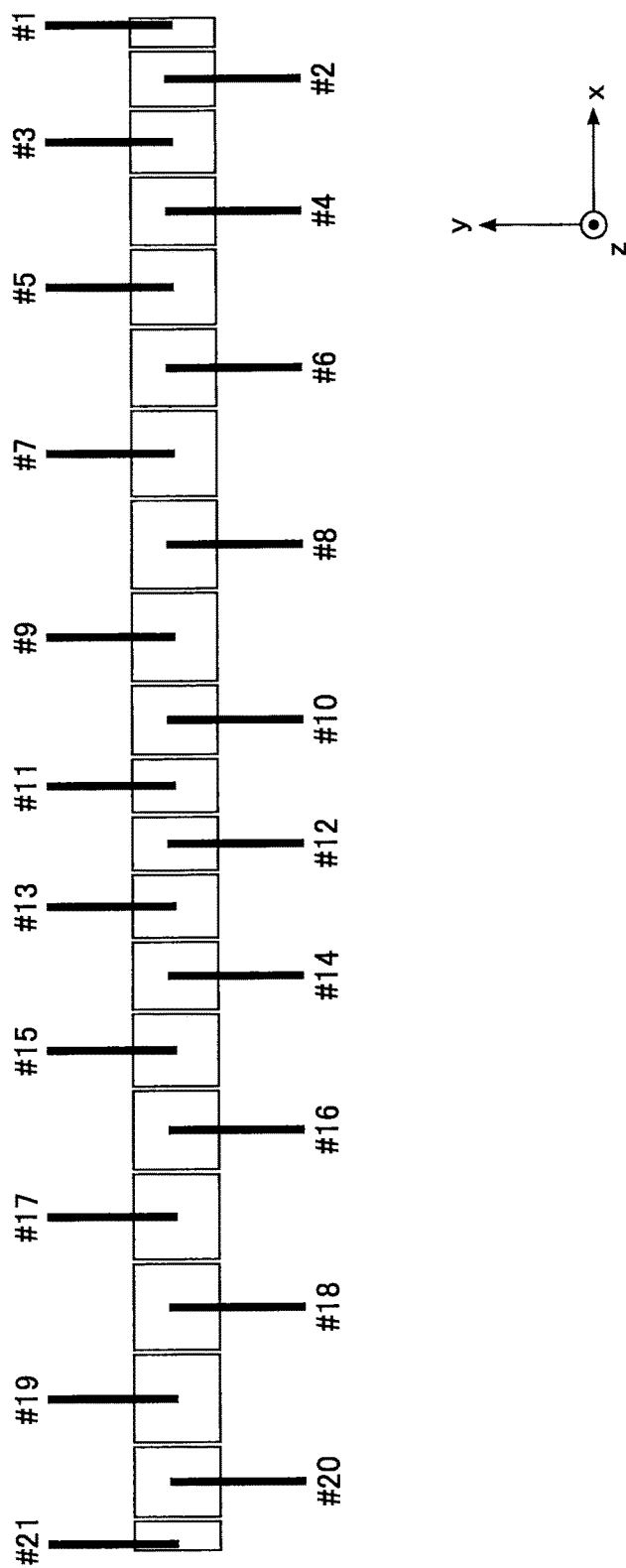
FIG. 12H is a plane view of an element array which is included in the reflectarray.
Figure 12I:
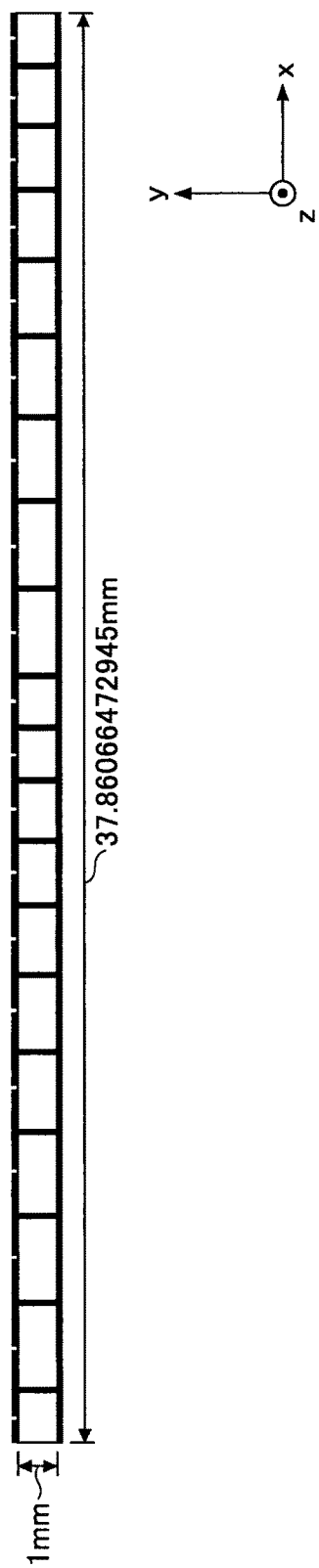
FIG. 12I is a side view of the element array which is included in the reflectarray.
Figure 12J:
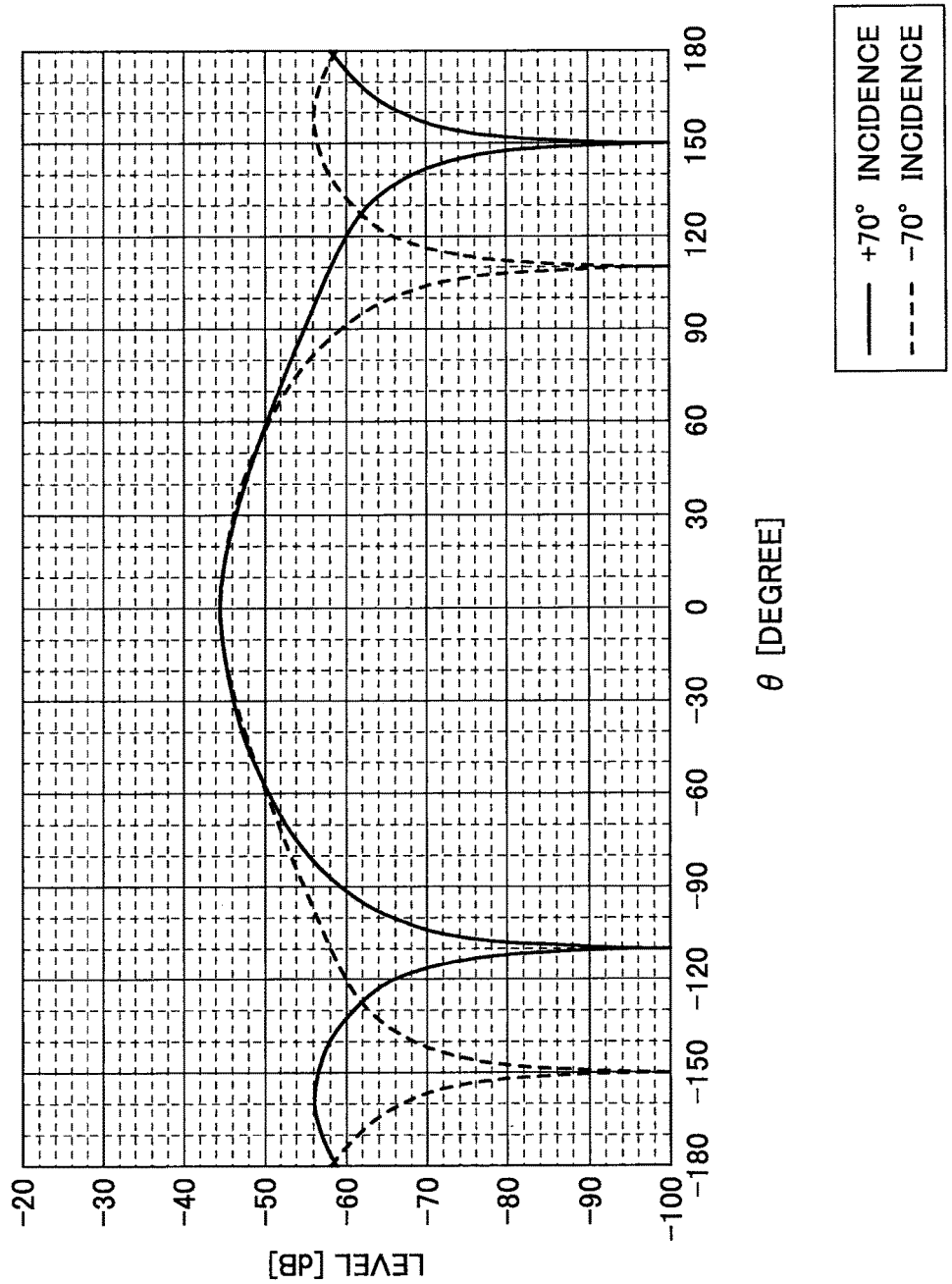
FIG. 12J is a diagram showing a far radiation field of the reflect array in which a plurality of elements is not forming a set.

A case is considered in which it is assumed that the design is made such that elements which are arranged in line in the x-axis direction do not form the element groups. For example, a case is considered in which the design is not made such that three elements form one set. When the design parameters of the corresponding elements are determined, so that the radio wave is reflected in the desired direction of $\theta = -30$ degrees for the oblique incidence of $\theta = 70$ degrees, for example, the elements are arranged such that the neighboring elements achieve different reflection phases. For example, the phases and the coordinates (element spacing) of ten elements may be determined as shown in FIG. 12F. As depicted, the neighboring elements achieve different reflection phases, and types of the element spacing are different. FIG. 12G shows the relationship between the reflection phase and the coordinate of the ten elements, which are shown in FIG. 12F. As depicted, the two resonance characteristic is indicated, and the reflection phase substantially covers the range from +180 degrees to −180 degrees. FIGS. 12F and 12G are examples of the numerical values for the case of ten elements. From the same perspective, a reflectarray including more than ten elements may be designed. FIG. 12H shows a plane view of the element array in which 21 elements are arranged in line in the x-axis direction. A design is made such that the neighboring elements achieve the different reflection phases. FIG. 12I shows a side view of the element array, which is shown in FIG. 12H. FIG. 12J shows a far radiation field of the reflected wave, when the radio wave enters the reflectarray which has the element array such as shown in FIGS. 12H and 12I. The graph is indicated by the solid line for the case in which the radio wave enters with θ=+70 degrees with respect to the z-axis. The graph is indicated by the dashed line for the case in which the radio wave enters with θ=−70 degrees with respect to the z-axis. These graphs indicate that a strong reflected wave is formed in the undesired direction of θ=0 degrees, which is different from the desired direction of θ=−30 degrees. In contrast, when a design is made such that each of the element groups is formed by the one set of the plurality of elements, a strong reflected wave can be formed in the desired direction, as shown in FIG. 12C. In this manner, according to the embodiment, by forming, for the case of the oblique incidence, the element groups such that each of the element groups includes the suitable number of elements, the reflection phases become able to substantially cover the range from +180 degrees to −180 degrees, and a reflectarray can be achieved which forms a strong reflected wave in the desired direction.

(2) FIG. 13A shows one sequence of an element array which is used in another simulation. It is assumed that such element arrays are arranged in the y-axis direction, and thereby the reflectarray is formed. The element spacing or the like is determined for 31 elements (#1-#31) per one element array, so that the radio wave which enters with the incident angle of $\theta_i$=70 degrees is reflected with the reflection angle of $\theta_r$=30 degrees. The elements have the mushroom-like structures. As explained in "1.2 Element group," the reflection phase and the element spacing are determined for each of the element groups. Here, each of the element groups includes the plurality of elements. Three elements form one element group. The element array which is depicted in FIG. 13A includes ten element groups and one element. Here, each of the ten element groups includes three elements.

FIG. 13B shows the reflection phase and the element spacing for each of the elements.

FIG. 13C shows the scattering cross section of the radio wave with respect to the xz-plane. As depicted, the strong reflected wave is formed in the desired direction of the reflection angle of $\theta_r$=30 degrees, while the radio wave in the undesired direction is suppressed.

Figure 14A:
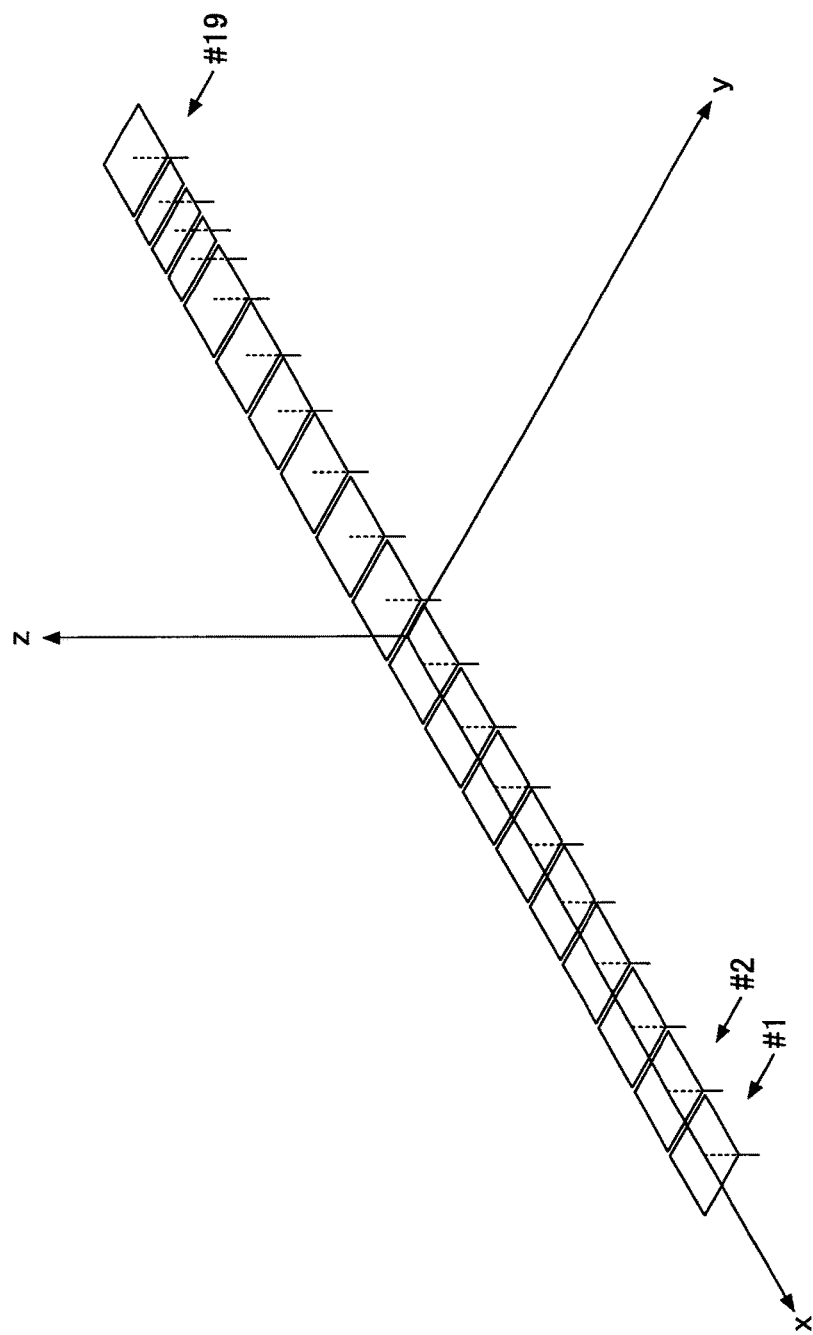
FIG. 14A is a diagram showing one sequence of the element array, which is used for another simulation.

(3) FIG. 14A shows one sequence of the element array which is used in another simulation. It is assumed that such element arrays are arranged in the y-axis direction, and thereby the reflectarray is formed. The element spacing or the like is determined for 19 elements (#1-#19) per one element array, so that the radio wave which enters with the incident angle of $\theta_i$=70 degrees is reflected with the reflection angle of $\theta_r$=−30 degrees. The elements have the mushroom-like structures. As explained in "1.2 Element group," the reflection phase and the element spacing are determined for each of the element groups. Here, each of the element groups includes the plurality of elements. Three elements forms one element group. The element array which is depicted in FIG. 14A includes six element groups and one element. Here, each of the six element groups includes three elements.

FIG. 14B shows the reflection phase and the element spacing for each of the elements.

Figure 14C:
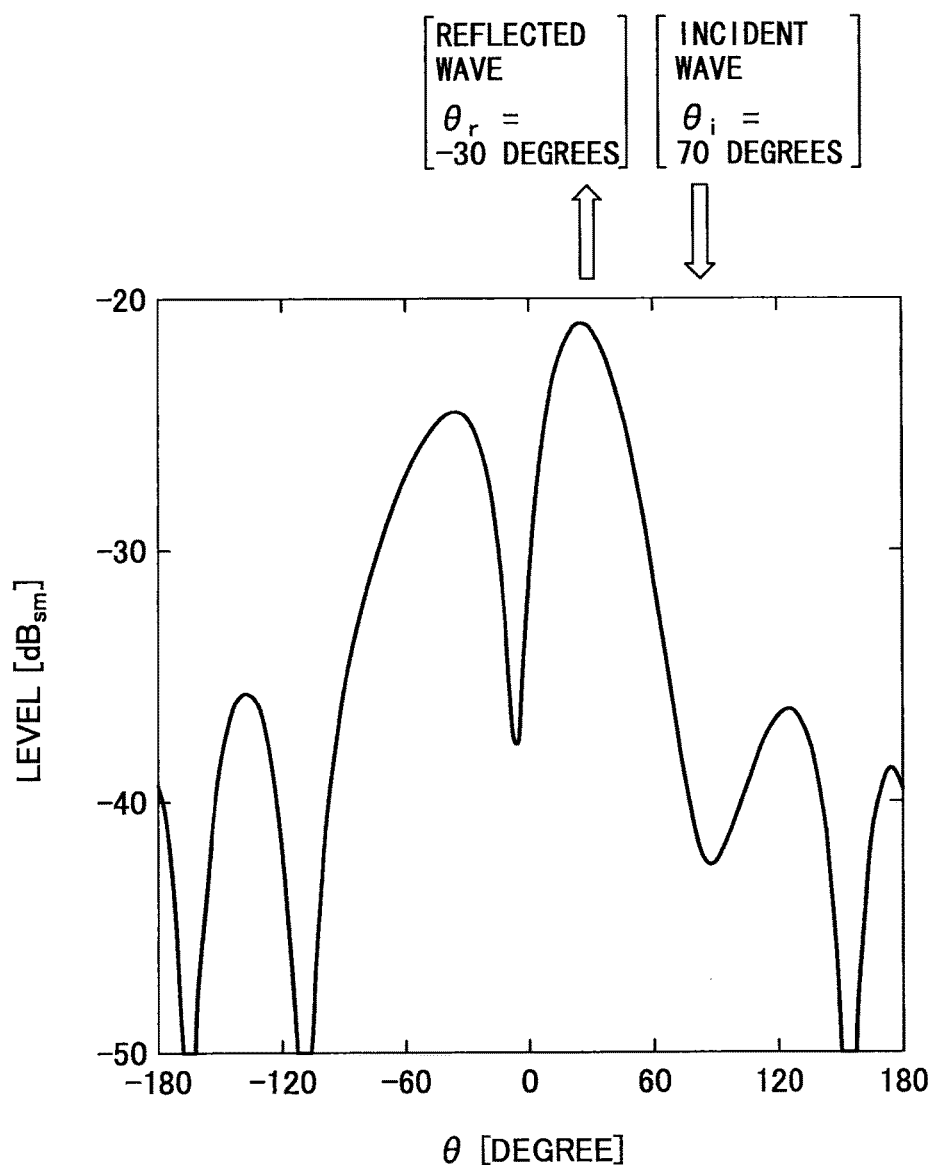
FIG. 14C is a diagram showing a scattering cross section of the radio wave relative to the xz-surface

FIG. 14C shows the scattering cross section of the radio wave with respect to the xz-plane. As depicted, the strong reflected wave is formed in the desired direction of the reflection angle of $\theta_r$=−30 degrees, while the radio wave in the undesired direction is suppressed.

(4) As referred to in connection with FIG. 4, the element spacing may be the distance $\Delta_V$ between the vias of the neighboring elements, or it may be the distance $\Delta_P$ between the center of the gap between the patches and the center of the next gap. However, a specific value of the size of the patch or the element spacing varies depending on which definition is used for the element spacing. Hereinafter, there are shown (4.1) an example of the size for a case in which the element spacing is the distance $\Delta_V$ between the vias, and (4.2) an example of the size for a case in which the element spacing is the distance between the gaps $\Delta_P$. The values of the parameters which are commonly used for both cases are as shown in FIG. 15. Namely, it is assumed that a relative dielectric constant, thickness (the height of the patch or the length of the via), and tan δ of the dielectric substrate are 10.2, 1 mm, and 0.0023, respectively, and that the diameter of the via is 0.1 mm.

Figure 16A:
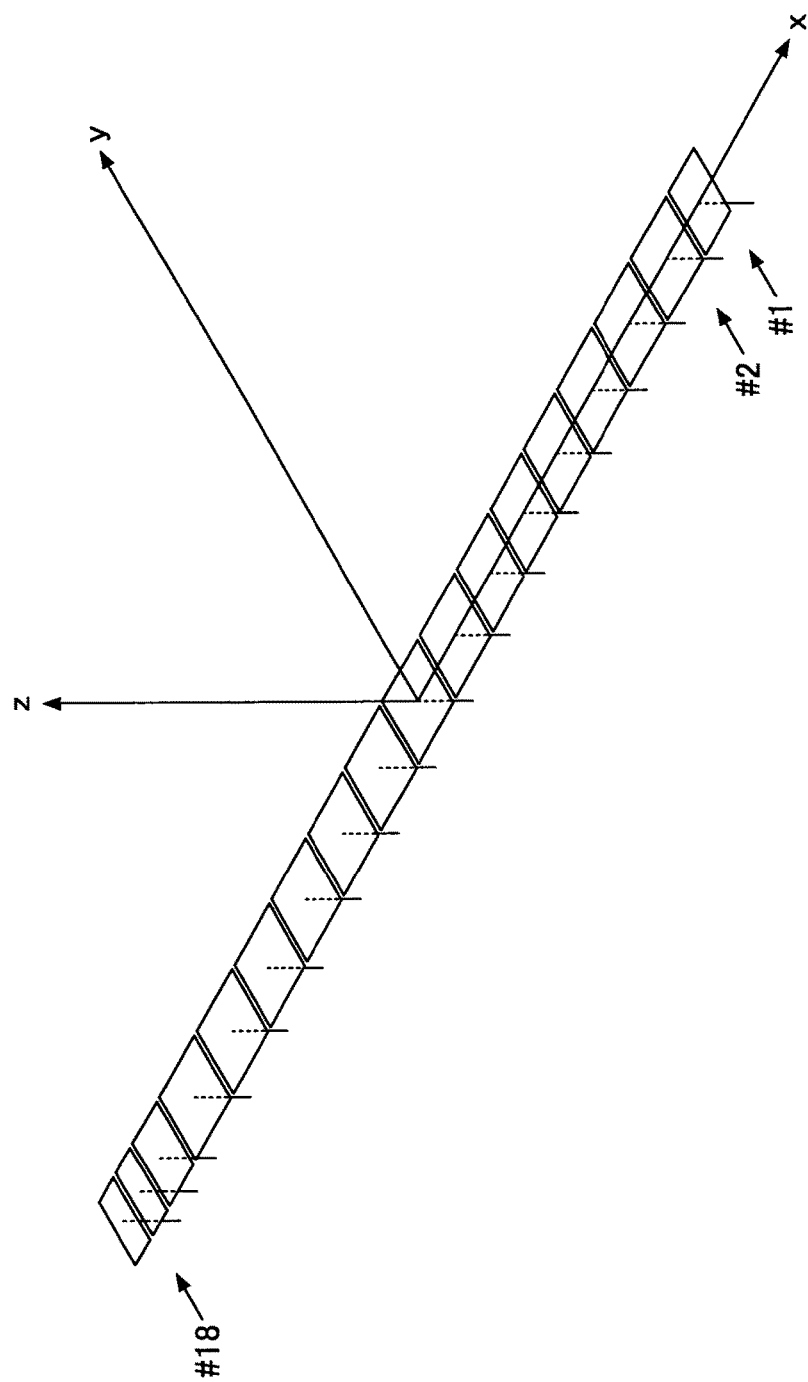
FIG. 16A is a diagram showing one sequence of the element array, which is used for a case in which the element spacing is a distance between vias.

(4.1) FIG. 16A shows one sequence of the element array which is used for the case in which the element spacing is the distance $\Delta_V$ between the vias. Such element arrays are also arrange in the y-axis direction, and thereby the reflectarray is formed. In general, the total length of one sequence which extends in the x-axis direction is 37.86 mm, and the length in the y-axis direction (the width of the sequence) is 2.25 mm. The one sequence of the element array includes 18 elements.

Figure 16B:
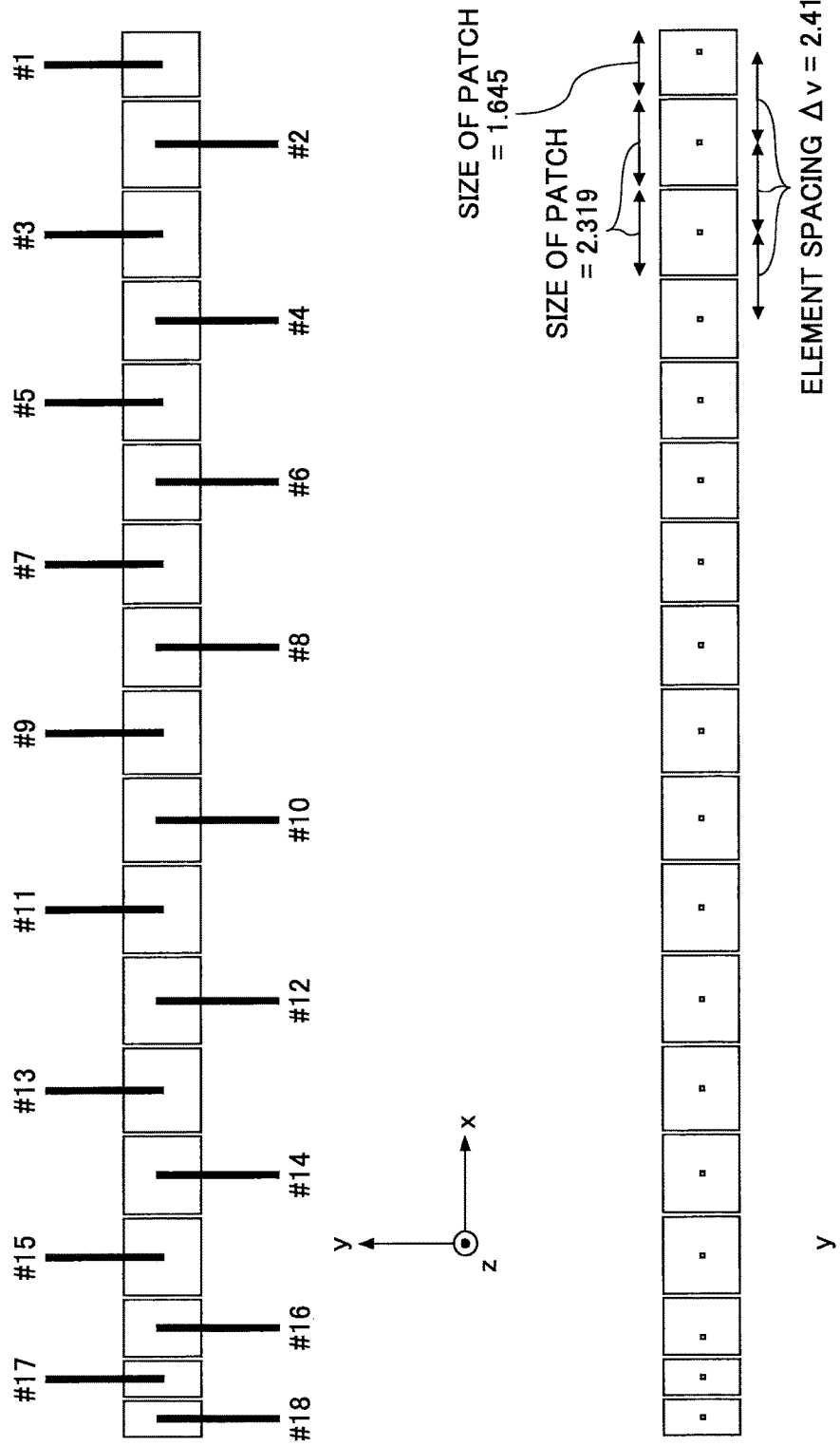
FIG. 16B is a diagram showing 18 elements included in the element array together with element numbers and positions of the vias.

FIG. 16B shows these 18 elements. The upper row indicates the element numbers of the corresponding elements, and the lower row indicates the patch together with the position of the via for each of the elements. A specific size of the patch and the element spacing of each of the elements are indicated in FIG. 16C.

Figure 17A:
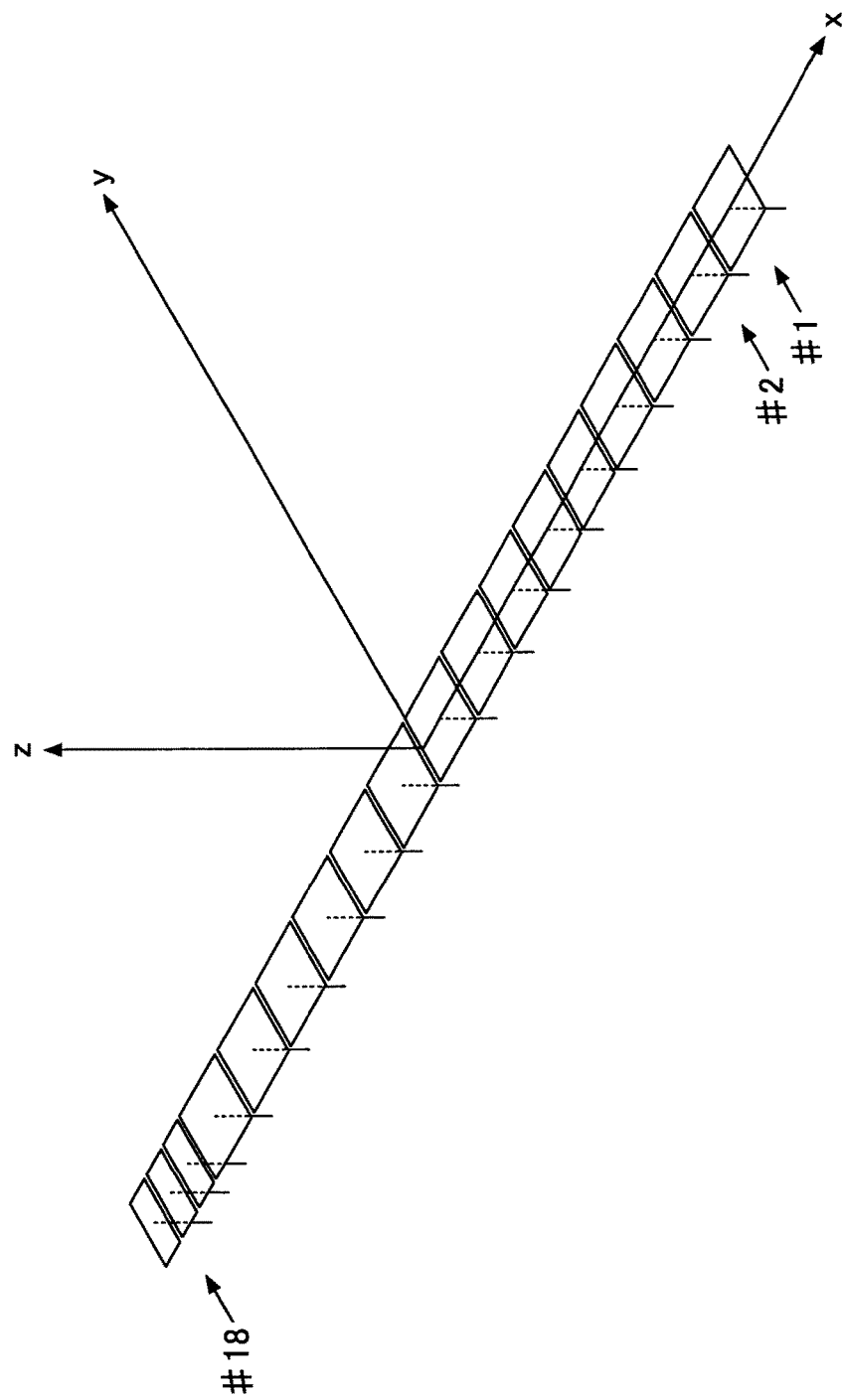
FIG. 17A is a diagram showing one sequence of the element array, which is used for a case in which the element spacing is the distance between gaps.

(4.2) FIG. 17A shows one sequence of the element array which is used for the case in which the element spacing is the distance between the gaps $\Delta_P$. Such element arrays are also arranged in the y-axis direction, and thereby the reflectarray is formed. In general, the total length of one sequence which is extended in the x-axis direction is 37.86 mm, and the length in the y-axis (the width of the sequence) is 2.25 mm. The one sequence of the element array includes 18 elements.

Figure 17B:
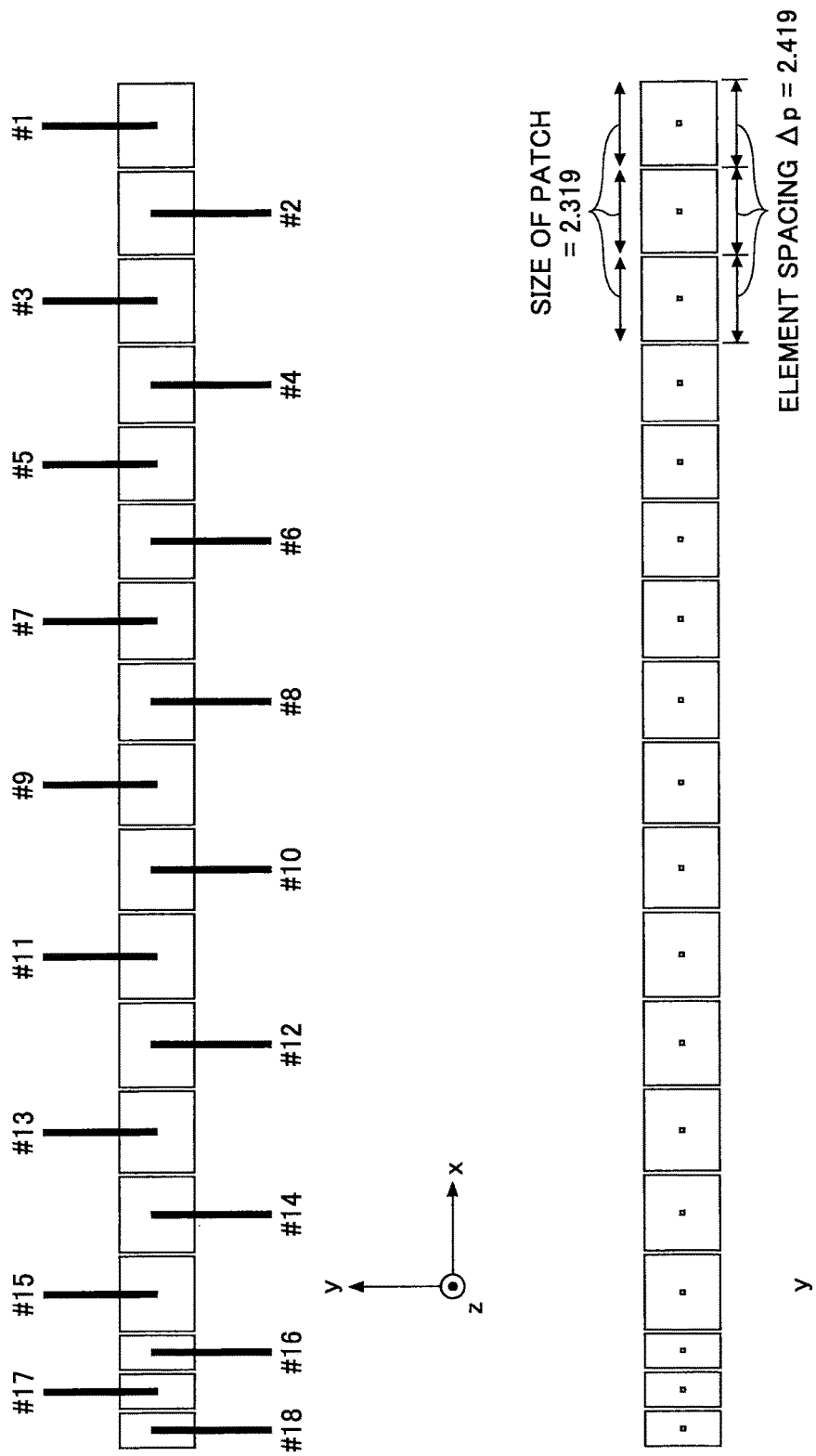
FIG. 17B is a diagram showing 18 elements included in the element array together with the element numbers and the positions of the vias.

FIG. 17B shows these 18 elements. The upper row indicates element number of the corresponding elements, and the lower row indicates the patch together with the position of the via for each of the elements. The specific size of the patch and the element spacing of each of the elements are shown in FIG. 17C.

(5) As explained while referring to FIGS. 9B-9D, the reflection characteristic of the reflectarray can be improved by considering that the reflection phase is achieved at the center of the gap between the neighboring elements, and by determining the element spacing while optimizing the element space for each of the elements ($dvp_i \rightarrow dv_i$). Hereinafter, the simulation result of this improved example is shown.

Figure 9E:
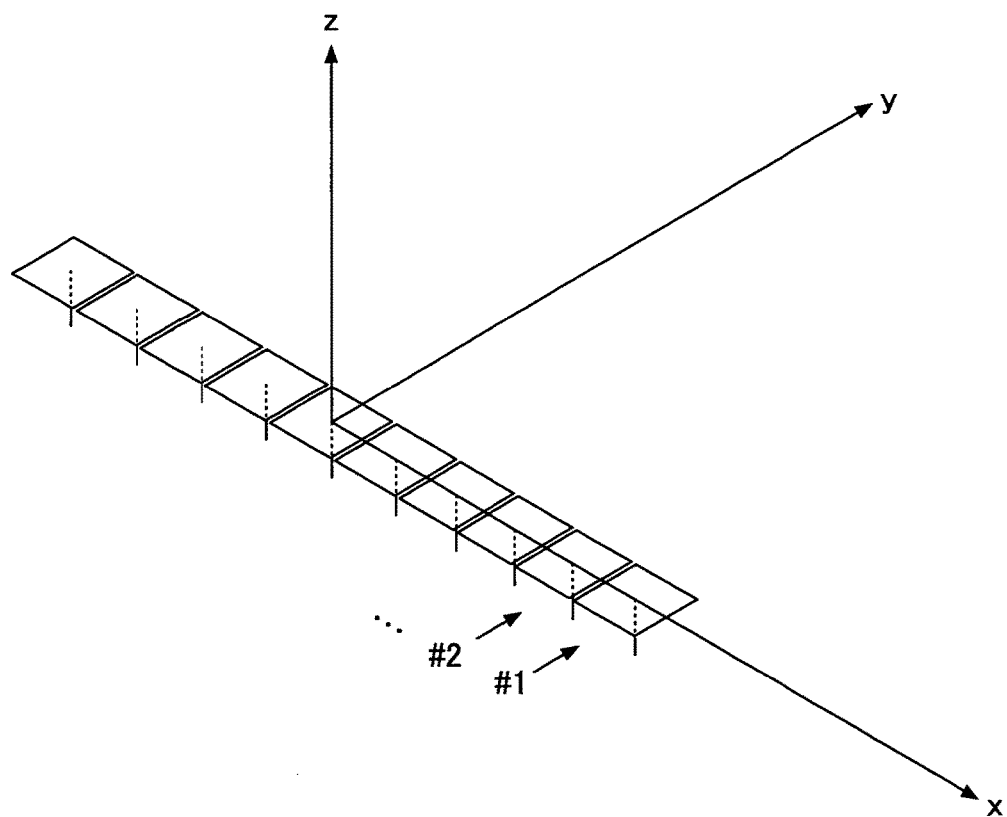
FIG. 9E is a diagram showing one sequence of an element array which is used for a simulation.

FIG. 9E shows one sequence of the element array which is used in the simulation. Many element arrays such as shown in FIG. 9E are arranged in the x-axis direction and in the y-axis direction. Ten elements which are designed by the method according to the improved example form one sequence of the element array. The element spacing and the reflection phase of each of the ten elements are as shown in FIG. 9F. Further, for comparison, simulation is also performed for the design example according to the method of the conventional example. For the conventional example, 11 elements form one sequence of the element array. Here, the "conventional example" is a preceding technique relative to the improved example which is shown in FIG. 9C. Note that the "conventional example" is not necessarily the technique which has been known prior to filing the present application. For the conventional example which is assumed for the simulation, for determining the reflection phase and the element spacing corresponding to the reflection phase, the element spacing is determined without optimizing the element spacing. Namely, the design according to the conventional example is made by repeatedly determining one reflection phase, and determining the element spacing corresponding to the reflection phase. Thus, as shown in FIG. 9B, the reflection phases which are achieved by the corresponding 11 elements are somewhat shifted from the intended reflection phases.

Figure 9H:
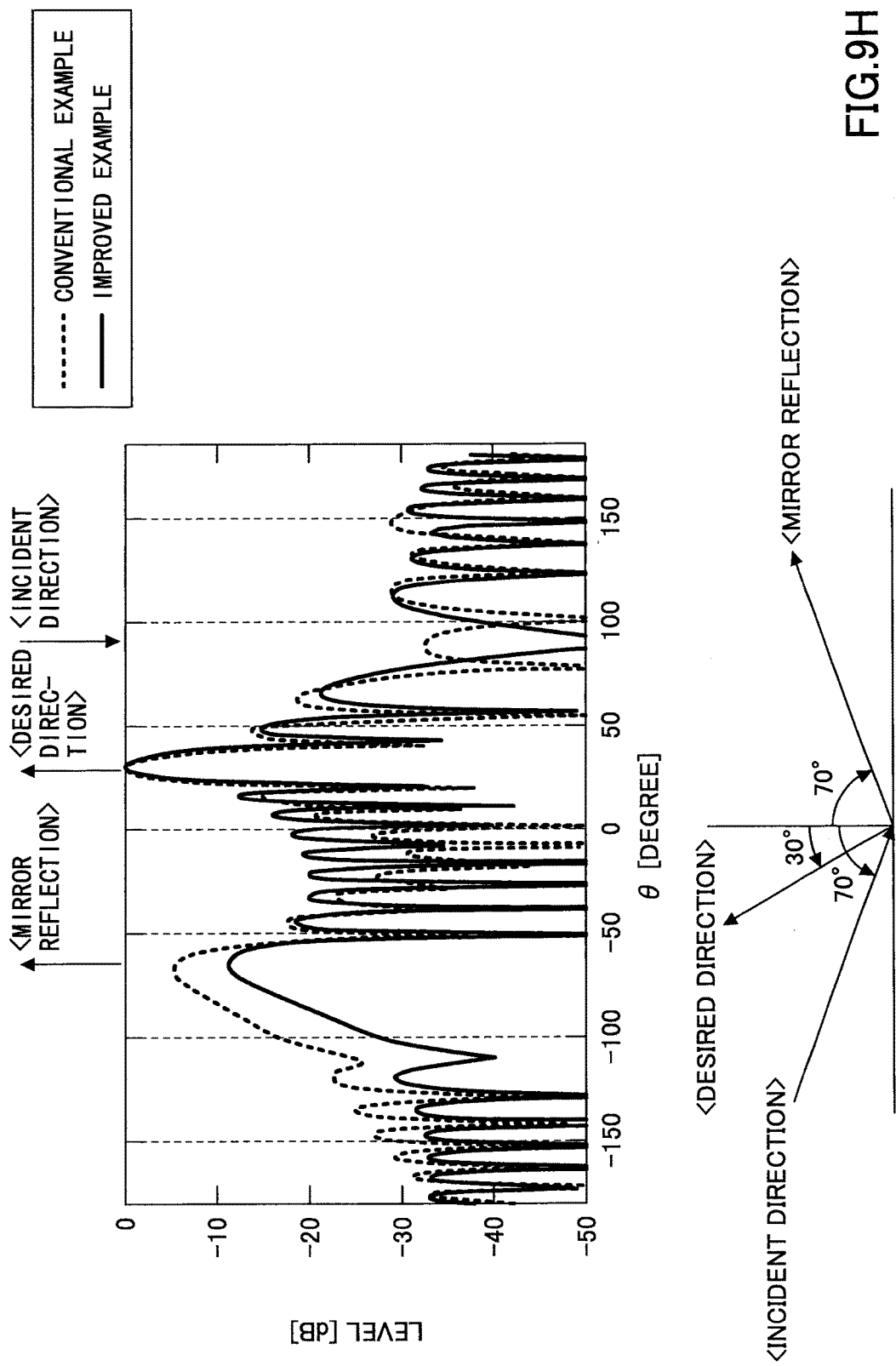
FIG. 9H is a diagram showing a scattering cross section of the radio wave for the improved example and for the conventional example.

FIG. 9H shows the scattering cross section of the radio wave with respect to the reflectarrays which are designed according to the improved example and the conventional example, respectively. For both the improved example and the conventional example, the reflectarray is designed so that the incident angle is 70 degrees ($\theta_i$=70 degrees) and the reflection angle of the desired direction is −30 degrees ($\theta_r$=−30 degrees). Here, the incident angle $\theta_i$ and the reflection angle $\theta_r$ are defined as arguments relative to the horizontal direction (specifically, the z-axis direction). However, note that the plus direction of the angle is reversed for the incident angle $\theta_i$ and the reflection angle $\theta_r$. As depicted, both the reflectarray according to the conventional example and the reflectarray according to the improved example form the strongest reflection in the desired direction (−30 degrees). Both the conventional example and the improved example are superior in a point that they differentiate the desired direction and the mirror reflection direction of the reflected wave. However, by comparing the levels in the mirror reflection direction (−70 degrees), it is found that, in the improved example, since suitable reflection phases are achieved by the corresponding elements, the improved example can suppress the unnecessary mirror reflected wave to be smaller compared to the conventional example, in which the suitable reflection phases are not necessarily achieved.

2. Modified Example

In the above-described "1. A preferred embodiment," all the three characteristics are used, which are the characteristic that the radio wave obliquely enters, the characteristic that the graph which demonstrates the two resonance characteristic is used, and the characteristic that the element spacing is adjusted. However, that is the best configuration, and it is not required to use all the three characteristics. Any one or more of the three characteristics may be used.

<<2.1 A Modified Example which Utilizes the Oblique Incidence>>

For example, when the radio wave enters with an angle other than 0 degrees with respect to the z-axis, the relationship between the reflection phase and the element spacing may indicate a characteristic other then the two resonance characteristic. Further, it is not required that the reflection phase is represented by the function of the element spacing, and the reflection phase may be represented by a function of another parameter. For example, the reflection phase may be represented by a function of the sizes of the patches of the corresponding elements, or it may be represented by a function of the size of the space (gap) between the patches of the neighboring elements. However, from the perspective of expanding the range of the achievable reflection phase, similar to the case of "1. A preferred embodiment," it is preferable to select the design parameters so that the reflection phase is a continuously varying function with respect to the element spacing, and that two resonant points (the element spacing with which the resonance occurs) exist at which the reflection phase is zero (so that it demonstrates the two resonance characteristic).

By using the characteristic such that, with respect to the oblique incidence, when the incident angles are different, the reflected waves are emitted in different directions, a reflectarray is obtained which controls the reflection direction of the radio wave. In general, when the angle formed by the reflected wave relative to the mirror reflection direction of the incident wave is denoted by a control angle A, the following expression is satisfied among the incident angle $\theta_i$, the reflection angle $\theta_r$, and the control angle A.

$$\theta_r = \arcsin[\sin(\theta_i) + \sin(A)]$$

Figure 22:
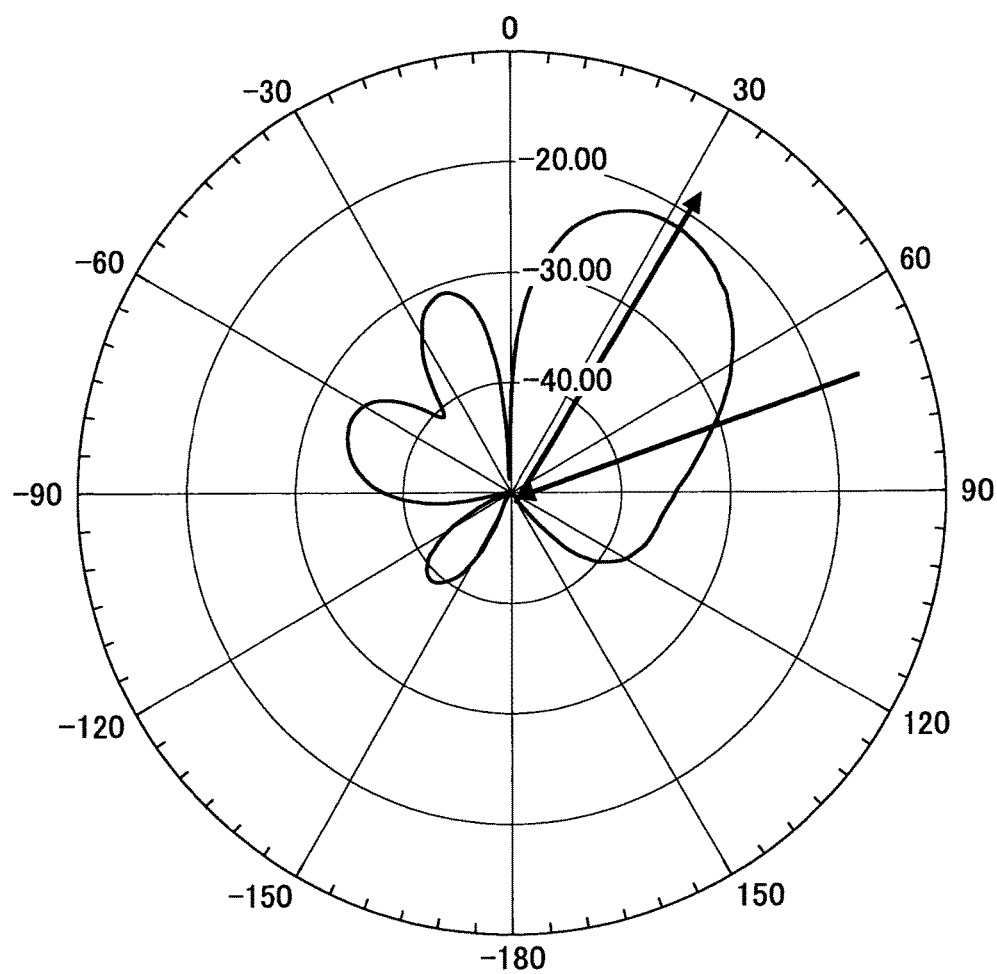
FIG. 22 is a diagram showing the far radiation field for a case in which a control angle is 100 degrees.
Figure 23:
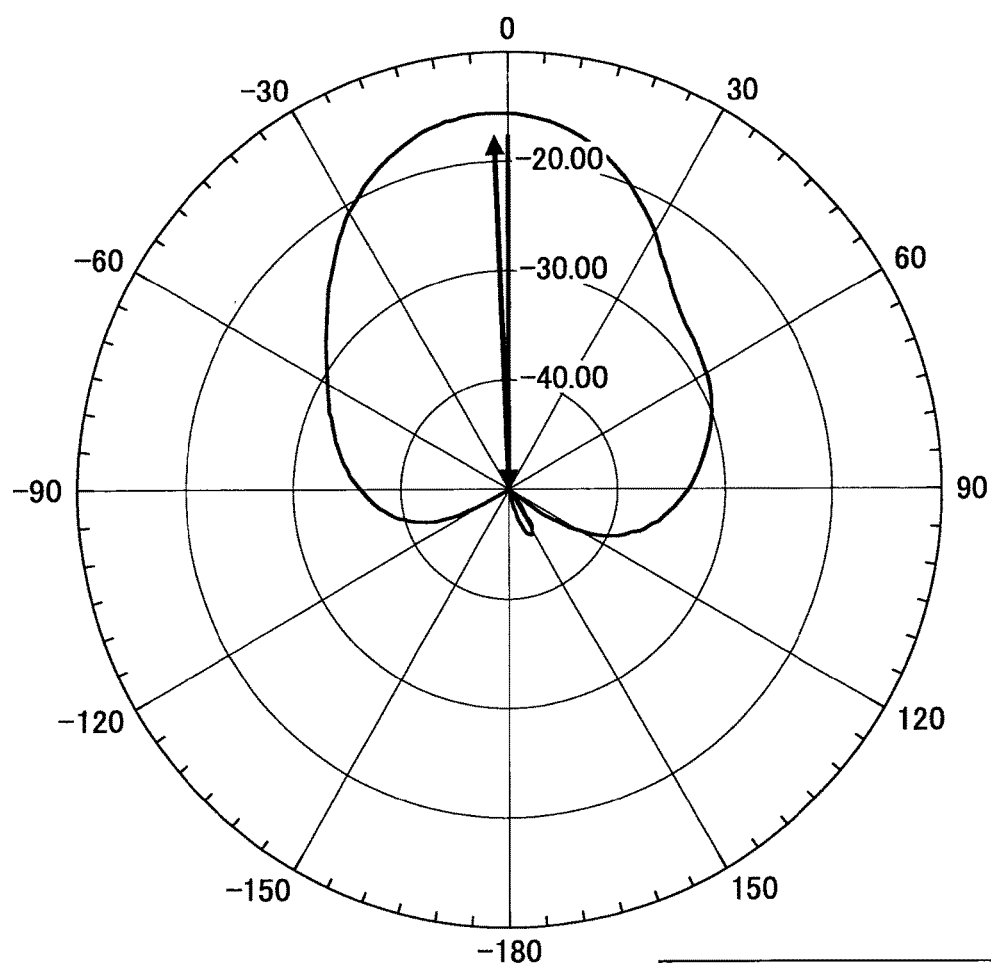
FIG. 23 is a diagram showing the far radiation field for a case in which the control angle is 0 degrees.

Here, arcsin(.) is the inverse function of the sine function $\sin^{-1}(.)$. For example, if the incident angle $\theta_i$=70 degrees, and the reflection angle $\theta_r$=−30 degrees, the control angle A is 70−(−30)=100 degrees. FIG. 22 shows a far radiation field of the radio wave when the control angle A=100 degrees. FIG. 23 shows a far radiation field of the radio wave when the control angle A=0 degrees. Namely, for the case of this reflectarray, the control angle of the reflected wave which operates for the phase with respect to the obliquely entered radio wave and the control angle of the reflected wave which operates for the phase with respect to the front incident wave are different. For the case of this example, the single reflectarray can handle the case in which the reflected wave is formed in the mirror reflection direction (A=0 degrees) and the case in which the reflected wave is formed in a direction other then the mirror reflection direction (A=70 degrees). Further, by suitably selecting the design parameters, the direction of the reflected wave with respect to the obliquely entered wave and the direction of the reflected wave with respect to the front incident wave are directed to the same direction.

<<2.2 A Modified Example which Utilizes the Two Resonance Characteristic>>

Even if the incident angle of the radio wave is 0 degrees, the relationship between the reflected phase and the element spacing may demonstrate the two resonance characteristic. By intentionally using the combination of the parameters which causes such a two resonance characteristic, the range of the value, which can be taken as the reflection phase, can be enlarged.

<<2.3 A Modified Example in which the Element Spacing is Adjusted>>

Further, by adjusting the element spacing while maintaining the gap between the patches of the elements to be constant, the characteristic of determining the reflection phase can be independently utilized. Namely, when the radio wave enters from the direction of 0 degrees, and the relationship between the reflection phase and the element spacing is the relationship such as shown in FIG. 6, it is meaningful to adjust the element spacing while maintaining the gap between the patches to be constant. For example, since the value of the gap is maintained to be constant, it is not necessary to form an extremely narrow gap, and achievable elements can be increased.

Specific numerical examples are shown below. The values of the parameters other than the element spacing that can be set in advance are as follows.

Incident angle $\theta_i$=0 degrees;
the desired reflection angle $\theta_r$=40 degrees;
the relative dielectric constant of the dielectric substrate $\in_r$=10.2;
the thickness of the dielectric substrate (the length of the via) t=1 mm;
the tan δ of the dielectric substrate=0.0023;
the gap between the patches g=0.1 mm;
the diameter of the via dv=0.1 mm; and
the frequency of the radio wave f=11 GHz (the wavelength λ=27.3 mm).

In this case, the relationship that holds between the reflection phase and the element spacing is indicated by the graph such as shown in FIG. 6. As described above, the element spacing may be defined to be the distance $\Delta_V$ between vias, or it may be defined to the distance $\Delta_P$ between the centers of the gaps. It is possible to design the reflectarray by any of the definitions. However, it is found by the simulation that there is slight difference in performance.

Figure 18A:
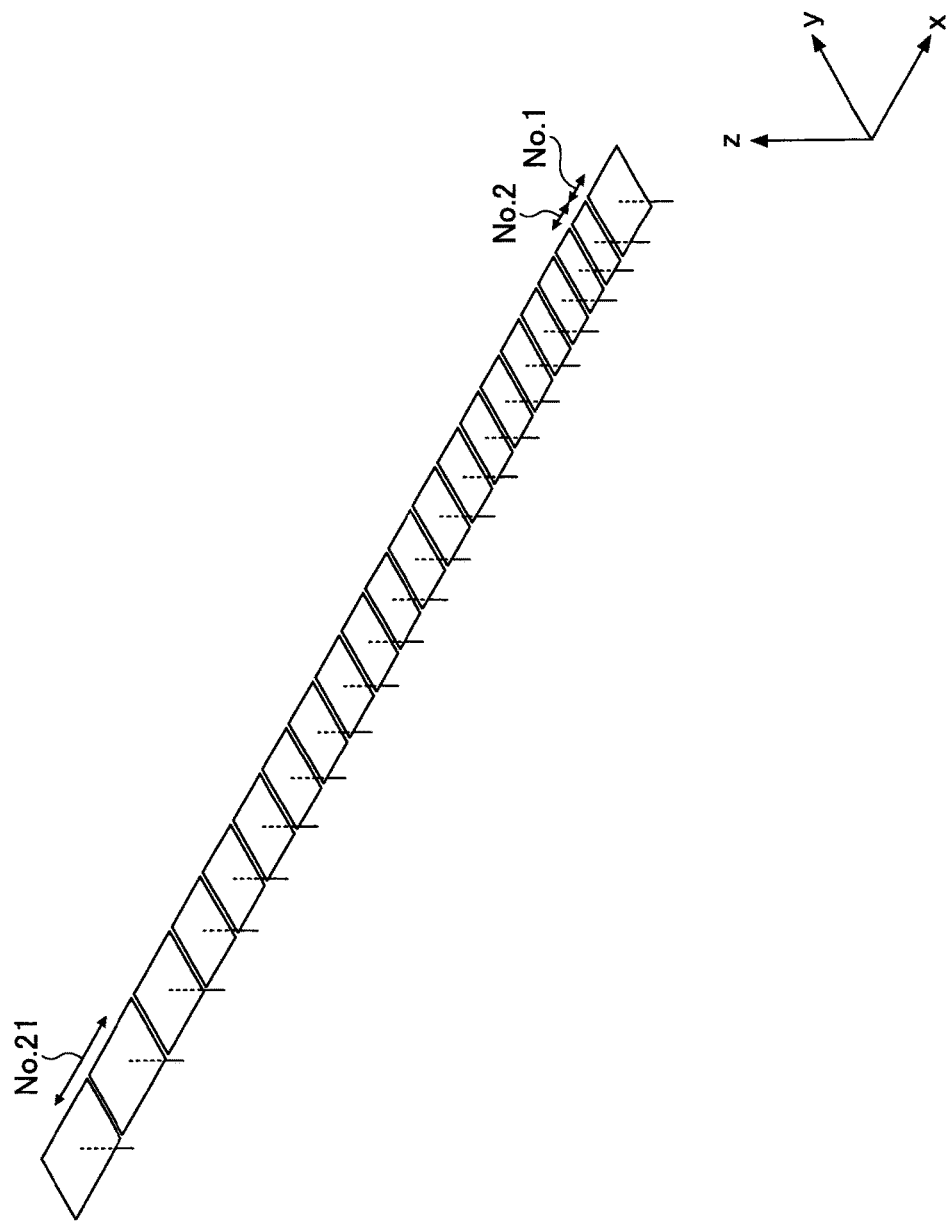
FIG. 18A is a diagram showing one sequence of the element array, which is used for a case in which the element spacing is the distance between the vias.

FIG. 18A shows one sequence of the element array which is used in the case where the element spacing is the distance between the vias. Such element arrays are also arranged in the y-axis direction, and thereby the reflectarray is formed. In general, the total length of the one sequence which extends in the x-axis direction is approximately 43 mm, and the length in the y-axis direction (the width of the sequence) is 2.25 mm. The one sequence of the element array includes 22 elements.

Figure 18B:
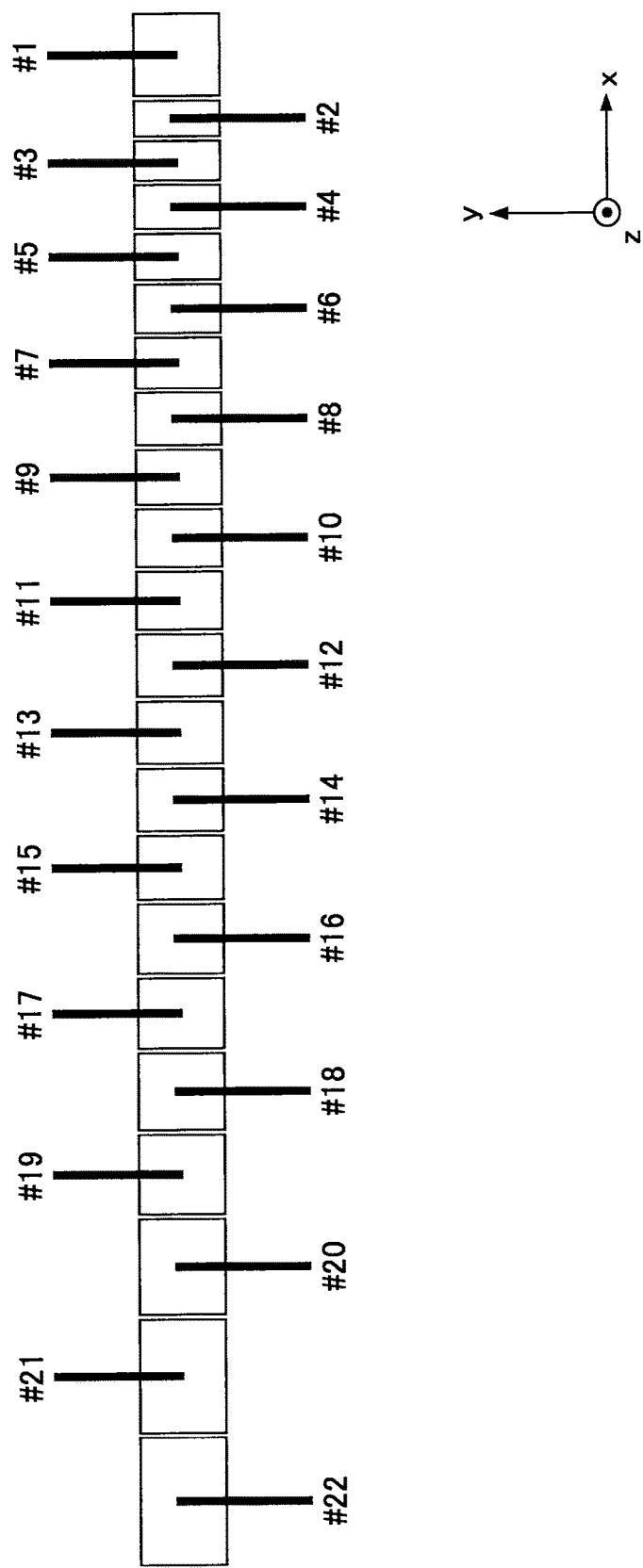
FIG. 18B is a diagram showing 22 elements which are arranged along the x-axis together with element numbers.
Figure 18C:
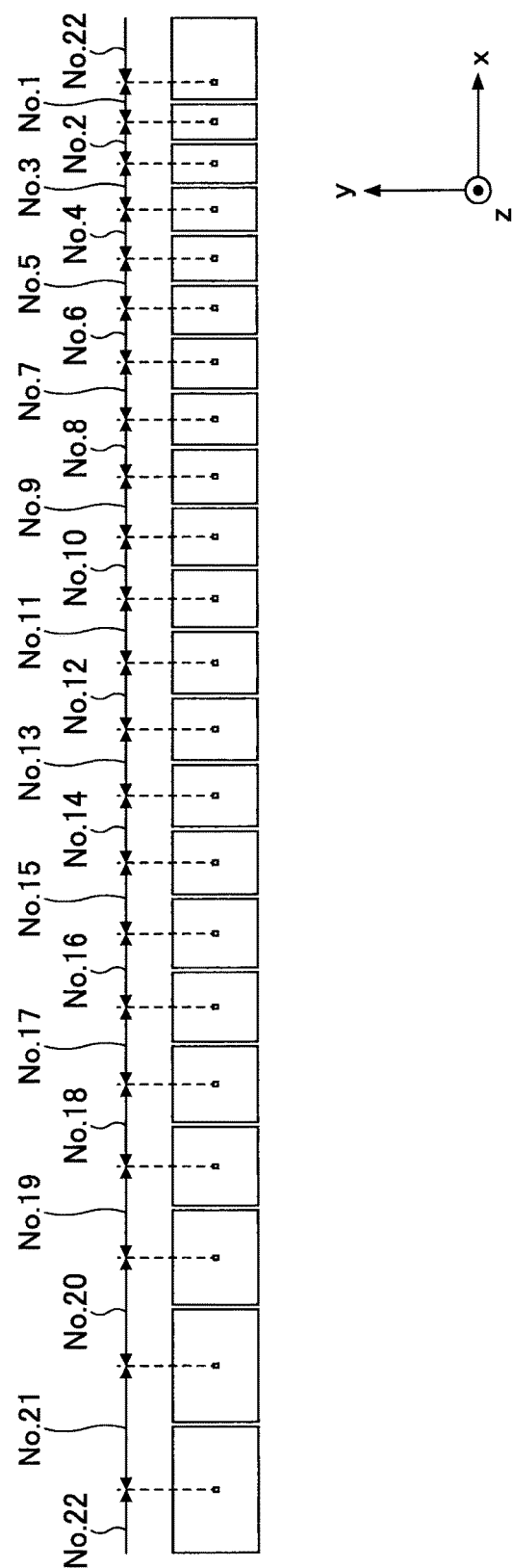
FIG. 18C is a diagram showing that the distance between the vias is used as the element spacing together with distance numbers.

FIG. 18B shows 22 elements which are arranged in line in the x-axis direction. For convenience, labels from #1 to #22 are attached to the corresponding elements. FIG. 18C shows that the distance between the vias is the element spacing for each of the 22 elements which are shown in FIGS. 18A and 18B. For convenience, the labels from No. 1 to No. 22 are attached to the element spacing. Note that No. 22 is the total of the distance of the left end and the distance of the right end. FIG. 18D shows specific sizes of the patches of the corresponding elements and the element spacing.

Figure 19:
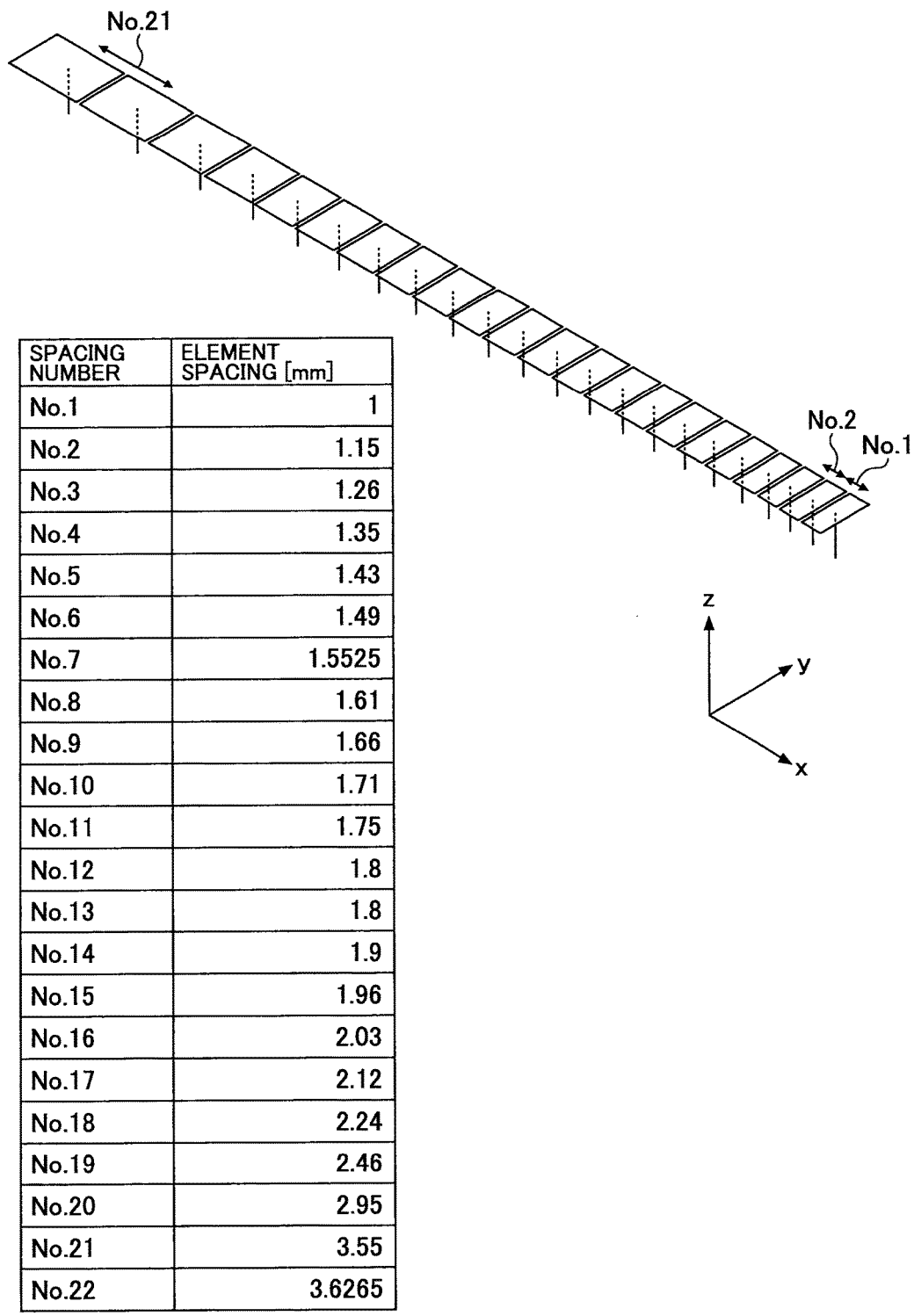
FIG. 19 is a diagram showing one sequence of the element array which is used for a case in which the element spacing is the distance between the gaps, and the element spacing.

FIG. 19 shows one sequence of the element array which is used for the case in which the element spacing is the distance between the gaps. Such element arrays are also arranged in the y-axis direction, and thereby the reflectarray is formed. In general, the total length of one sequence which extends in the x-axis direction is approximately 43 mm, and the length in the y-axis direction (the width of the sequence) is 2.25 mm. The one sequence of the element array includes 22 elements.

Figure 20:
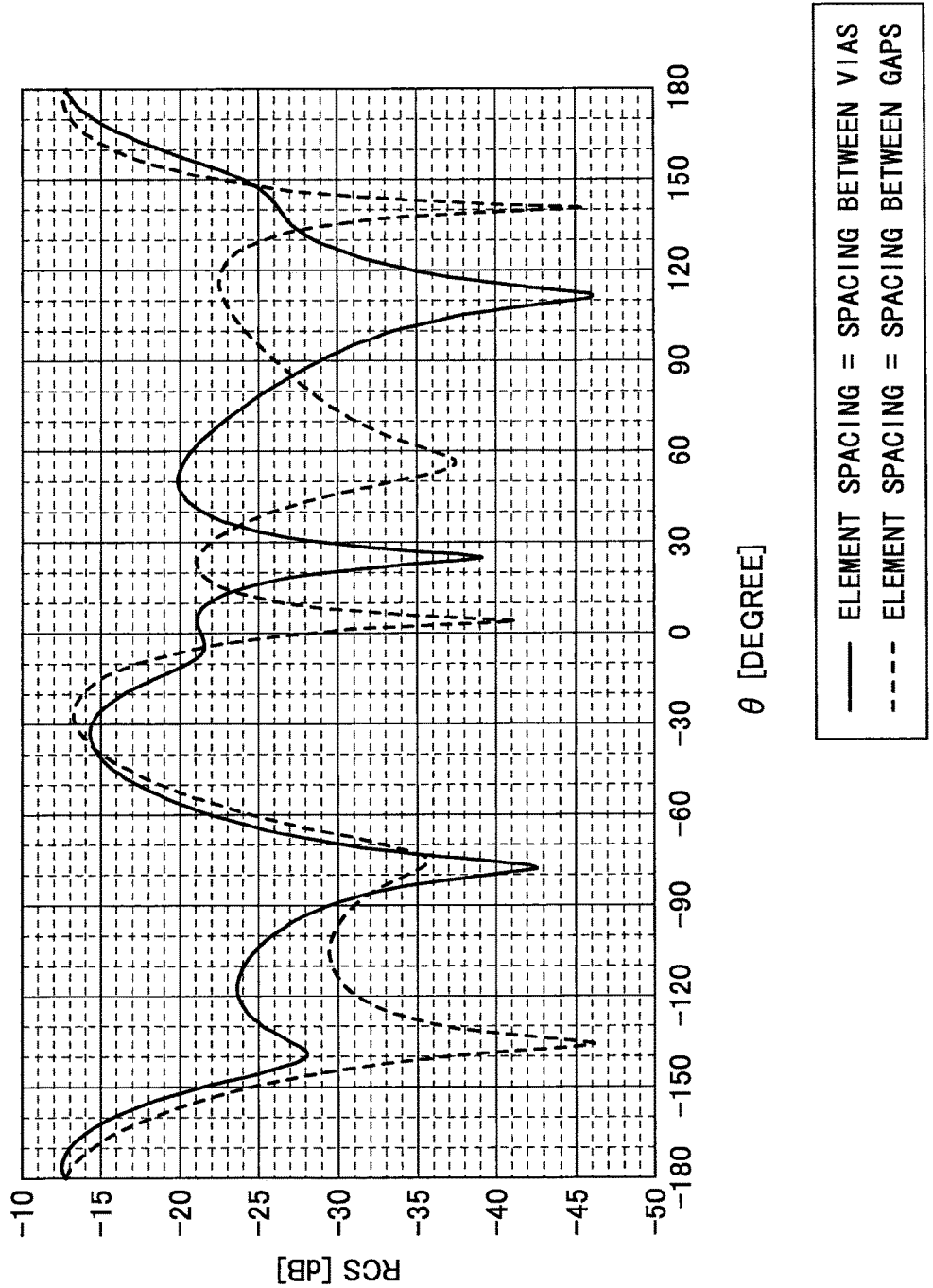
FIG. 20 is a diagram showing the scattering cross section (a solid line) for a case in which the element spacing is the distance between the vias, and the scattering cross section (a dashed line) for a case in which the element spacing is the distance between the gaps.

FIG. 20 shows a comparative example between the scattering cross section (the solid line) for the case in which the reflectarray is designed while assuming that the element spacing is the distance between the vias, and the scattering cross section (the dashed line) for the case in which the reflectarray is designed while assuming that the element spacing is the distance between the gaps. The reflectarray which is designed while assuming that the element spacing is the distance between the vias is shown in FIGS. 18A-18D. The reflectarray which is designed while assuming that the element spacing is the distance between the gaps is shown in FIG. 19. In either cases, the size of the reflectarray is approximately 42 mm×43 mm. The horizontal axis shows an argument θ relative to the z-axis in the polar coordinate system. Thus, the reflection angle of $\theta_r$=+40 degrees corresponds to the argument of θ=−40 degrees. In both graphs, large values are obtained in θ=40 degrees, which is the desired direction of the reflection angle. Thus, by using any of the definitions of the element spacing, a superior reflection characteristic can be obtained. In both graphs, peaks are indicated in the vicinity of θ=−40 degrees. However, the position of the peak of the solid line graph is closer to the desired direction of θ=−40 degrees, compared to the position of the peak of the dashed line graph. This implies that the one which is designed by assuming that the element spacing is the distance between the vias demonstrates the better reflection characteristic. The element spacing may be defined to be the distance between the vias, or the element spacing may be defined to be the distance between the gaps. However, from the viewpoint of obtaining a better reflection characteristic, it is preferable that the design be made while assuming that the element spacing is the distance between the vias.

According to the configuration of the present invention which is described above, a reflectarray can be achieved in which the phases between the elements can be changed by varying the element spacing, while maintaining the value of the space (gap) between the elements, which forms the mushrooms. Therefore, according to the configuration of the present invention, the capacitance of all the elements included in the reflectarray can be simultaneously changed to the same value by simultaneously changing all the gaps, which are constant values. Further, by simultaneously changing the height of all the mushrooms, the capacitance of all the elements included in the reflectarray can be simultaneously changed to the same value. According to the LC resonant circuit theory, the resonant frequency of the mushroom element is determined by the inductance L and the capacitance C. According to the present invention, it is possible to achieve the reflectarray in which the inductance L and the capacitance C can be simultaneously changed.

Figure 34:
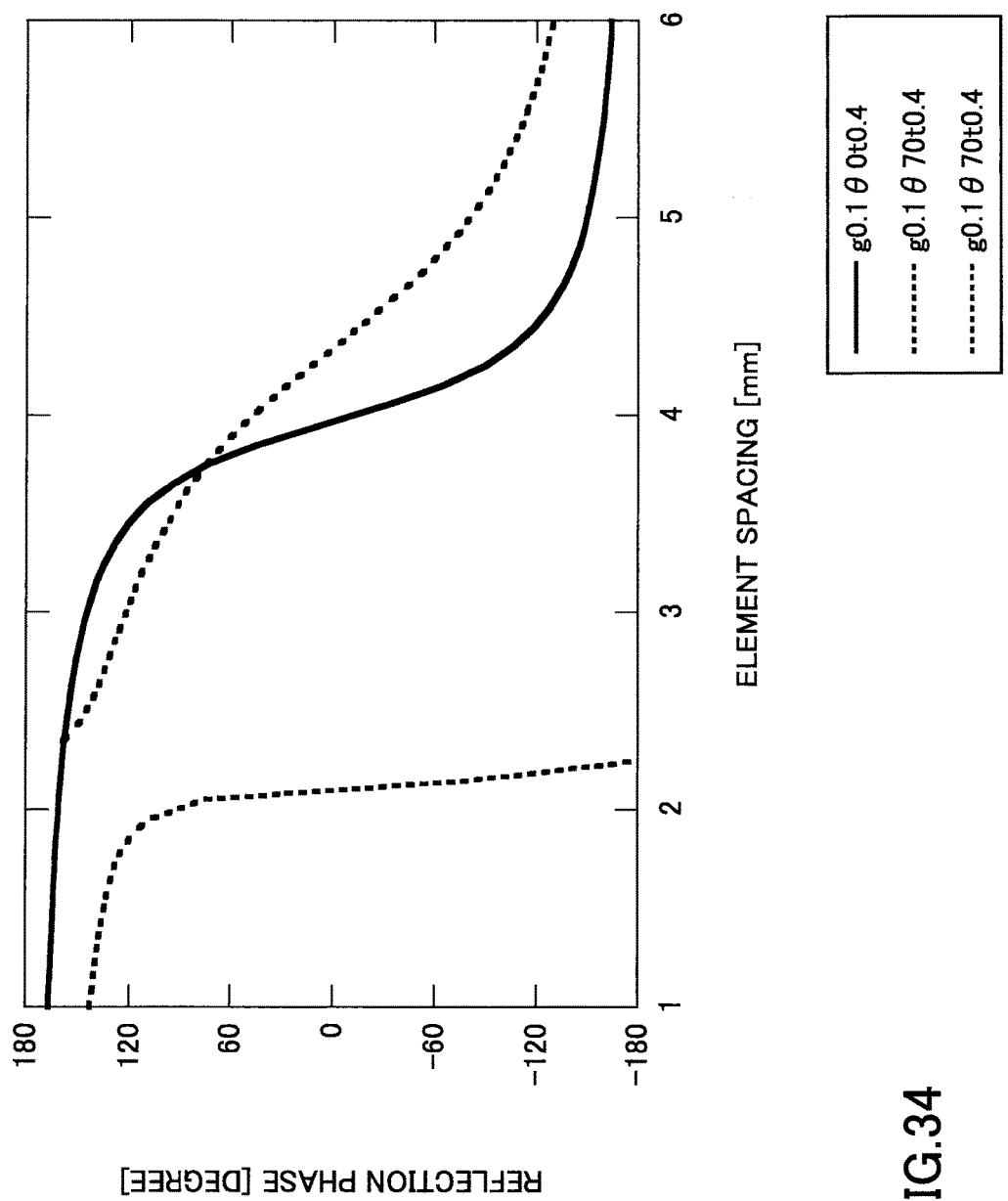
FIG. 34 is a diagram showing a relationship between the element spacing and the reflection phase.

Next, as an example of the present invention, it is shown that by setting the element spacing to be the parameter, the range of the reflection phase can be enlarged for the front incidence. FIG. 34 shows the reflection phase for the mushroom-like structure for which the relative dielectric constant $\in_r$ is 10.2 and the thickness t is 0.4 mm. In FIG. 34, the solid line indicates the reflection phase for the perpendicular incidence where the incident angle θ=0 degrees, and the dashed line indicates the reflection phase for the oblique incidence where the incident angle θ=70 degrees. For the case of the oblique incidence, since the reflection phase is changed from 0 degrees to 0 degrees by changing the element distance, any phase of 360 degrees can be achieved. Further, for the case of the front incidence, the two resonance does not occur, but a broad range of the reflection phase from approximately 170 degrees to −170 degrees, which is almost 360 degrees, can be achieved. Namely, by setting the element spacing as a parameter, a broad range of reflection phase, which is equivalent to that of the conventional multi-layer method, can be achieved.

<<2.4 A Further Modified Example>>

Figure 24:
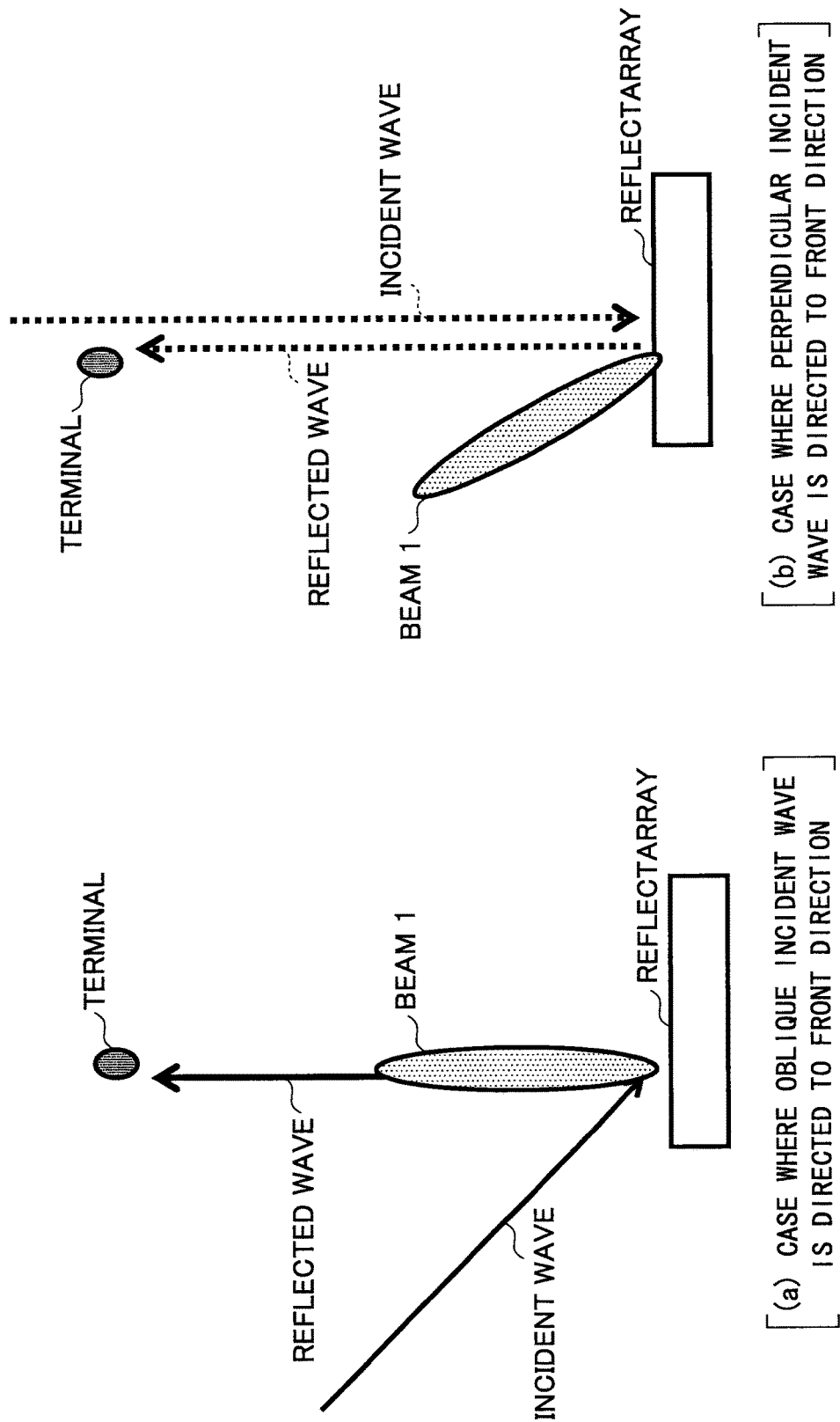
FIG. 24 is a diagram showing an example in which the radio wave is reflected by using a single-beam reflectarray.
Figure 25:
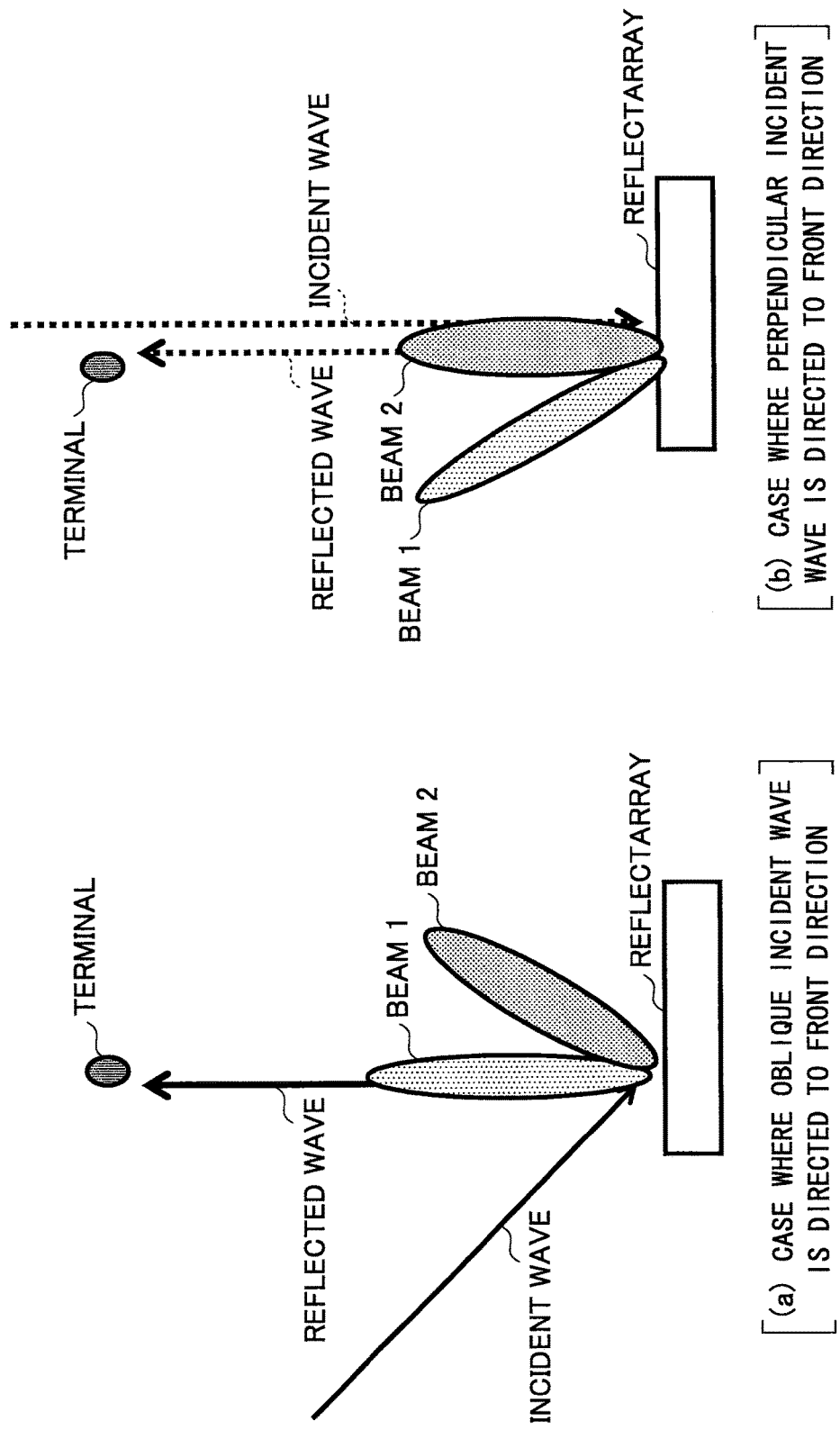
FIG. 25 is a diagram showing an example in which the radio wave is reflected by using a multi-beam reflectarray.

When the single-beam reflectarray is used, as shown in FIG. 24, with the conventional technique, the beam can be directed to the desired direction for a specific incident wave, but it is not possible to direct the beam to the desired direction for an incident wave from another direction. In order to solve this problem, for example, it is necessary to use a multi-beam reflectarray such as shown in FIG. 25. However, for the case of multi-beams, the reflection (scattering) power is reduced in proportion to the number of the beams. The problem is that a sufficient level may not be ensured. That is because the control angle A of the reflectarray is uniquely determined and the reflection angle $\theta_r$ is determined by $\theta_r = \arcsin[\sin(\theta_i) + \sin(A)]$.

As described above, it is possible to form the reflectarray, so that the control angle of the reflected wave that operate for the phase of the obliquely incident wave and the control angle of the reflected wave that operates for the phase of the front incident wave are different. The graph which is shown in FIG. 22 is the same as the graph of FIG. 12C. It is the result when the radio wave enters the structure of FIG. 12A from $\theta_i = 70$ degrees ($\theta = -70$ degrees in the spherical coordinate system), the radio wave is reflected in the direction of the reflection angle of $\theta_r = -30$ degrees ($\theta = 30$ degrees in the spherical coordinate system). Thus, it is considered that the control angle A by the reflectarray is 100 degrees. In contrast, the graph which is shown in FIG. 23 is the result when the radio wave enters the structure which is the same as that of FIG. 12A from the direction of $\theta = 0$ degrees. Unlike the case in which the direction of the mirror reflection is the reflection angle of $\theta_r = 70$ degrees ($\theta = -70$ degrees in the spherical coordinate system), the radio wave is reflected in the direction of the reflected angle of $\theta = 0$ degrees ($\theta = 0$ degrees in the spherical coordinate system). Thus, it is considered that the control angle A by the reflectarray is 0 degrees. Namely, the reflectarray according to the present invention can vary the control angle A depending on the incident angle. That is because, when $\theta = 0$ degrees, almost no variation occurs in the phase with respect to the variation in the element spacing which is used for the design, it is reflected in the same direction as the direction of the mirror reflection.

For the case of the conventional reflectarray, even if the incident angle $\theta_i$ is varied, the control angle A is constant. Here, the reflection direction $\theta_r$ relative to the oblique incident $\theta_i$ to the reflectarray with the control angle A can be derived as $\theta_r = f(A) = \arcsin[\sin(\theta_i) + \sin(A)]$ (for example, the following document describes this point: The Institute of Electronics, Information and Communication Engineers, 2011 Society Conference B-1-66, "A study on reflection characteristic of the multi-beam reflectarray with respect to oblique incidence": Tamami Maruyama, Jiyun Shen, Yasuhiro Oda, Ngoc Hao Tran, and Hidetoshi Kayama).

When the reflectarray is designed so that the reflection angle becomes $\theta_r = 0$ degrees for the case in which the incident angle of the radio wave is $\theta_i = 70$ degrees, the incident waves which enter from two directions of 70 degrees and 0 degrees can be reflected in the same direction. In this manner, incoming waves from a plurality of incident directions can be directed to the same direction by a single reflectarray. For example, when a terminal exists in the direction in which the radio wave is reflected, it is possible to create an environment in which there are many paths for the terminal, and thereby the MIMO communication of the terminal is facilitated. Namely, it is possible to direct beams from a plurality of incoming directions to a desired direction. Thus, it is possible to ensure the capacity of the line-of-sight MIMO, and to improve the area.

As described above, conventionally, it is difficult to achieve the reflectarray that causes the reflection in the mirror reflection direction (the dashed line) by a single-beam configuration, and the reflectarray that causes the reflection in the direction of the control angle A by a passive structure, as shown in FIG. 24. Thus, as shown in FIG. 25, for example, a multi-beam configuration is prepared, and it is necessary to prepare two beams in advance for the control direction and the mirror reflection direction (the above-described document). However, when the multi-beams are used, it is possible that the power of each of the beams is lowered. According to the present invention, since this is achieved by the single-beam configuration, such a problem does not occur.

Figure 26:
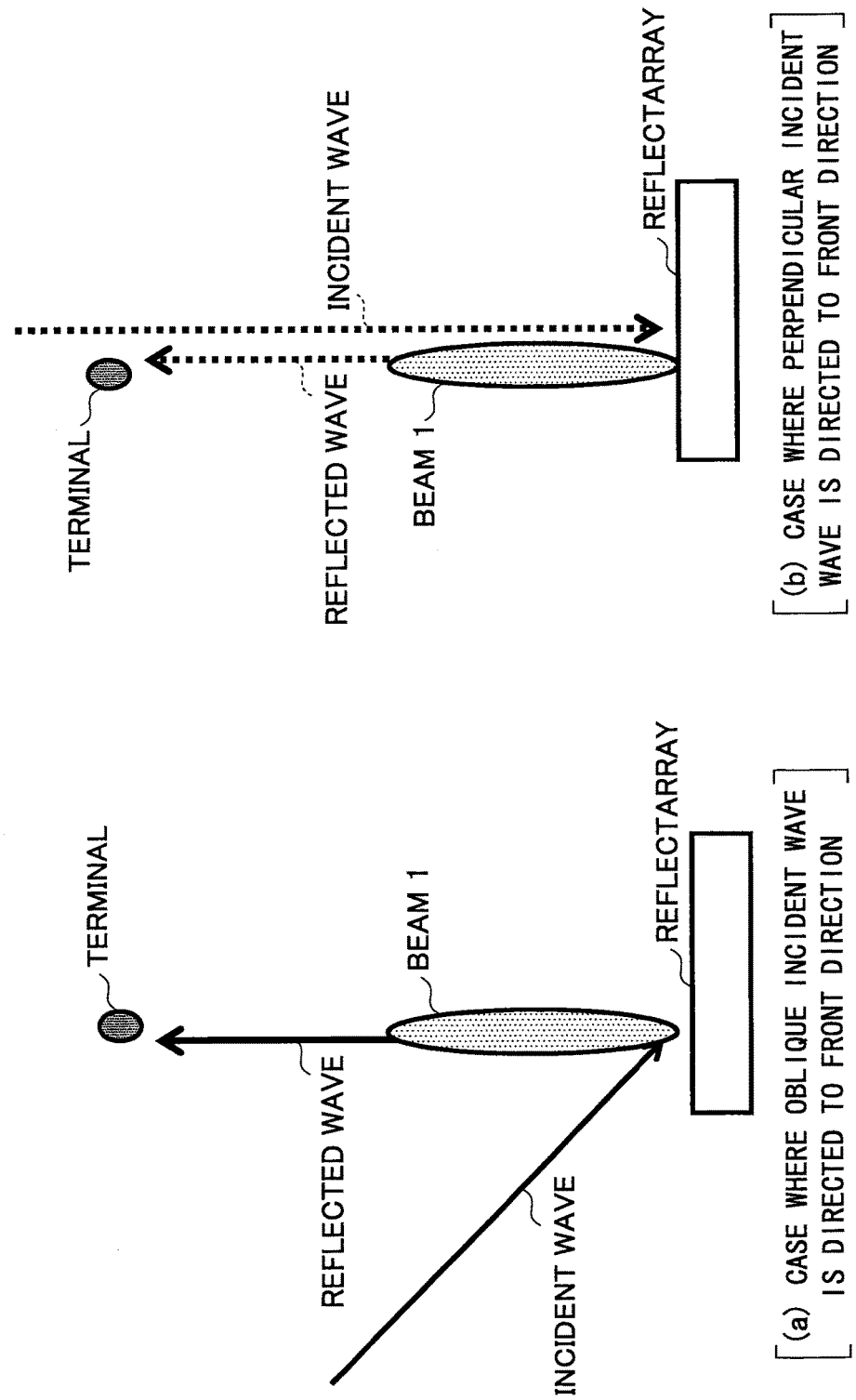
FIG. 26 is a diagram showing the reflectarray according to the present invention.
Figure 27:
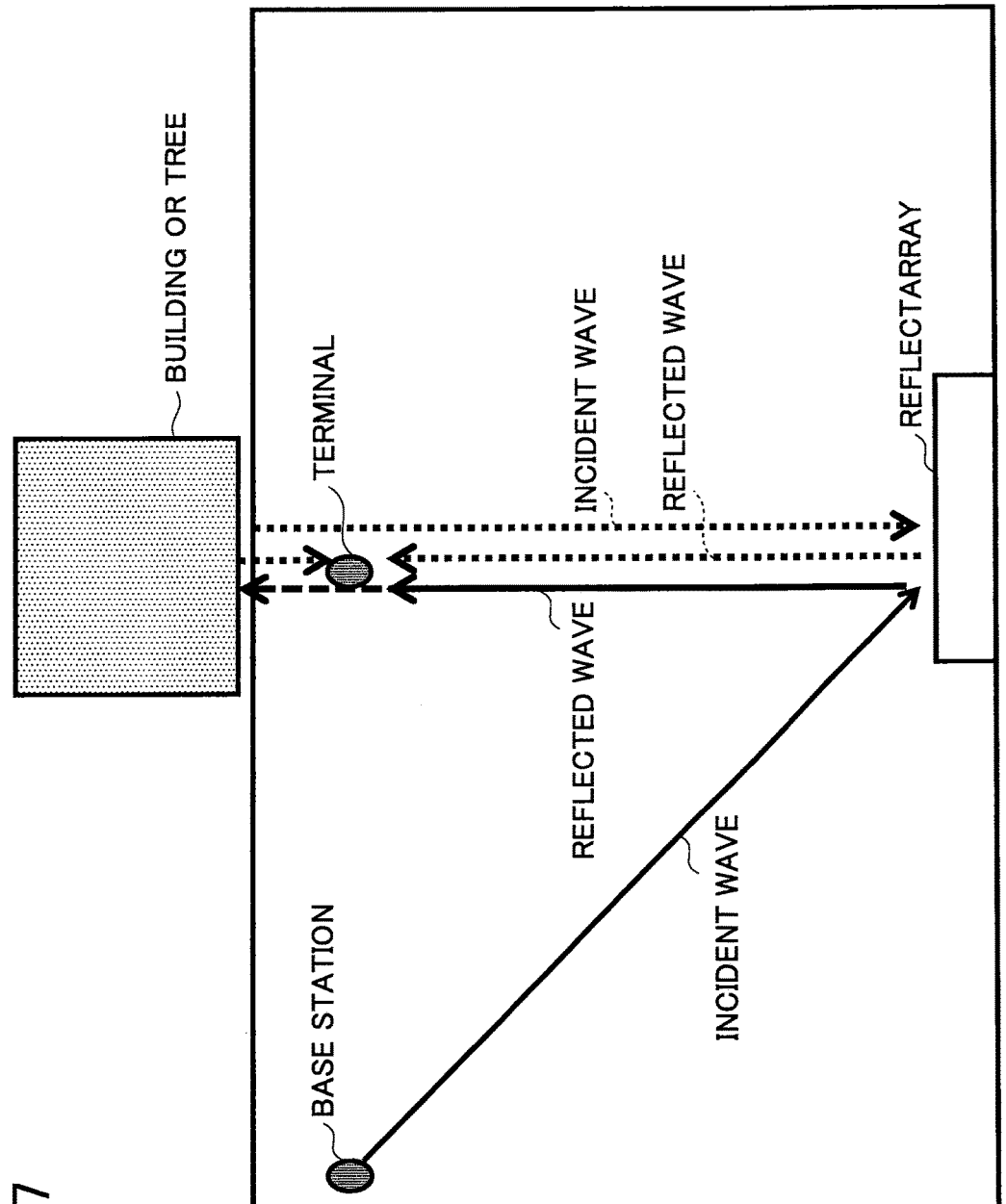
FIG. 27 is a diagram showing the reflectarray according to the present invention.
Figure 28:
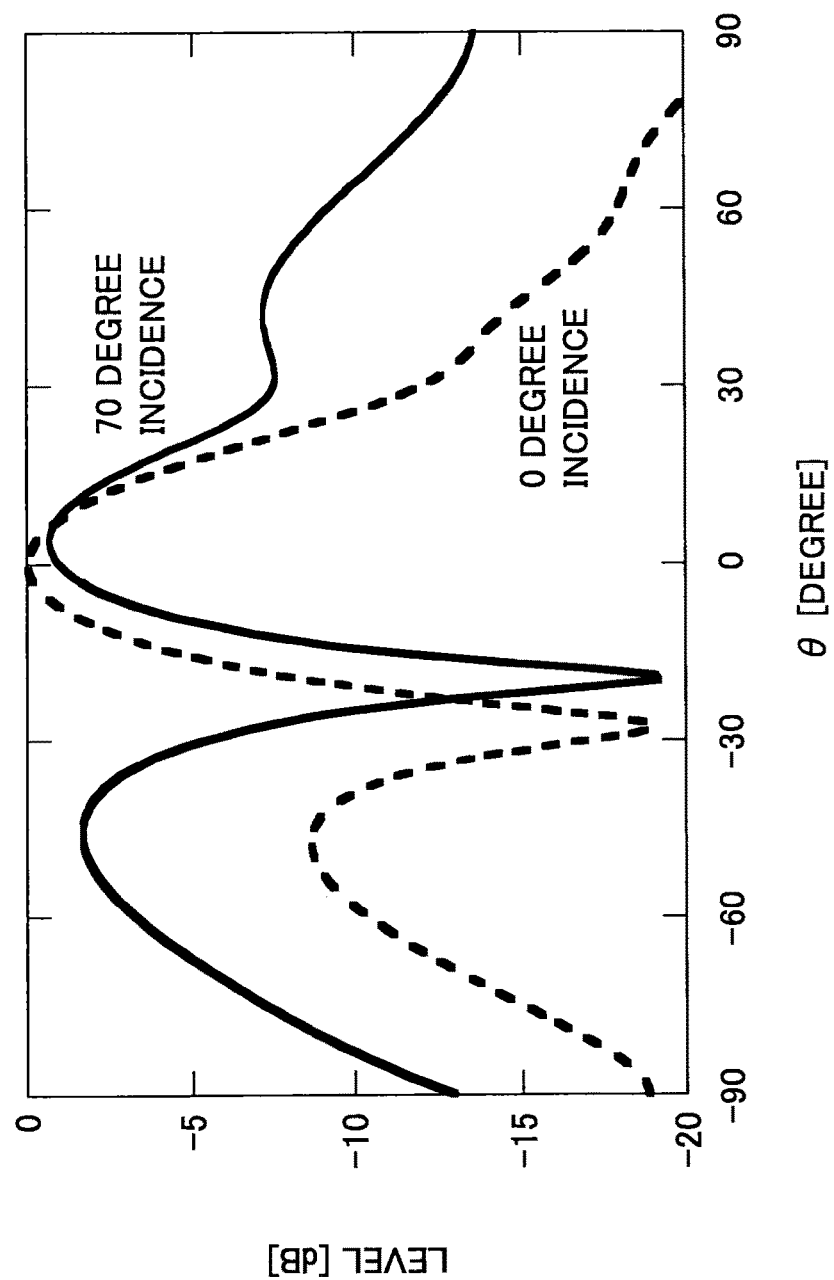
FIG. 28 is a diagram showing a radiation pattern of the reflected wave.
Figure 29:
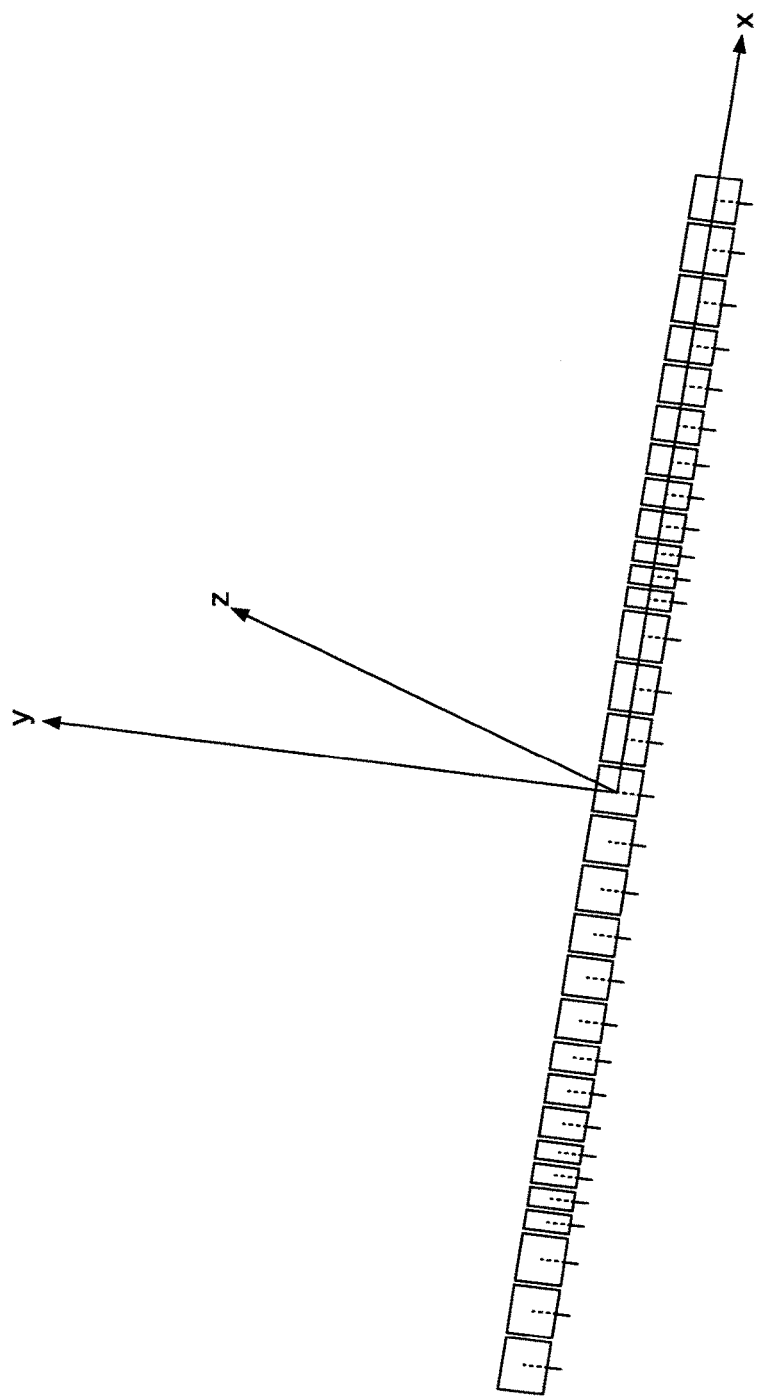
FIG. 29 is a diagram showing one sequence of the reflectarray.

According to the present invention, as shown in FIG. 21, the value of the reflection phase can be varied by the incident angle. Thus, the front incident wave and the oblique incident wave can be reflected by the different control angles, and they can be emitted in the same direction as shown in FIGS. 26 and 27. FIG. 28 shows a radiation pattern according to the embodiment. It can be found that, for two different incidences, the main beam is directed to the same direction. FIG. 29 shows one array of the structure of the reflectarray of FIG. 28. By periodically arranging this, the reflectarray having the desired size can be formed.

<<2.5 A Further Modified Example>>

As described above, according to the embodiment, since the lengths of the vias of the reflectarray are the same, the height can be simultaneously changed to the same value. The value of the inductance L of the mushroom-like structure can be represented by a product of the length of the via t and the magnetic permeability $\mu$. $L = \mu t$.

Further, the inductance L and the resonance frequency f satisfy the following relationship.

$$\omega = 2\pi f = 1/\sqrt{(LC)}$$

Thus, when the inductance L of each of the elements is simultaneously increased, the resonant frequencies of the corresponding elements are lowered, and when it is simultaneously decreased, the resonant frequencies of the corresponding elements are increased.

Figure 30:
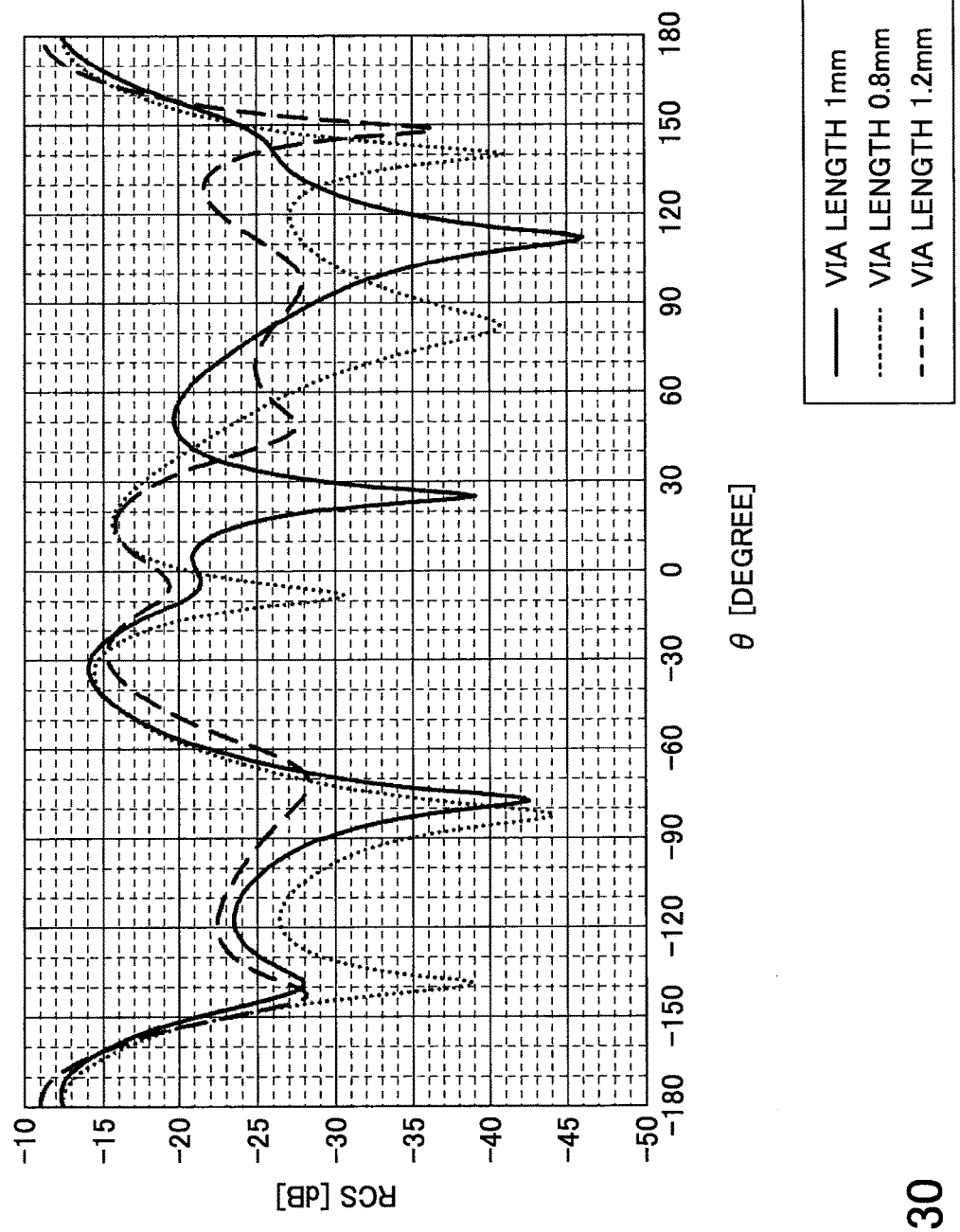
FIG. 30 is a diagram showing the scattering cross sections when length of the via is varied.
Figure 31:
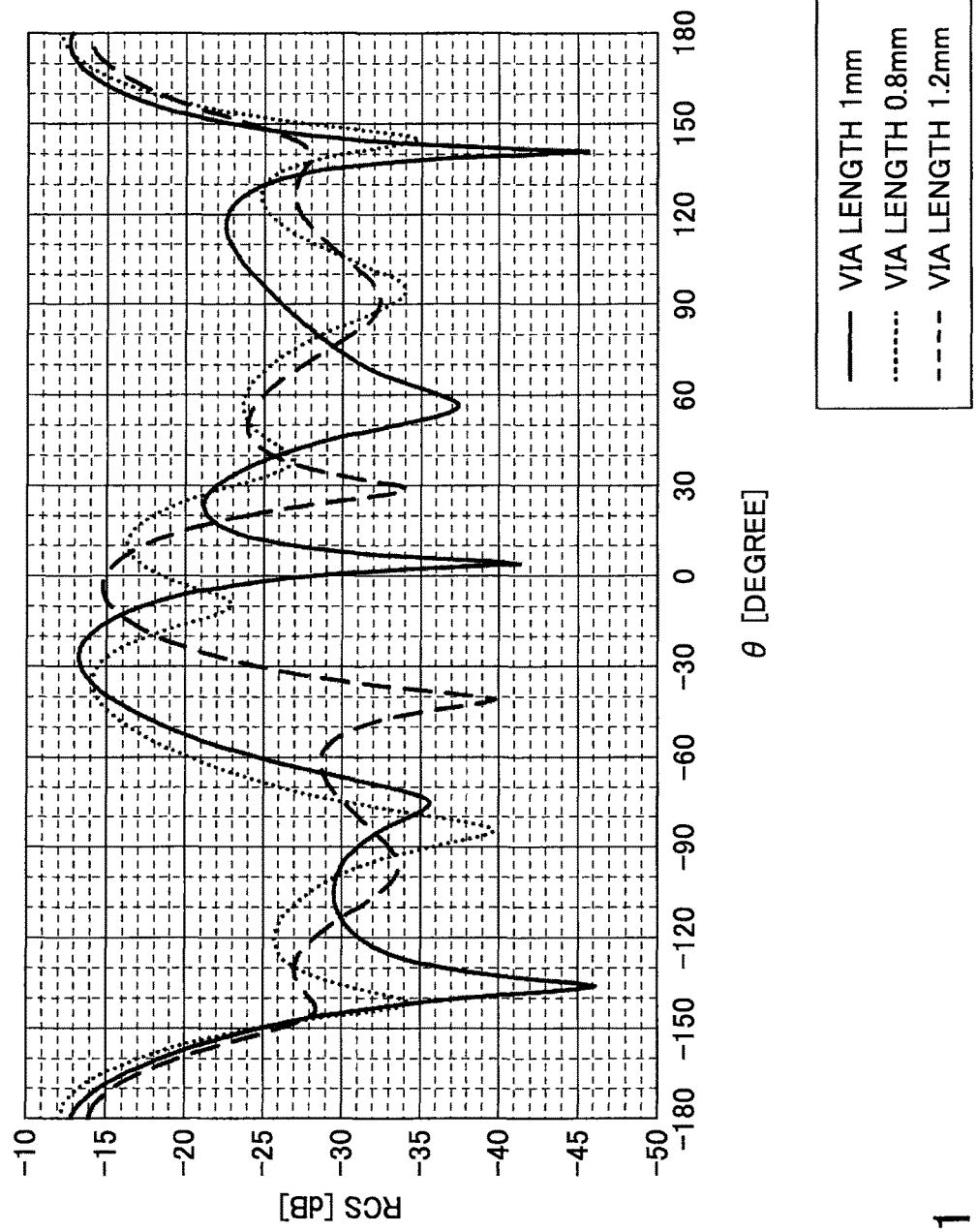
FIG. 31 is a diagram showing the scattering cross sections when the length of the via is varied.
Figure 32:
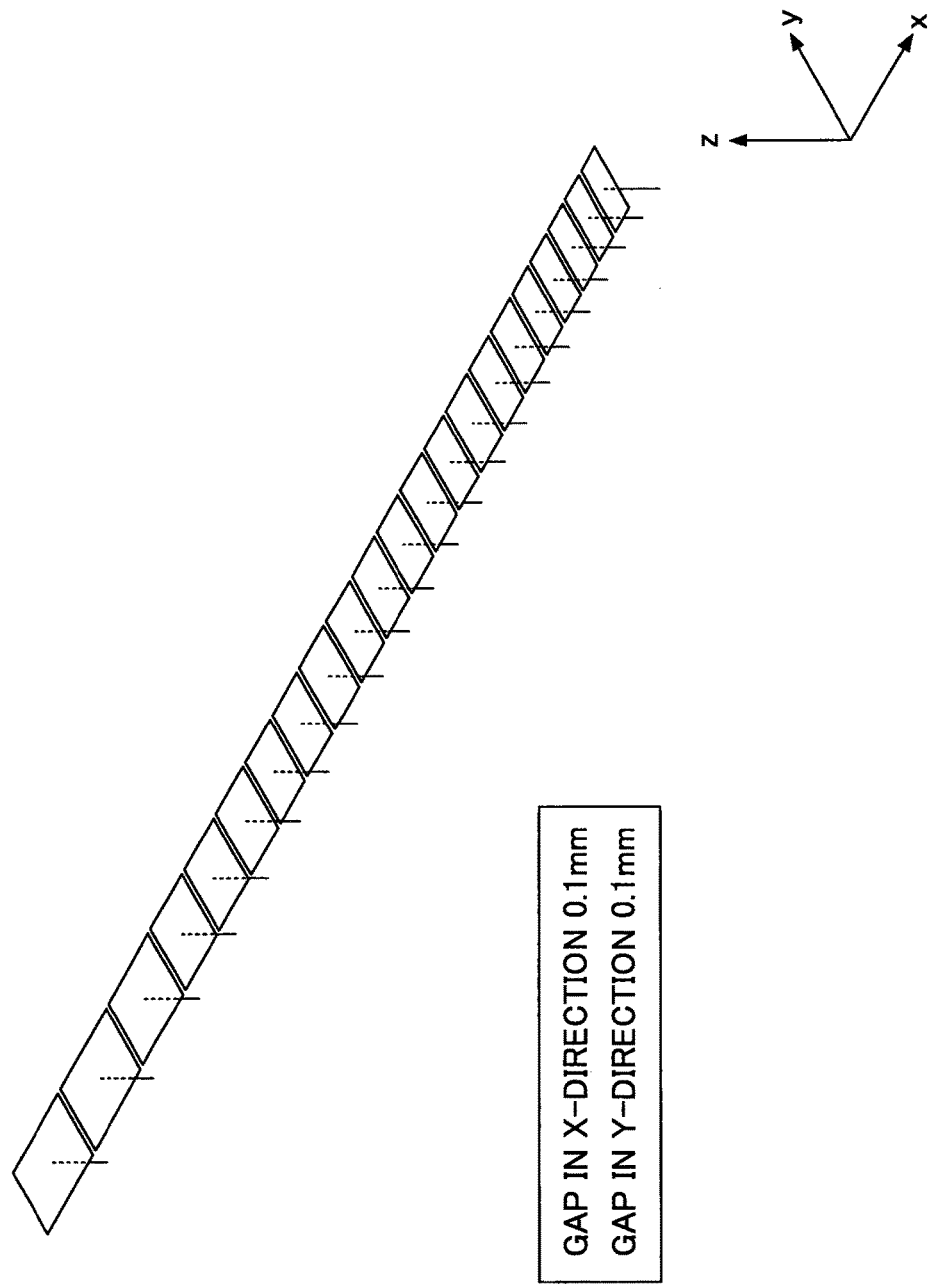
FIG. 32 is a diagram showing one sequence of the reflectarray.

FIGS. 30 and 31 indicate the scattering cross section for the case in which the length t of the via is varied from 0.8 mm to 1.2 mm in the reflectarray according to the present invention. As described above, the spacing between the elements which are included in the reflectarray may be a distance between the vias $\Delta_v$, or it may be the distance between the center of the gap between the neighboring elements and the center of the next gap $\Delta_p$ (FIG. 4). FIG. 30 shows the scattering cross section of the reflectarray which is designed while assuming that the element spacing is the distance between the vias. Here, the length t of the via is set to be 0.8 mm, 1 mm, and 1.2 mm. FIG. 31 shows the scattering cross section of the reflectarray which is designed while assuming that the element spacing is the distance between the vias. Here, the length t of the via is set to be 0.8 mm, 1 mm, and 1.2 mm. It is found that, in FIGS. 30 and 31, the maximum emission direction is changed by varying the length t of the via. Namely, when the length t of the via is decreased, the inductance L becomes smaller, and the resonant frequency $\omega$ becomes greater. In this case, the angle of the maximum emission direction becomes greater. Conversely, when the length t of the via is increased, the resonant frequency $\omega$ becomes smaller. In this case, the angle of the maximum emission direction becomes smaller. FIG. 32 shows one sequence of the reflectarray which is assumed for the simulation of FIGS. 30 and 31.

Figure 33:
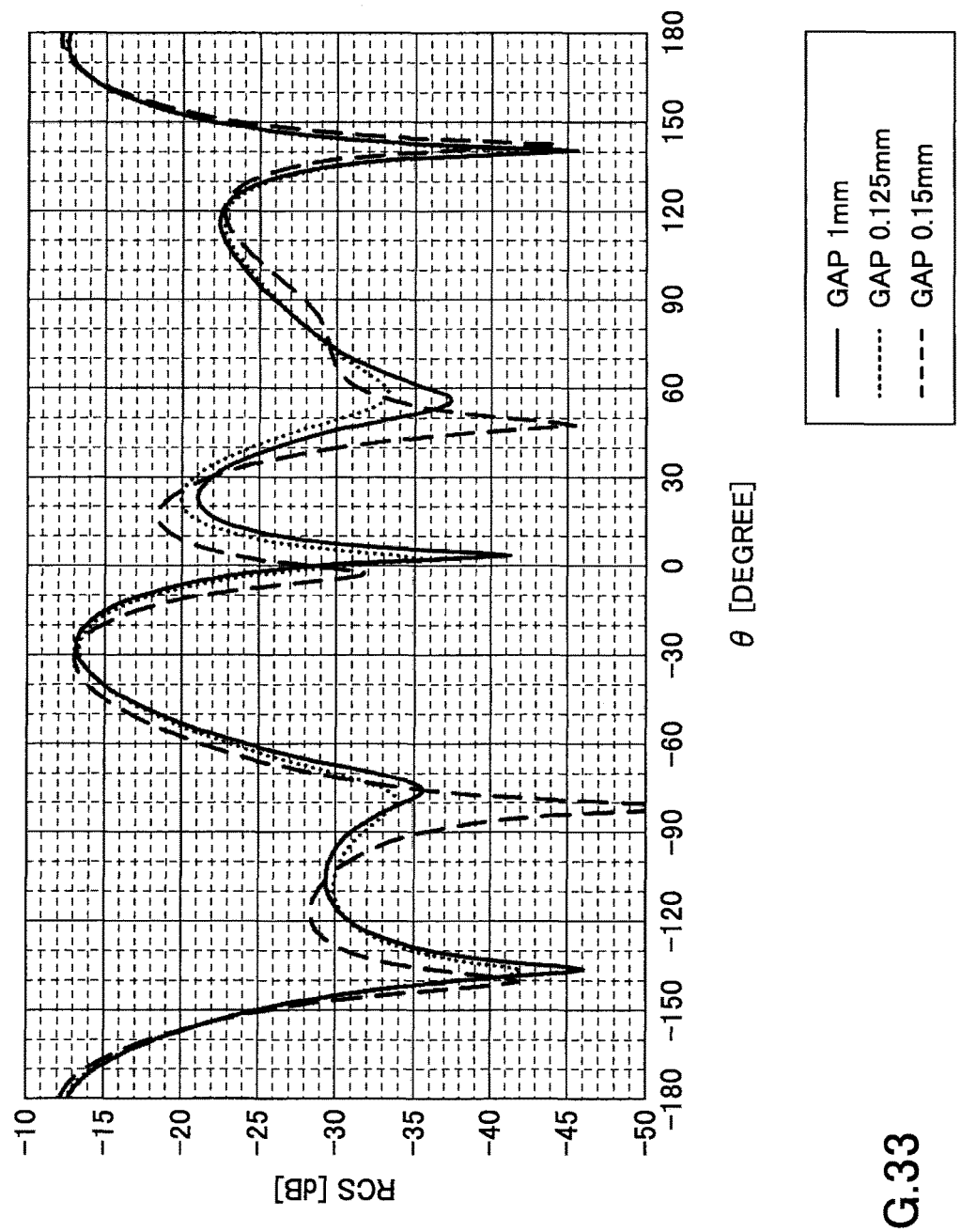
FIG. 33 is a diagram showing the scattering cross sections when the gap is varied.

In the reflectarray which is designed while setting the element spacing to be variable, by simultaneously changing the size of the gap which is the spacing between the patches of the neighboring elements, the maximum emission direction can be changed. FIG. 33 shows the variation in the emission direction for the case in which all the gaps of the corresponding elements are varied, for example, to be 0.1 mm, 0.125 mm, and 0.15 mm, in the configuration which is the same as that of shown in FIG. 32. It is found that by evenly changing the values of the gaps, the maximum emission direction can be changed. Namely, when the gap is reduced, the capacitance becomes greater. At this time, the resonant frequency ω becomes smaller, and the angle of the maximum emission direction becomes smaller. Conversely, when the gap is enlarged, the capacitance becomes smaller. At this time, the resonant frequency ω becomes greater, and the angle of the maximum emission direction becomes greater.

Further, by evenly changing the height of the vias of the corresponding mushroom-like structures and the spacing between the mushroom-like elements, the inductance L and the capacitance C of all the mushroom-like structures can be changed by the same value, and the resonant point can be shifted.

<<2.6 A Further Modified Example>>

Figure 35:
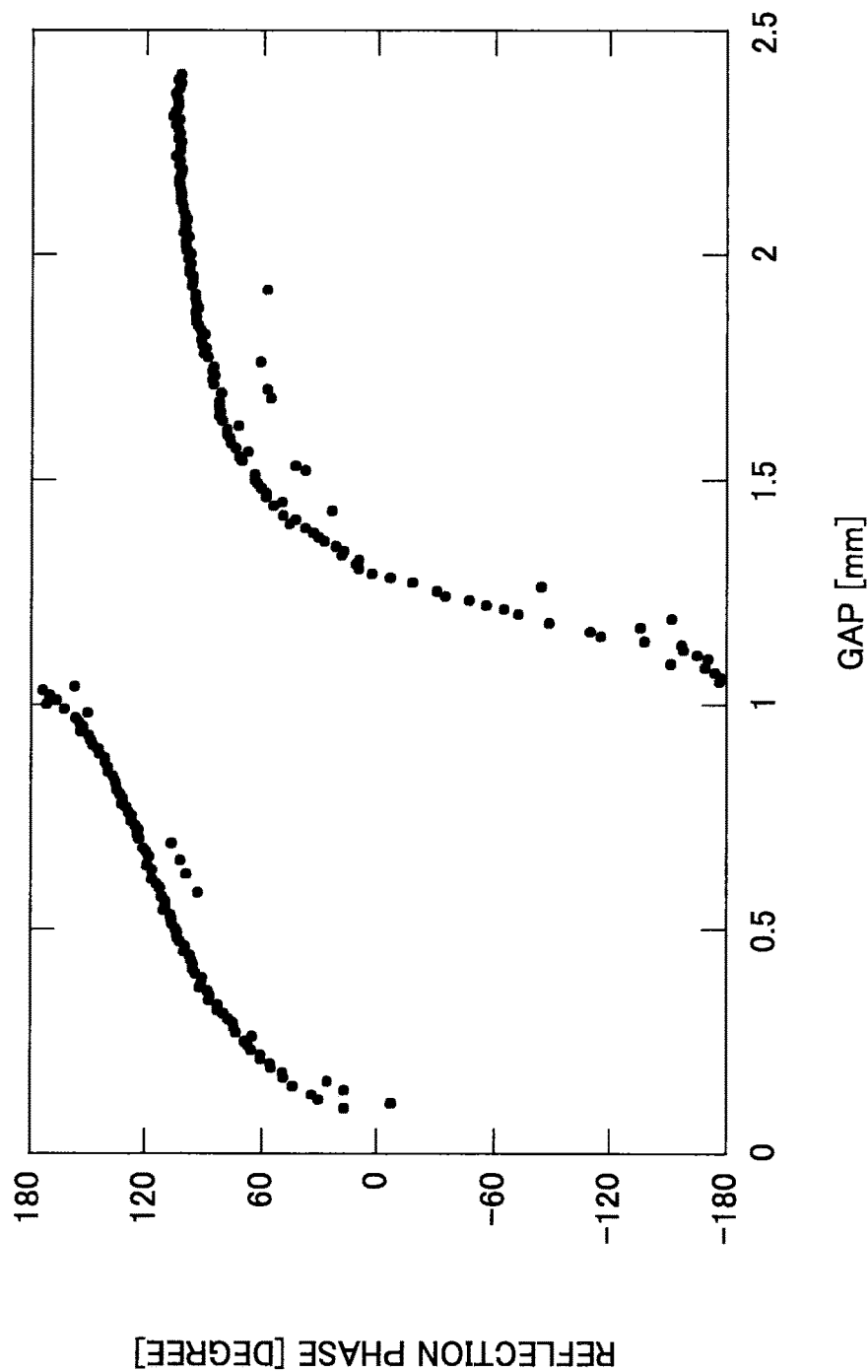
FIG. 35 is a diagram showing a relationship between the gap and the reflection phase.

Next, an example is shown in which the element spacing is set to be constant and the gaps are varied for the case of the TM oblique incidence. FIG. 35 indicates the simulated values of the reflection phase for the case in which the element spacing is set to be constant, which is approximately 2.42 mm, and the horizontal axis is set to be the gap. As it is found in FIG. 35, any phase in the range of 360 degrees, which is from +180 degrees to −180 degrees, can be achieved. Here, the incident angle is 70 degrees, and the direction of the electric field is in parallel with the plane of incidence.

<<2.7 A Further Modified Example>>

For the case of the mirror reflection, the reflection angle becomes $\theta_r=\theta_i$ with respect to the incident angle $\theta_i$. Whereas, for the case of the reflectarray, as described above, the reflection angle $\theta_r$ is obtained as a function of the incident angle $\theta_i$ and the control angle A, which is defined depending on the reflectarray. For a conventional reflectarray, there has been no point of view that the control angle varies depending on the incident angle $\theta_i$. In contrast, in the present invention, the control angle A becomes a variable of the incident angle $\theta_i$. Namely, the control angle A becomes $A(\theta_i)$. At this time, by arranging the control angles $A(\theta_{im1})$ and $A(\theta_{im2})$ so that $\theta_{rm1}=\arcsin[\sin(\theta_{im1})+\sin(A(\theta_{im1}))]=\theta_{rm2}=\arcsin[\sin(\theta_{im2})+\sin(A(\theta_{im2}))]$ is satisfied, the waves which enter from different directions can be reflected in the same direction. The control angle is determined by using the differences of the phases from the corresponding elements. For the case of the TM oblique incidence, the phases from the corresponding elements and the differences of the phases vary depending on the incident angle.

Hereinabove, the present invention is explained by referring to the specific embodiment. However, the embodiment is merely illustrative, and variations, modifications, alterations and substitutions could be conceived by those skilled in the art. For example, the present invention may be broadly applied to a reflectarray that reflects a radio wave by using a plurality of elements. For example, by using the reflectarray which is formed by the design method according to the present invention, a MIMO communication system can be obtained such that multiple paths are intentionally generated in a radio communication environment, and the MIMO (Multiple-Input Multiple-Output) based radio communication is prompted. Specific examples of numerical values are used in order to facilitate understanding of the invention. However, these numerical values are simply illustrative, and any other appropriate values may be used, except as indicated otherwise. Specific examples of the formulas have been used in order to facilitate understanding of the invention. However, these formulas are simply illustrative, and any other appropriate formulas may be used, except as indicated otherwise. The separations of the embodiments or the items are not essential to the present invention. Depending on necessity, subject matter described in two or more items may be combined and used, and subject matter described in an item may be applied to subject matter described in another embodiment or item (provided that they do not contradict). The present invention is not limited to the above-described embodiments, and various variations, modifications, alterations, substitutions and so on are included, without departing from the spirit of the present invention.

The present international application is based on and claims the benefit of priority of Japanese Patent Application No. 2012-044864, filed on Feb. 29, 2012, the entire contents of which are hereby incorporated by reference.

LIST OF REFERENCE SYMBOLS $\theta_i$: Incident angle
$\theta_r$: Reflection angle
$M_j$: Element
g: Gap

The invention claimed is:

1. A design method of designing a reflectarray, the reflectarray being such that a plurality of elements are disposed on a substrate having a surface which is perpendicular to a predetermined axis, wherein the reflectarray reflects an incident wave in a desired direction, the design method comprising:

a step of obtaining a reflection phase of the elements as a function of a design parameter, when a radio wave enters the elements which are arranged, and a storing a relationship between the reflection phase and the design parameter in a memory, wherein any of the design parameter among a size of element spacing, a size of a patch of the element, and a size of a gap between the patches of the neighboring elements is equally set for the elements; and a step of repeatedly determining, for each of the elements, the design parameter of a specific element in accordance with the relationship, so that the specific element among the elements reflects the incident wave with a specific reflection phase among a plurality of reflection phases, wherein the function of the design parameter has a range which is substantially equal to 360 degrees with respect to a predetermined numerical range of the design parameter, wherein the reflection phase is the continuously varying function with respect to the element spacing, and wherein the function of the design parameter is the continuous function (which indicates a two resonance characteristic) such that two resonant points (the element spacing which causes resonance) occur at which the reflection phase becomes zero.

2. The design method according to claim 1,
wherein each of the elements has a element structure,
wherein the element structure includes, at least a patch and a ground plate, and
wherein a length of a gap between the patches of the neighboring elements is equal to a length of a gap between the patches of the different neighboring elements.

3. A reflectarray which is designed by the design method according to claim 1,
wherein a control angle of a reflected wave that operates for a phase of an oblique incident wave is different from a control angle of a reflected wave that operates for a phase of a front incident wave.

4. A MIMO communication system that performs MIMO-based communication by generating multiple paths by using the reflectarray according to claim 1.

* * * * *